ус010879299B2

(12) United States Patent
Yokoyama et al.

(10) Patent No.: US 10,879,299 B2
(45) Date of Patent: Dec. 29, 2020

(54) SEMICONDUCTOR DEVICE WITH TRANSISTOR IN SEMICONDUCTOR SUBSTRATE AND INSULATED CONTACT PLUG EXTENDING THROUGH THE SUBSTRATE

(71) Applicant: Sony Corporation, Tokyo (JP)

(72) Inventors: Takashi Yokoyama, Kanagawa (JP); Taku Umebayashi, Kanagawa (JP)

(73) Assignee: SONY CORPORATION, Tokyo (JP)

(*) Notice: Subject to any disclaimer, the term of this patent is extended or adjusted under 35 U.S.C. 154(b) by 37 days.

(21) Appl. No.: 15/883,940

(22) Filed: Jan. 30, 2018

(65) Prior Publication Data

US 2018/0158862 A1    Jun. 7, 2018

Related U.S. Application Data

(63) Continuation of application No. 14/467,843, filed on Aug. 25, 2014, now Pat. No. 9,917,129.

(30) Foreign Application Priority Data

Sep. 2, 2013   (JP) ................... 2013-181337
Jun. 20, 2014  (JP) ................... 2014-127622

(51) Int. Cl.
*H01L 27/06*    (2006.01)
*H01L 27/146*   (2006.01)
(Continued)

(52) U.S. Cl.
CPC .. *H01L 27/14643* (2013.01); *H01L 21/76898* (2013.01); *H01L 21/84* (2013.01); *H01L 23/481* (2013.01); *H01L 27/1203* (2013.01); *H01L 27/1463* (2013.01); *H01L 27/1464* (2013.01); *H01L 27/1469* (2013.01);
(Continued)

(58) Field of Classification Search
CPC ................................... H01L 27/0694
See application file for complete search history.

(56) References Cited

U.S. PATENT DOCUMENTS 7,531,407 B2   5/2009   Clevenger et al.
7,687,872 B2   3/2010   Cazaux et al.
(Continued)

FOREIGN PATENT DOCUMENTS

CN      101794792       8/2010
JP      2010-171166     8/2010
(Continued)

OTHER PUBLICATIONS

Machine translation of JP2011176003. (Year: 2011).*

(Continued)

*Primary Examiner* — Peniel M Gumedzoe
*Assistant Examiner* — Christopher A Johnson
(74) *Attorney, Agent, or Firm* — Dentons US LLP

(57) ABSTRACT

A semiconductor device including a semiconductor substrate having a first surface and a second surface that face each other, and having an element region and an isolation region, the element region including a transistor in the first surface, and the isolation region including an element isolation layer surrounding the element region; and a contact plug extending from the first surface to the second surface in the isolation region of the semiconductor substrate.

31 Claims, 72 Drawing Sheets

(51) Int. Cl.
*H01L 21/84* (2006.01)
*H01L 27/12* (2006.01)
*H01L 27/22* (2006.01)
*H01L 21/768* (2006.01)
*H01L 23/48* (2006.01)

(52) U.S. Cl.
CPC .. *H01L 27/14612* (2013.01); *H01L 27/14636* (2013.01); *H01L 27/14689* (2013.01); *H01L 27/228* (2013.01); *H01L 2924/0002* (2013.01)

(56) References Cited

U.S. PATENT DOCUMENTS

| | | | |
|---|---|---|---|
| 7,863,060 | B2 | 1/2011 | Belen |
| 9,059,123 | B2 | 6/2015 | Hekmatshoartabari et al. |
| 2010/0181547 | A1 | 7/2010 | Kuroda |
| 2010/0201440 | A1* | 8/2010 | Nowak ............... H01L 27/1203 327/581 |
| 2012/0086045 | A1 | 4/2012 | Molin et al. |
| 2013/0105924 | A1* | 5/2013 | Kobayashi ........ H01L 27/14632 257/431 |
| 2015/0028492 | A1* | 1/2015 | Jung ................. H01L 21/76843 257/774 |
| 2015/0061020 | A1 | 3/2015 | Yokoyama et al. |
| 2015/0091066 | A1 | 4/2015 | Lee |
| 2016/0043060 | A1* | 2/2016 | Kabe ................... H01L 27/0688 257/774 |
| 2016/0141328 | A1* | 5/2016 | Takemoto ......... H01L 27/14634 257/433 |

FOREIGN PATENT DOCUMENTS

| | | |
|---|---|---|
| JP | 2011-176003 | 9/2011 |
| WO | 2006080337 | 8/2006 |

OTHER PUBLICATIONS

Machine translation of JP2010171166. (Year: 2010).*
Chinese Patent Office Action dated Jan. 17, 2018 corresponding to Chinese Serial No. 201410421921.5.

* cited by examiner

SEMICONDUCTOR DEVICE WITH TRANSISTOR IN SEMICONDUCTOR SUBSTRATE AND INSULATED CONTACT PLUG EXTENDING THROUGH THE SUBSTRATE

CROSS REFERENCE TO RELATED APPLICATIONS

This application is a continuation of U.S. patent application Ser. No. 14/467,843 filed Aug. 25, 2014, the entirety of which is incorporated herein by reference to the extent permitted by law. This application claims the benefit of Japanese Priority Patent Application JP 2013-181337 filed Sep. 2, 2013 and Japanese Priority Patent Application JP 2014-127622 filed Jun. 20, 2014, the entire contents which are incorporated herein by reference.

BACKGROUND

The present disclosure relates to a semiconductor device having a configuration in which an insulator layer and a semiconductor layer are laminated on a semiconductor substrate, a method of manufacturing the same, and a semiconductor unit including the semiconductor device.

In semiconductor integrated circuits including CMOS (Complementary Metal Oxide Semiconductor) transistors, higher integration and higher operation speed have been studied. Recently, in terms of low power consumption, conversion of volatile memories to nonvolatile memories has been studied, and, for example, MRAMs (Magnetoresistive Random Access Memories) have been developed (for example, refer to Japanese Unexamined Patent Application Publication No. 2010-171166).

Incidentally, a contact electrode connected to a source-drain region of a transistor is typically disposed on a principal surface where the transistor is formed of a substrate; however, recently, an attempt to dispose the contact electrode on a back surface of the substrate has been made. For example, Japanese Unexamined Patent Application Publication No. 2010-171166 discloses that, while a diffusion layer and a silicide layer of a main element are formed on a front surface of a silicon (Si) substrate, a contact electrode is so disposed as to pass through the substrate from a back surface of the substrate. The contact electrode from the back surface passes through the substrate and the diffusion layer to be connected to the silicide layer. Flexibility in a wiring path and the like is enhanced by such a configuration, thereby leading to an advantage in design.

SUMMARY

In Japanese Unexamined Patent Application Publication No. 2010-171166, the contact electrode is formed from the back surface of the substrate; therefore, when an attempt to achieve higher integration is made, there is concern about an issue of a short circuit between the contact electrode and a gate electrode of the transistor formed on the substrate caused by variation in processing or alignment accuracy. Moreover, a technology in Japanese Unexamined Patent Application Publication No. 2010-171166 is suitable for semiconductor transistor having a SOI (Silicon on Insulator) structure, but is not applicable to semiconductor transistors having an existing bulk structure.

It is desirable to provide a semiconductor device that is superior in flexibility in design and has a configuration suitable for higher integration, and a method of manufacturing the semiconductor device. Moreover, it is desirable to provide a semiconductor unit including such a semiconductor device.

According to an embodiment of the present disclosure, there is provided a semiconductor device including: a semiconductor substrate having a first surface and a second surface that face each other, and having an element region and an isolation region, the element region including a transistor in the first surface, and the isolation region including an element isolation layer surrounding the element region; and a contact plug extending from the first surface to the second surface in the isolation region of the semiconductor substrate.

According to an embodiment of the present disclosure, there is provided a semiconductor device including: an element formation layer in which a transistor is formed, the transistor including a fin extending in a first direction, a gate wiring line extending in a second direction, a source wiring line, and a drain wiring line, the gate wiring line with which surfaces other than a back surface of the fin are covered; a buried oxide film with which the transistor is covered; an insulating layer with which the buried oxide film is covered; and a contact plug passing through a region other than a region where the transistor is formed of the element formation layer.

According to an embodiment of the present disclosure, there is provided a semiconductor device including: a semiconductor substrate having a first surface and a second surface that face each other, and having a first region, a second region, and a third region, the first region including a transistor in the first surface, the second region including an element isolation layer surrounding the first region in the first surface, and the third region isolated from the first region by the second region, in which a first conductive semiconductor portion is provided in the first region, a second conductive semiconductor portion is provided in the third region, and an insulating layer is provided in the second region, the insulating layer being sandwiched between the first conductive semiconductor portion and the second conductive semiconductor portion in the second surface.

According to an embodiment of the present disclosure, there is provided a semiconductor device including: a semiconductor substrate having a first surface and a second surface that face each other, and having an element region and an isolation, the element region including a transistor region in the first surface, and the isolation region including, in the first surface, an element isolation layer surrounding the element region; a contact plug extending from the first surface to the second surface in the isolation region of the semiconductor substrate; a block layer provided to stride across a boundary between the element region and the isolation region in the first surface; and a wiring line with which the block layer is covered in the first surface and that connects the contact plug and the transistor to each other.

According to an embodiment of the present disclosure, there is provided a semiconductor device including: a semiconductor substrate having a first surface and a second surface that face each other, and having an element region and an isolation region, the element region including a transistor in the first surface, and the isolation region including, in the first surface, an element isolation layer surrounding the element region; a contact plug extending from the first surface to the second surface in the isolation region of the semiconductor substrate; and a metal layer provided to stride across a boundary between the element region and the isolation region in the first surface and to connect the contact plug and the transistor to each other.

According to an embodiment of the present disclosure, there is provided a method of manufacturing a semiconductor device including: preparing a semiconductor substrate having a first surface and a second surface that face each other, and having an element region and an isolation region, the element region including a transistor in the first surface, and the isolation region including an element isolation layer surrounding the element region; and forming a contact plug by forming a through hole from the second surface to the first surface in the isolation region and then filling the through hole with a metal material.

According to an embodiment of the present disclosure, there is provided a semiconductor unit provided with a semiconductor device and an image pickup device laminated on the semiconductor device, the semiconductor device including: a semiconductor substrate having a first surface and a second surface that face each other, and having an element region and an isolation region, the element region including a transistor in the first surface, and the isolation region including an element isolation layer surrounding the element region; and a contact plug extending from the first surface to the second surface in the isolation region of the semiconductor substrate.

In the semiconductor devices and the method of manufacturing the semiconductor device according to the embodiments of the present disclosure, the contact plug is provided not in the element region including the transistor but in the isolation region. Therefore, for example, even in a case where a storage element is provided on a side opposite to a surface provided with the transistor of the semiconductor substrate, a short circuit between the contact plug and an unintended part (for example, a gate electrode or the like) of the transistor is prevented.

In the semiconductor devices and the method of manufacturing the semiconductor device according to the embodiments of the present disclosure, while flexibility in design is secured, higher integration is allowed to be achieved. It is to be noted that effects of the embodiments of the present disclosure are not limited to effects described here, and may include any effect described in this description.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Figure 1A:
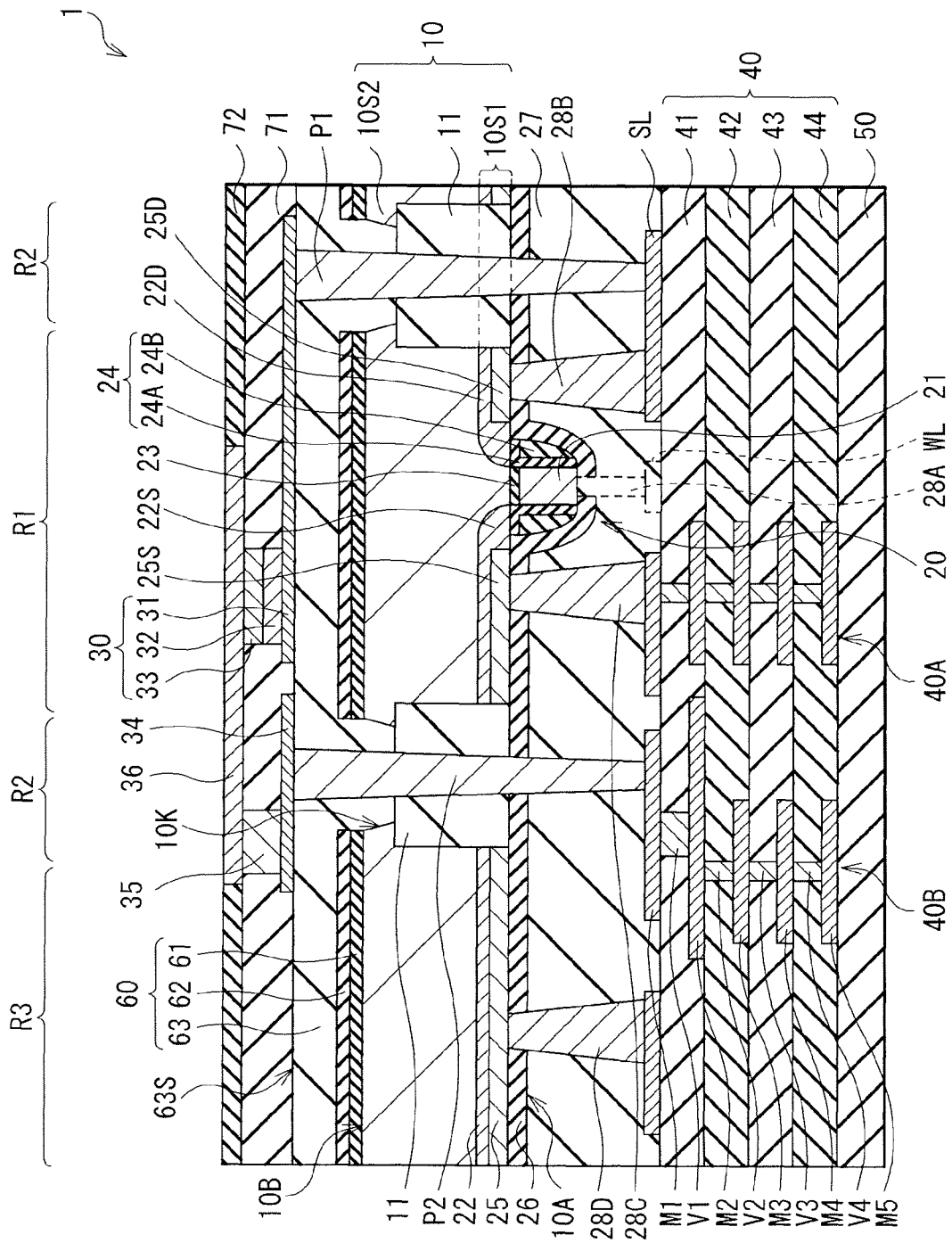
FIG. 1A is a sectional view illustrating a configuration example of a semiconductor device according to a first embodiment of the present disclosure.

Some embodiments of the present disclosure will be described in detail below referring to the accompanying drawings. It is to be noted that description will be given in the following order.

1. First Embodiment (Semiconductor device including a transistor with a bulk structure)

2. Modification Example 1 (Modification example of planar arrangement)

3. Modification Example 2 (Example in which a low-resistance section is disposed between a contact plug and a storage element)

4. Second Embodiment (Semiconductor device having a SOI structure)

5. Modification Example 3 (Semiconductor device having a SOI structure and not including a semiconductor layer on a back surface)

6. Third Embodiment (Semiconductor device including a fin-shaped semiconductor layer and having a SOI structure)

7. Modification Example 4 (Semiconductor device including a fin-shaped semiconductor layer, having a SOI structure, and not including a semiconductor layer on a back surface)

8. Fourth Embodiment (Semiconductor device including a nanowire transistor)

9. Fifth Embodiment (Semiconductor device in which a contact plug is formed from a front surface of a semiconductor substrate)

10. Sixth Embodiment (Semiconductor device in which a contact plug is formed from both a front surface and a back surface of a semiconductor substrate)

11. Seventh Embodiment (Semiconductor device including local wiring spreading from an active region to an isolation region)

12. Modification Example 6 (Semiconductor device in which a connection section connected to a contact plug is provided, in advance, to an interlayer insulating layer in which a gate electrode is embedded)

13. Modification Example 7 (Semiconductor device in which another conductive layer is disposed between a connection section embedded in an interlayer insulating layer and a contact plug)

14. Eighth Embodiment (Semiconductor device in which a semiconductor layer is configured of a P-well and an N-well)

15. Modification Example 8 (Semiconductor device including a portion where an element isolation layer and a protrusion section of an insulating film are separated from each other)

16. Modification Example 9 (Semiconductor device including some of contact portions, not including a contact plug, between an element isolation layer and a protrusion section of an insulating film)

17. Modification Example 10 (Semiconductor device in which a height of a protrusion section of an insulating film differs depending on location)

18. Modification Example 11 (Semiconductor device in which a trench is formed inside a protrusion section of an insulating film)

19. Modification Example 12 (Semiconductor device in which an insulating film covering an N-well and an insulating film covering a P-well are made of different materials)

20. Ninth Embodiment (Semiconductor device in which a block layer is so provided as to cover a boundary between a silicide region of a transistor and an element isolation layer)

21. Modification Example 13 (Semiconductor device in which a metal layer is so provided as to cover a boundary between a silicide region of a transistor and an element isolation layer)

22. Application Examples 1 and 2 (Semiconductor units configured by bonding a semiconductor device and an image pickup device together)

First Embodiment

[Configuration of Semiconductor Device 1]

Figure 1B:
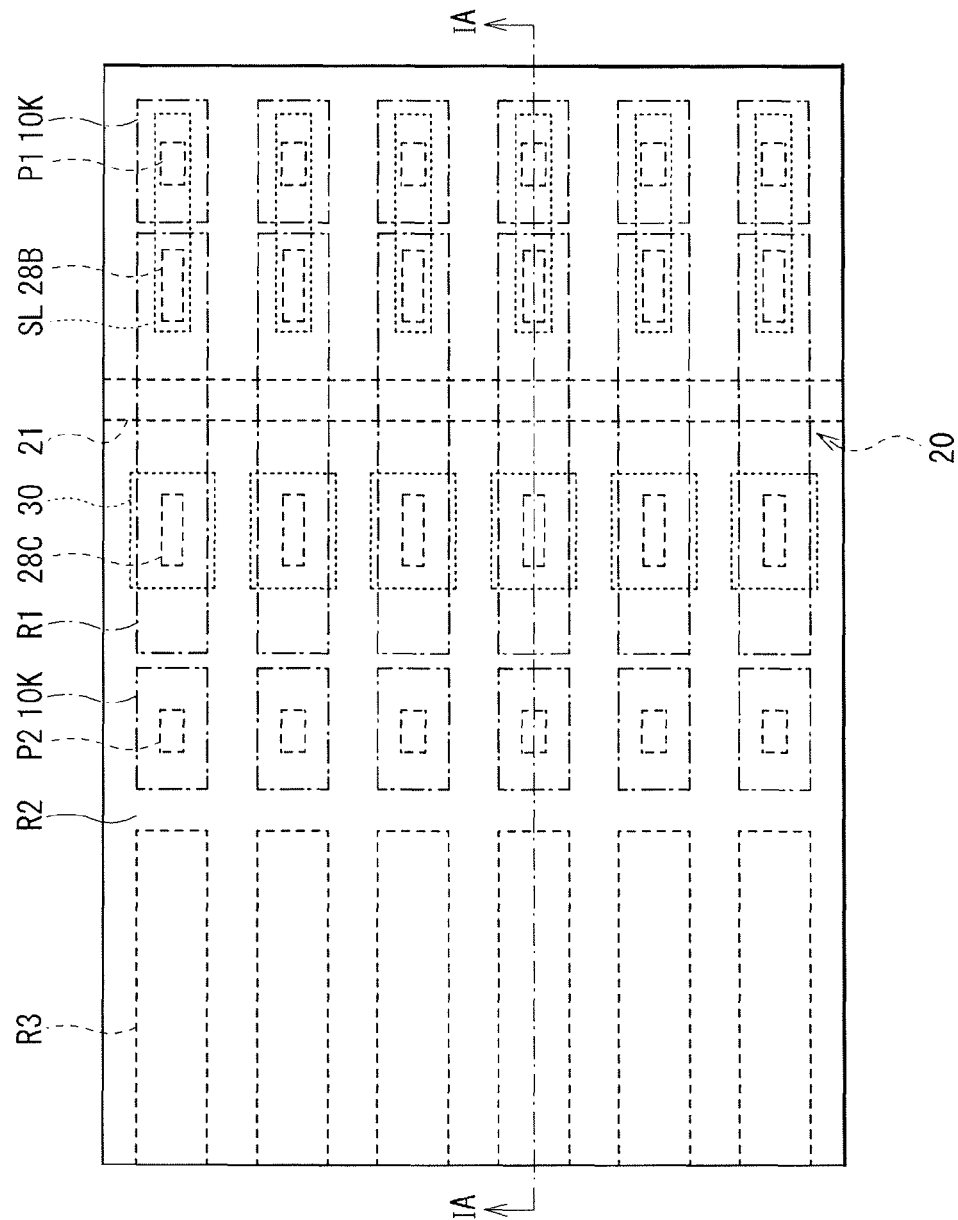
FIG. 1B is a plan view illustrating a configuration example of the semiconductor device illustrated in FIG. 1A.

FIG. 1A illustrates a sectional configuration of a semiconductor device 1 according to a first embodiment of the present disclosure. Moreover, FIG. 1B illustrates a planar configuration of the semiconductor device 1. FIG. 1A corresponds to a sectional view taken along a line IA-IA in an arrow direction of FIG. 1B.

The semiconductor device 1 may be configured, for example, by laminating a multilayer wiring formation section 40, interlayer insulating layers 26 and 27, and a semiconductor substrate 10 in this order on a supporting substrate 50. A transistor 20 is provided in proximity to a principal surface (a front surface) 10A of the semiconductor substrate 10, and a storage element 30 is provided on a back surface 10B of the semiconductor substrate 10 with an insulating layer 60 in between. It is to be noted that an example in which six transistors 20 are provided is illustrated in FIG. 1B; however, the number of transistors 20 provided in the semiconductor substrate 10 is not specifically limited. The number of transistors 20 may be 1, or may be 2 or more.

The semiconductor substrate 10 has an element region R1 provided with the transistor 20 and an isolation region R2 surrounding the element region R1. Moreover, the semiconductor substrate 10 has a tap region R3 configured to feed power so as to set a potential thereof. An element isolation layer 11 formed by, for example, STI (Shallow Trench Isolation) may be provided in the isolation region R2 of the semiconductor substrate 10. The element isolation layer 11 may be an insulating film configured of a silicon oxide film ($SiO_2$), and one surface of the element isolation layer 11 is exposed on the principal surface 10A of the semiconductor substrate 10.

The semiconductor substrate 10 has a laminate configuration of a first semiconductor layer 10S1 (hereinafter referred to as "semiconductor layer 10S1") and a second semiconductor layer 10S2 (hereinafter referred to as "semiconductor layer 10S2"). The semiconductor layer 10S1 occupies only the element region R1, and may be configured, for example, by forming a channel region configuring a part of the transistor 20 and a pair of diffusion layers 22 (that will be described later) in single-crystal silicon. On the other hand, the semiconductor layer 10S2 has a polarity different from that of the semiconductor layer 10S1 in the element region R1, and is so formed over the element region R1 and the isolation region R2 as to cover both the semiconductor layer 10S1 and the element isolation layer 11. The semiconductor layer 10S2 may be made of, for example, single-crystal silicon. It is to be noted that, even in the tap region R3, the semiconductor substrate 10 has a laminate configuration of the semiconductor layer 10S1 and the semiconductor layer 10S2. However, in the tap region R3, the semiconductor layer 10S2 has the same polarity as that of the diffusion layer 22 configuring the semiconductor layer 10S1.

A front surface of the semiconductor layer 10S2, i.e., a back surface 10B of the semiconductor substrate 10 is covered with an insulating layer 60. The insulating layer 60 is configured by laminating insulating films 61 to 63 in order on the back surface 10B. The semiconductor layer 10S2 has an opening 10K in a part of the isolation region R2, and a protrusion section 63T is so provided in a part of the insulating film 63 as to fill the opening 10K. The protrusion section 63T is in contact with the element isolation layer 11.

Moreover, contact plugs P1 and P2 so extending as to pass through a portion where the insulating film 63 and the element isolation layer 11 are connected to each other are provided to the isolation region R2. The contact plugs P1 and P2 may be made of, for example, a material mainly including low-resistance metal such as Cu (copper), W (tungsten), or aluminum (Al). Moreover, the contact plugs P1 and P2 may be formed by providing a barrier metal layer made of a simple substance of Ti (titanium) or Ta (tantalum) or an alloy thereof around the low-resistance metal. Peripheries of the contact plugs P1 and P2 are covered with a part of the insulating film 63, and are electrically isolated from the semiconductor substrate 10 (a semiconductor layer 10S). However, the semiconductor layers 10S in the element region R1, the isolation region R2, and the tap region R3 are connected to one another. It is to be noted that each of the contact plugs P1 and P2 has a shape in which an occupancy area gradually increases from the principal surface 10A toward the back surface 10B.

The transistor 20 is a transistor for selection of the storage element 30, and may be a planar transistor including a gate electrode 21 and a pair of diffusion layers 22 (22S and 22D) that serve as a source region and a drain region. The gate electrode 21 also serves as a word line WL of the storage element 30.

The gate electrode 21 is provided on the principal surface 10A of the semiconductor substrate 10. However, a gate insulating film 23 configured of a silicon oxide film or the like is provided between the gate electrode 21 and the semiconductor substrate 10. For example, a side wall 24 configured of a laminate film of a silicon oxide film 24A and a silicon nitride film 24B may be provided on a side surface of the gate electrode 21. The word line WL is connected to the gate electrode 21.

The pair of diffusion layers 22 may be formed by diffusing an impurity into silicon, and configure the semiconductor layer 10S1. More specifically, the pair of diffusion layers 22 are configured of a diffusion layer 22S corresponding to the source region and a diffusion layer 22D corresponding to the drain region, and are provided with a channel region facing the gate electrode 21 of the semiconductor layer 10S1 in between. Respective silicide regions 25 (25S and 25D) made of metal silicide such as NiSi (nickel silicide) or CoSi (cobalt silicide) are provided in parts of the respective diffusion layers 22 (22S and 22D). The silicide regions 25 are configured to reduce contact resistance between connection layers 28A to 28D that will be described later and the diffusion layers 22. A surface of each of the silicide regions 25 is exposed on the principal surface 10A of the semiconductor substrate 10; however, a surface opposed to the exposed surface of each of the silicide regions 25 is covered with the semiconductor layer 10S2. Moreover, a thickness of each of the diffusion layers 22 and the silicide regions 25 is smaller than that of the element isolation layer 11.

The word line WL, a select line SL, and a metal layer M1 are embedded in the interlayer insulating film 27. Moreover, the connection layers 28A to 28D are so provided as to pass through the interlayer insulating films 26 and 27. In this case, the gate electrode 21 is connected to the word line WL through the connection layer 28A. The silicide region 25D of the diffusion layer 22D that serves as the drain region is connected to the select line SL through the connection layer 28B that serves as a drain electrode. The metal layer M1 of a wiring line 40A that will be described later is connected to the silicide region 25S of the diffusion layer 22S that serves as the source region through the connection layer 28C that serves as a source electrode. Moreover, in the tap region R3, the silicide region 25 exposed on the principal surface 10A of the semiconductor substrate 10 is connected to another metal layer M1 through the connection layer 28D. Further, the contact plug P1 passes through the interlayer insulating films 26 and 27 so as to allow a bottom end thereof to come into contact with the select line SL. The contact plug P2 also passes through the interlayer insulating films 26 and 27 so as to allow a bottom end thereof to come into contact with the metal layer M1 of a wiring line 40B that will be described later. Therefore, the contact plugs P1 and P2 so extend as to pass through all of the insulating layer 60, the element isolation layer 11, the interlayer insulating film 26, and the interlayer insulating film 27. The contact plugs P1 and P2 may have, for example, a truncated pyramid shape or a truncated cone shape, and the occupancy area of each of the contact plugs P1 and P2 increases from the principal surface 10A toward the back surface 10B (i.e., from a bottom end thereof toward a top end thereof).

The multilayer wiring formation section 40 may be configured by providing wiring lines 40A and 40B to an interlayer insulating film 41, an interlayer insulating film 42, an interlayer insulating film 43, an inter layer insulating film 44 that are laminated in this order from a side closer to the transistor 20. Each of the wiring lines 40A and 40B has a configuration in which a metal layer M1, a metal layer M2, a metal layer M3, a metal layer M4, and a metal layer M5 are laminated. In this case, the metal layer M1, the metal layer M2, the metal layer M3, the metal layer M4, and the metal layer M5 are embedded in the interlayer insulating film 27, the interlayer insulating film 41, the interlayer insulating film 42, the interlayer insulating film 43, and the interlayer insulating film 44, respectively. Moreover, the metal layer M1 and the metal layer M2 are connected to each other through a via V1 that passes through the interlayer insulating film 41. Likewise, the metal layer M2 and the metal layer M3 are connected to each other through a via V2 that passes through the interlayer insulating film 42. The metal layer M3 and the metal layer M4 are connected to each other through a via V3 that passes through the interlayer insulating film 43. The metal layer M4 and the metal layer M5 are connected to each other through a via V4 that passes through the interlayer insulating film 44. As described above, the wiring line 40A is connected to the diffusion layer 22 that serves as the source region through the connection layer 28C in contact with the metal layer M1. Moreover, the metal layer M1 in the wiring layer 40B is in contact with the bottom end of the contact plug P2. It is to be noted that the configuration of the multilayer wiring formation section 40 illustrated in FIG. 1A is merely an example, and is not limited thereto.

The multilayer wiring formation section 40 is connected to the supporting substrate 50. The supporting substrate 50 may be, for example, a substrate made of single-crystal silicon. It is to be noted that the material of the supporting substrate 50 is not specifically limited, and the supporting substrate 50 may be made of any material other than single-crystal silicon, such as $SiO_2$ or glass.

As described above, the insulating layer 60 has a laminate configuration in which the insulating film 61, the insulating film 62, and the insulating film 63 are so laminated as to cover the semiconductor substrate 10. The insulating film 61 may be configured of, for example, a High-K (high-dielectric constant) film capable of being formed at low temperature, i.e., Hf oxide, $Al_2O_3$, Ru (ruthenium) oxide, Ta oxide, an oxide including Al, Ru, Ta, or Hf and Si, a nitride including Al, Ru, Ta, or Hf and Si, an oxynitride including Al, Ru, Ta, or Hf and Si, or the like. The insulating films 62 and 63 may be made of, for example, $SiO_2$. Alternatively, the insulating film 63 may be preferably made of a material (a Low-K material) having a lower dielectric constant than $SiO_2$. Conductive layers 31 and 34 are provided on a front surface 63S (i.e., a surface on a side opposite to the semiconductor substrate 10) of the insulating film 63. The conductive layers 31 and 34 are in contact with the top ends of the contact plugs P1 and P2, respectively.

The storage element 30 may be configured by laminating the conductive layer 31 that serves as a bottom electrode, a storage section 42, and a conductive layer 33 that serves as a top electrode (and also serves as a bit line LB) in this order. The conductive layer 31 is connected to the silicide region 25 through the contact plug P1, the select line SL, and the connection layer 28B.

A back interlayer film 71 is provided around the storage section 32 and the conductive layers 31, 33, and 34. As a material of the back interlayer film 71, $SiO_2$, a Low-K (low-dielectric constant) film, or the like may be used. Moreover, a columnar conductive layer 35 is provided on the conductive layer 34, and is embedded in the back interlayer film 71. Moreover, the conductive layer 33 and the conductive layer 35 are electrically connected to each other through a conductive layer 36 with which the conductive layers 33 and 35 are collectively covered. A periphery of the conductive layer 36 is filled with an insulating layer 72.

The storage section 32 in the storage element 30 may be preferably a spin transfer torque-magnetic tunnel junction type storage element (STT-MTJ; Spin Transfer Torque-Magnetic Tunnel Junction) that is configured to hold information by reversing, by spin transfer, the direction of magnetization of a storage layer that will be described later. The STT-MTJ is capable of high-speed writing and reading; therefore, the STT-MTJ is a promising nonvolatile memory as an alternative to volatile memories.

The conductive layer 31 and the conductive layer 33 may be configured of metal layers of Cu, Ti, W, Ru, or the like. The conductive layer 31 and the conductive layer 33 may be preferably made of metal other than materials of a base layer 32A and a cap layer 32E that will be described later, i.e., mainly Cu, Al, or W. Moreover, the conductive layer 31 and the conductive layer 33 may be configured of Ti, TiN (titanium nitride), Ta, TaN (tantalum nitride), W, Cu, Al, or a laminate thereof.

Figures 2, 3:
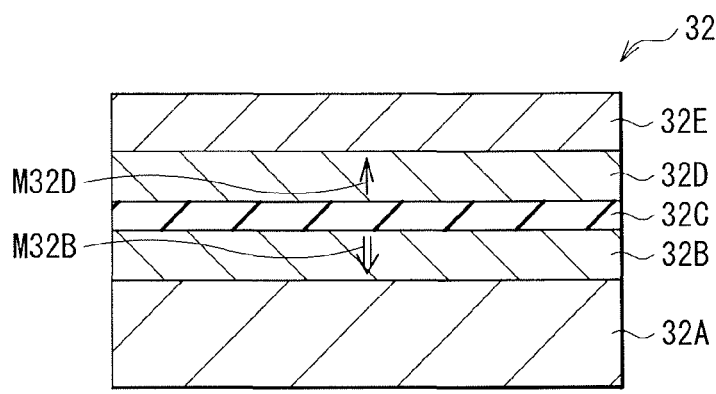
FIG. 2 is a sectional view illustrating an example of a configuration of a storage section of a storage element illustrated in FIG. 1.
FIG. 3 is a sectional view illustrating an example of configurations of respective layers of the storage section illustrated in FIG. 2.

FIG. 2 illustrates an example of a configuration of the storage section 32. The storage section 32 may have a configuration in which the base layer 32A, a magnetization fixed layer 32B, an insulating layer 32C, a storage layer 32D, and the cap layer 32E are laminated in this order from a side closer to the conductive layer 31. In other words, the storage element 30 has a bottom pin structure including the magnetization fixed layer 32B, the insulating layer 32C, and the storage layer 32D in this order from a bottom in a laminating direction to a top. Information is stored by changing the direction of magnetization M32D of the storage layer 32D with uniaxial anisotropy. Information "0" or "1" is determined by a relative angle (parallel or antiparallel) between the magnetization M32D of the storage layer 32D and magnetization M32B of the magnetization fixed layer 32B.

Each of the base layer 32A and the cap layer 32E is configured of a metal film of Ta, Ru, or the like, or a laminate film thereof.

The magnetization fixed layer 32B is a reference layer as a reference of stored information (the direction of magnetization) of the storage layer 32D, and is configured of a ferromagnetic material having a magnetic moment in which the direction of the magnetization M32B is fixed to a direction perpendicular to a film surface. The magnetization fixed layer 32B may be made of, for example, Co—Fe—B.

It is not preferable that the direction of the magnetization M32B of the magnetization fixed layer 32B be changed by writing or reading; however, the direction of the magnetization M32B of the magnetization fixed layer 32B is not necessarily fixed to a specific direction. The direction of the magnetization M32B of magnetization fixed layer 32B is less likely to be moved than the direction of the magnetization M32D of the storage layer 32D. For example, compared to the storage layer 32D, the magnetization fixed layer 32B may have larger coercivity, a larger magnetic film thickness, or a larger magnetic damping constant. To fix the direction of the magnetization M32B, for example, an antiferromagnetic material such as PtMn or IrMn may be provided in contact with the magnetization fixed layer 32B. Alternatively, a magnetic material in contact with such an antiferromagnetic material may be magnetically coupled to the magnetization fixed layer 32B with a non-magnetic material such as Ru in between to indirectly fix the direction of the magnetization M32B.

The insulating layer 32C is an intermediate layer serving as a tunnel barrier layer (a tunnel insulating layer), and may be made of, for example, aluminum oxide or magnesium oxide (MgO). In particular, the insulating layer 32C may be preferably made of magnesium oxide. The magnetoresistive ratio (MR ratio) is allowed to be increased, and current density for reversing the direction of the magnetization M32D of the storage layer 32D is allowed to be reduced by improving spin injection efficiency.

The storage layer 32D is made of a ferromagnetic material having a magnetic moment in which the direction of the magnetization M32D is freely changed to the direction perpendicular to the film surface. The storage layer 32D may be made of, for example, Co—Fe—B.

FIG. 3 more specifically illustrates an example of configurations of respective layers of the storage section 32. The base layer 32A may have, for example, a configuration in which a Ta layer with a thickness of about 3 nm and a Ru film with a thickness of about 25 nm are laminated in order from a side closer to a first electrode 31. The magnetization fixed layer 32B may have, for example, a configuration in which a Pt layer with a thickness of about 5 nm, a Co layer with a thickness of about 1.1 nm, a Ru layer with a thickness of 0.8 nm, and a $(Co_{20}Fe_{80})_{80}B_{20}$ layer with a thickness of about 1 nm are laminated in this order from a side closer to the first electrode 31. The insulating layer 32C may have, for example, a configuration in which a Mg layer with a thickness of about 0.15 nm, a MgO layer with a thickness of about 1 nm, and a Mg layer with a thickness of about 0.15 nm are laminated in this order from a side closer to the first electrode 31. For example, the storage layer 32D may have a thickness t of about 1.2 nm to about 1.7 nm both inclusive, and may be configured of a $(Co_{20}Fe_{80})_{80}B_{20}$ layer. The cap layer 32E may have, for example, a configuration in which a Ta layer with a thickness of about 1 nm, a Ru layer with a thickness of about 5 nm, and a Ta layer with a thickness of about 3 nm are laminated in this order from a side closer to the first electrode 31.

[Method of Manufacturing Semiconductor Device 1]

The semiconductor device 1 may be manufactured by, for example, the following processes.

FIGS. 4A to 4G illustrate a part of a method of manufacturing the semiconductor device 1 in order of processes. First, the semiconductor substrate 10 made of the above-described material is prepared, and an LSI (large Scale Integrated circuit) is formed on the principal surface 10A of the semiconductor substrate 10 by a typical manufacturing process. It is to be noted that, in a case of a logic LSI, a multilayer wiring layer configured of 9 or more layers is typically formed. Moreover, in FIGS. 4A to 4G, a logic LSI structure is illustrated as a motif; however, a known device such as an existing DRAM (Dynamic Random Access Memory) may be incorporated.

Figure 4A:
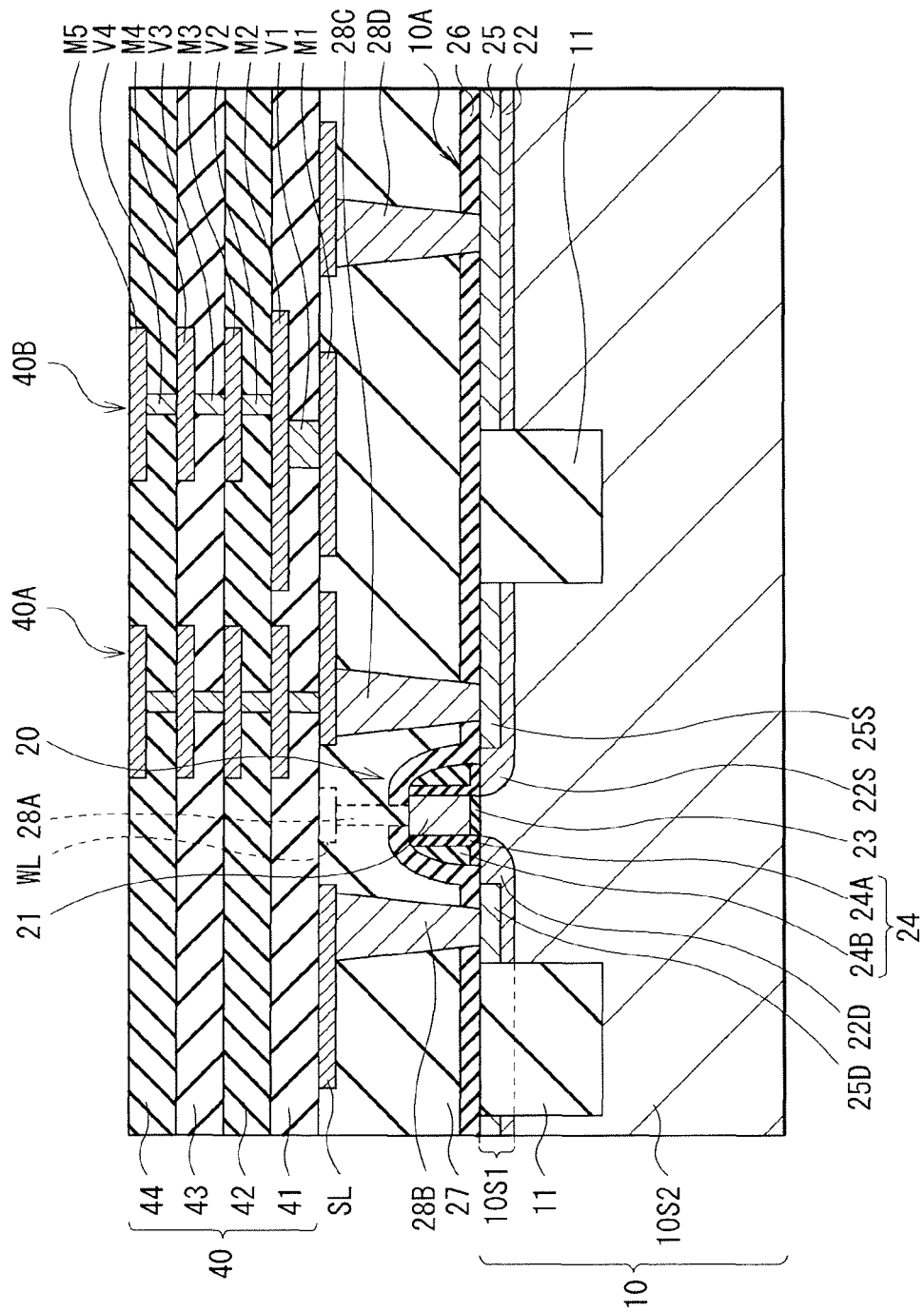
FIG. 4A is a sectional view illustrating a process in a method of manufacturing the semiconductor device illustrated in FIG. 1A.

More specifically, as illustrated in FIG. 4A, the element isolation layer 11 is formed on the principal surface 10A side of the semiconductor substrate 10 by, for example, STI. The transistor 20 including the gate electrode 21 and the pair of diffusion layers 22 is formed in a region surrounded by the element isolation layer 11, i.e., the element region R1 in the semiconductor substrate 10. The silicide region 25 is formed in a part of each of the diffusion layers 22. Next, after the interlayer insulating layers 26 and 27 with which the transistor 20 is covered are formed, and the connection layers 28A to 28D that pass through the interlayer insulating layers 26 and 27 are formed, the word line WL, the select line SL, and the metal layer M1 are formed. Moreover, the multilayer wiring formation section 40 is formed on the interlayer insulating layer 27.

Figure 4B:
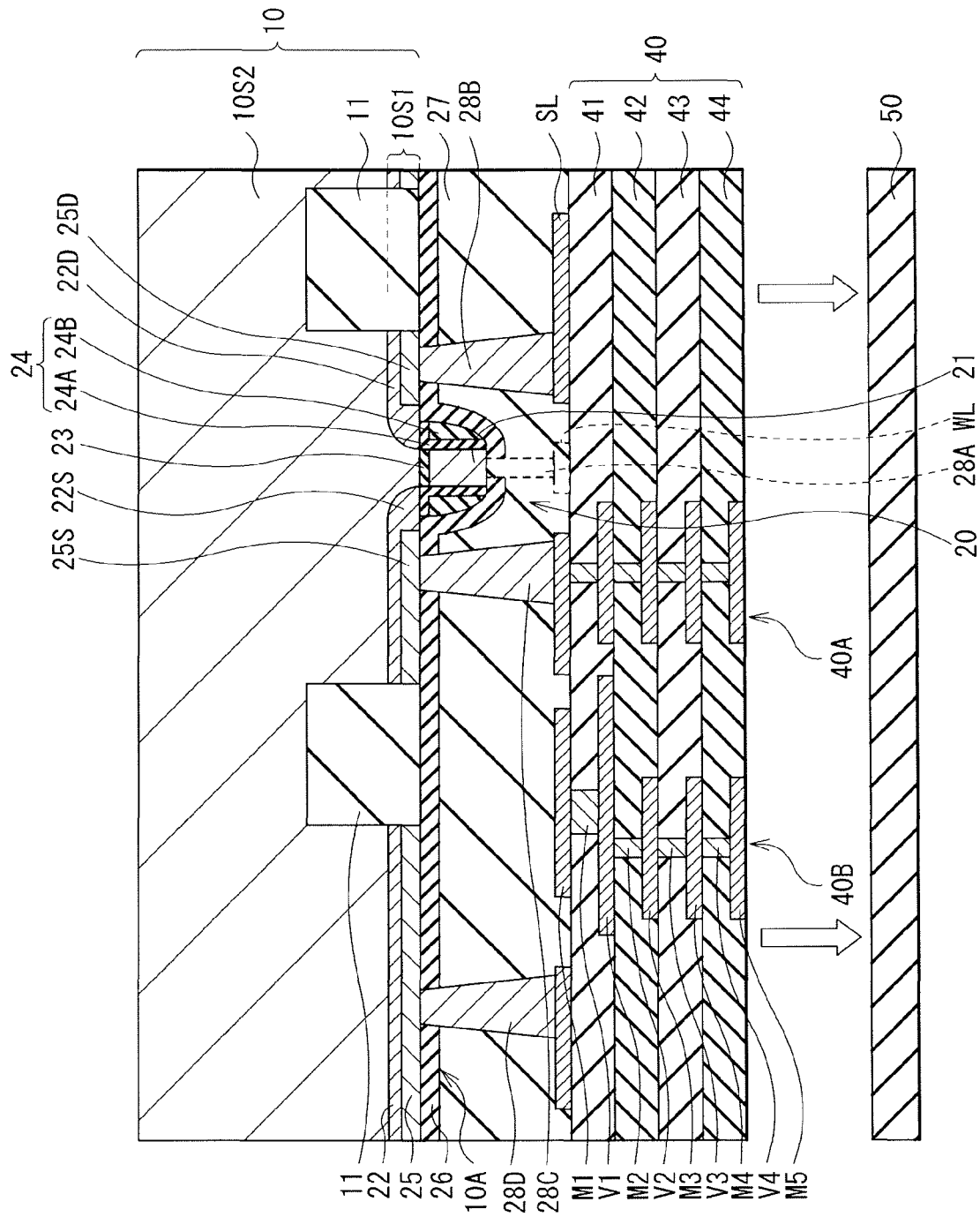
FIG. 4B is a sectional view illustrating a process following FIG. 4A.

Next, as illustrated in FIG. 4B, a laminate configuration formed by the above-described processes is turned upside down, and the supporting substrate 50 is bonded to a surface on a side opposite to the semiconductor substrate 10 of the multilayer wiring formation section 40 at low temperature with use of a technology such as plasma technology.

Figure 4C:
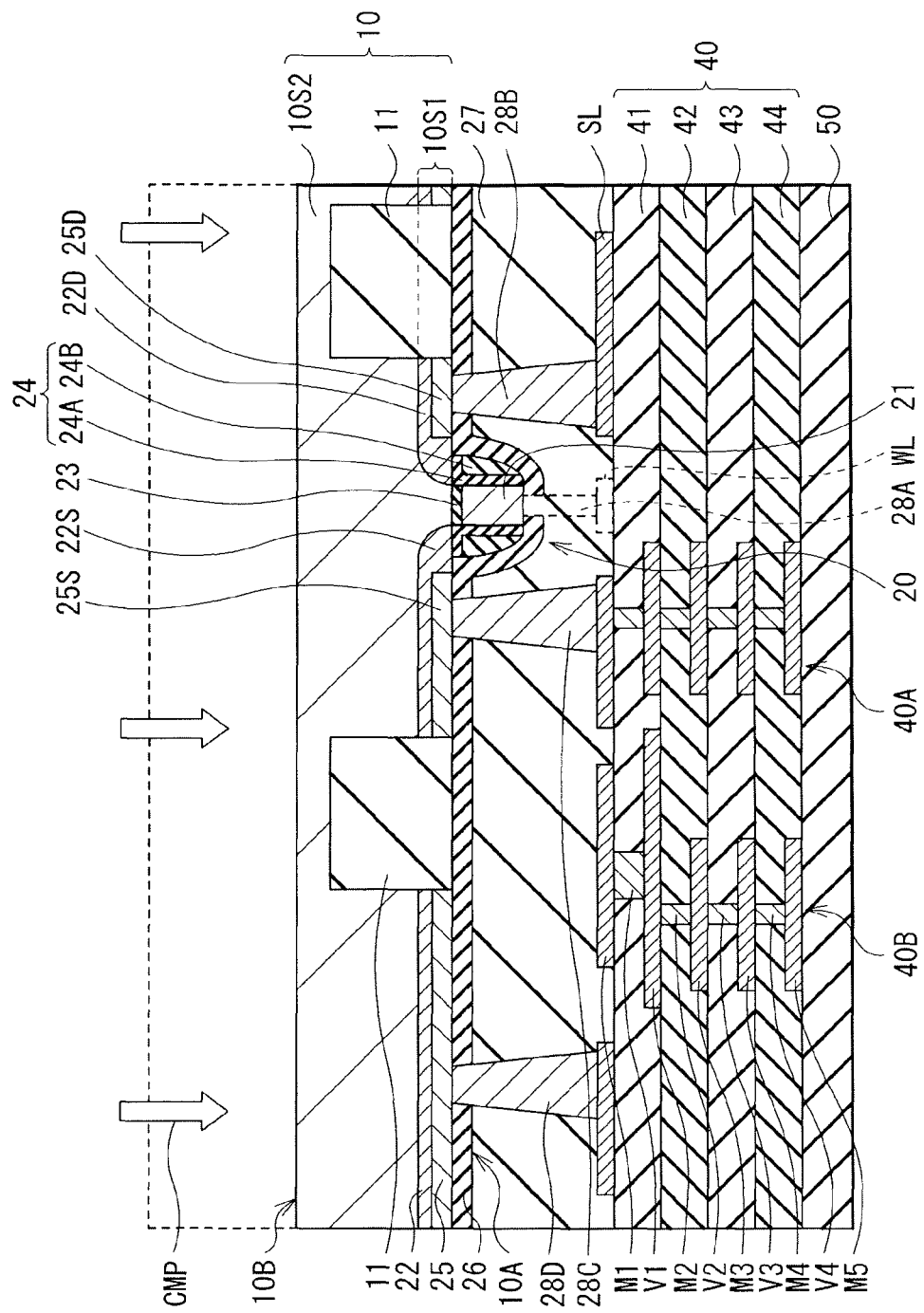
FIG. 4C is a sectional view illustrating a process following FIG. 4B.

Next, as illustrated in FIG. 4C, the semiconductor layer 10S2 of the semiconductor substrate 10 is polished by, for example, CMP (Chemical Mechanical Polishing), and polishing stops before reaching the element isolation layer 11. At this time, a thickness of a portion remaining on the element isolation layer 11 of the semiconductor layer 10S2 may be, for example, about 0.1 μm to about 1 μm both inclusive. Thus, the back surface 10B is formed.

Figure 4D:
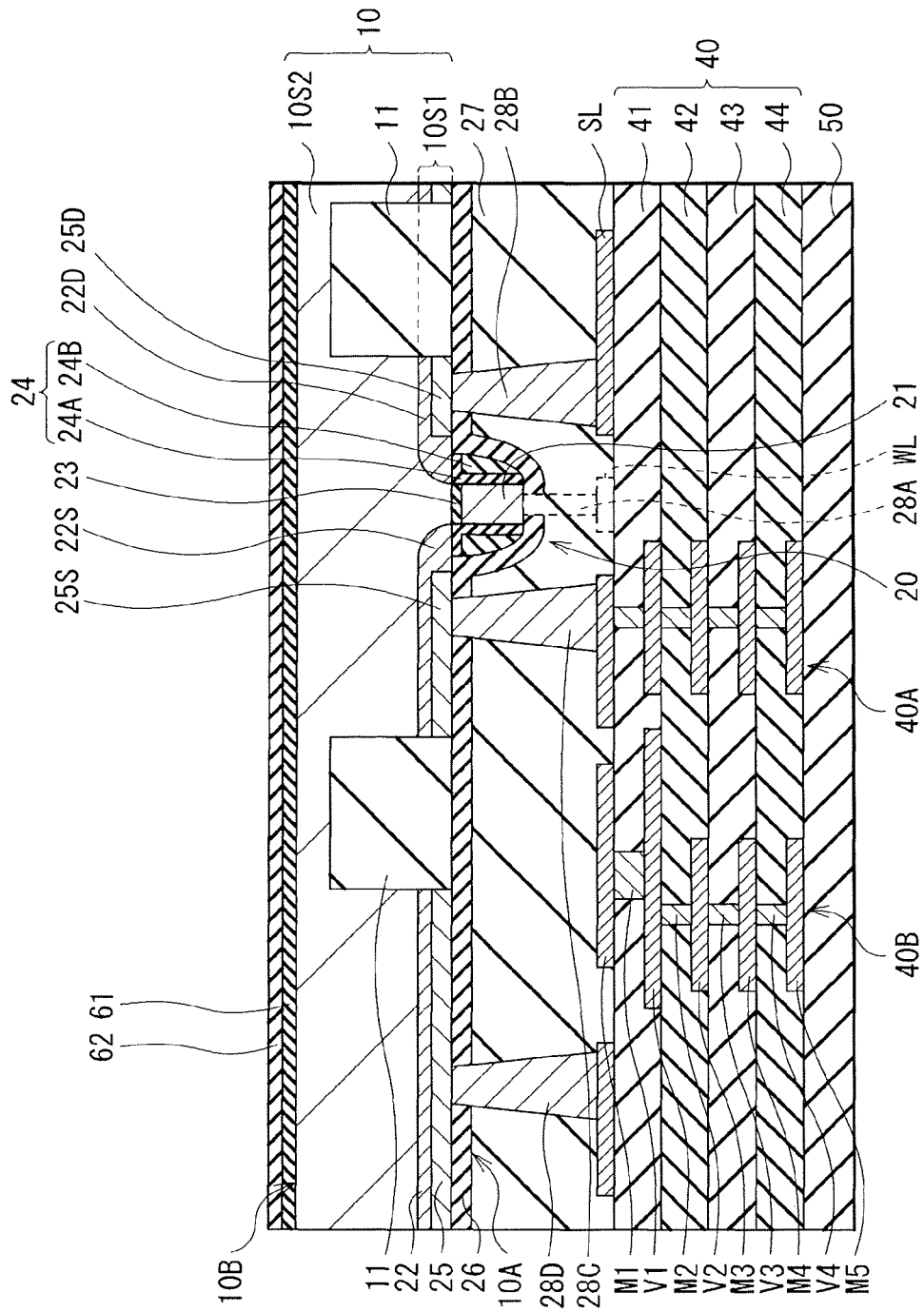
FIG. 4D is a sectional view illustrating a process following FIG. 4C.

After that, as illustrated in FIG. 4D, the insulating film 61 and the insulating film 62 are so formed of the above-described predetermined materials in order by, for example, CVD (Chemical Vapor Deposition) as to cover the back surface 10B of the semiconductor substrate 10.

Figure 4E:
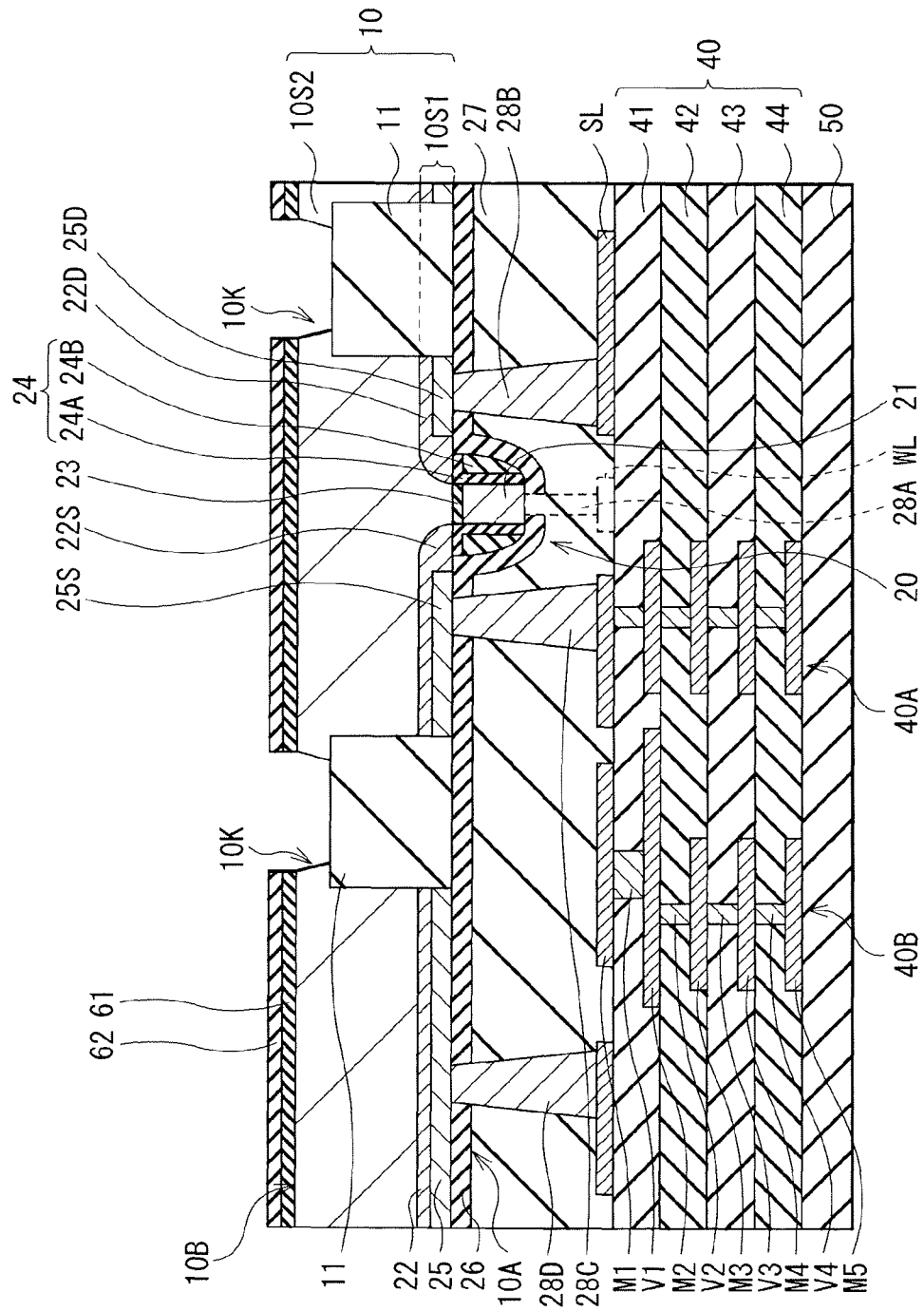
FIG. 4E is a sectional view illustrating a process following FIG. 4D.
Figure 4F:
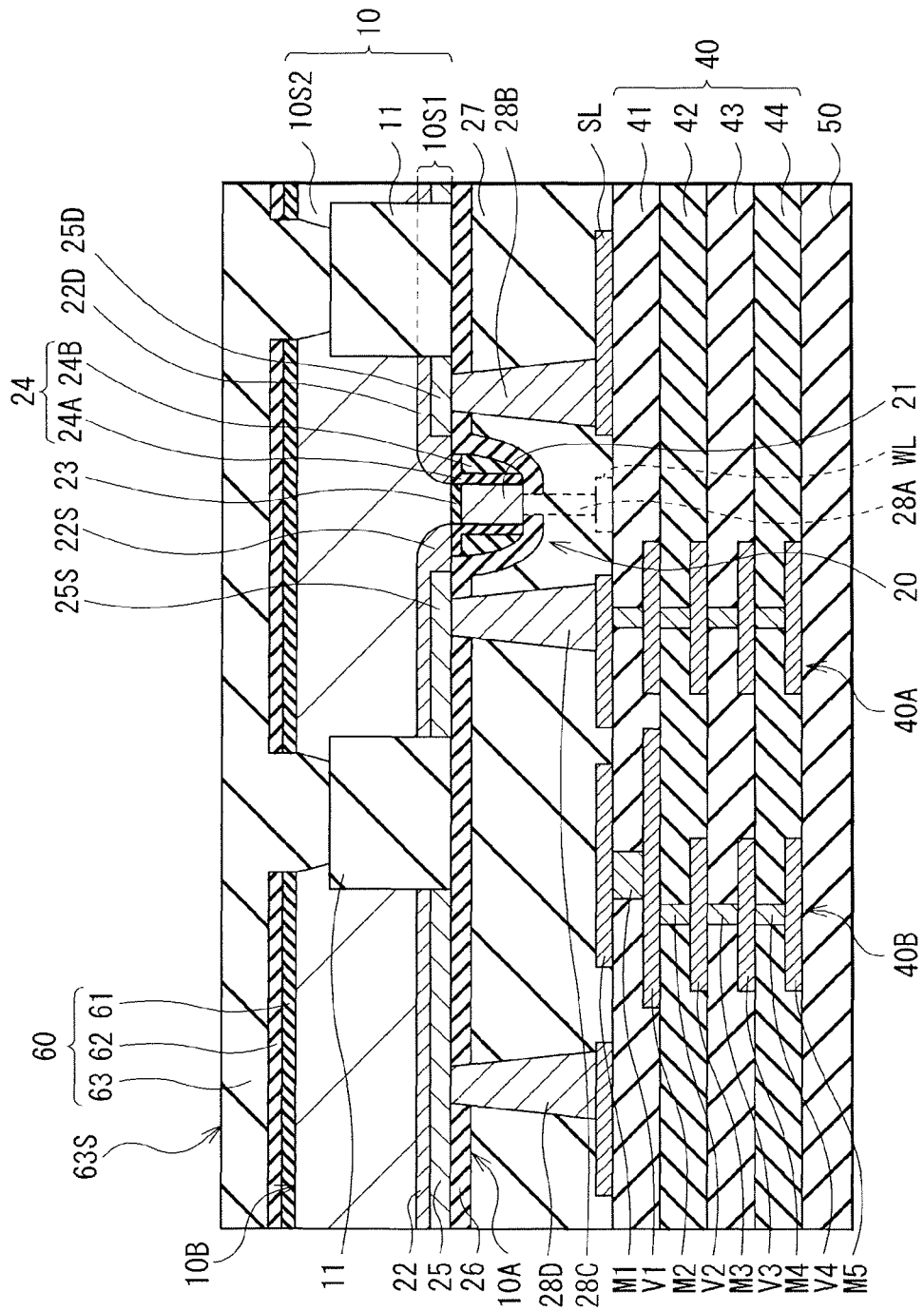
FIG. 4F is a sectional view illustrating a process following FIG. 4E.
Figure 4G:
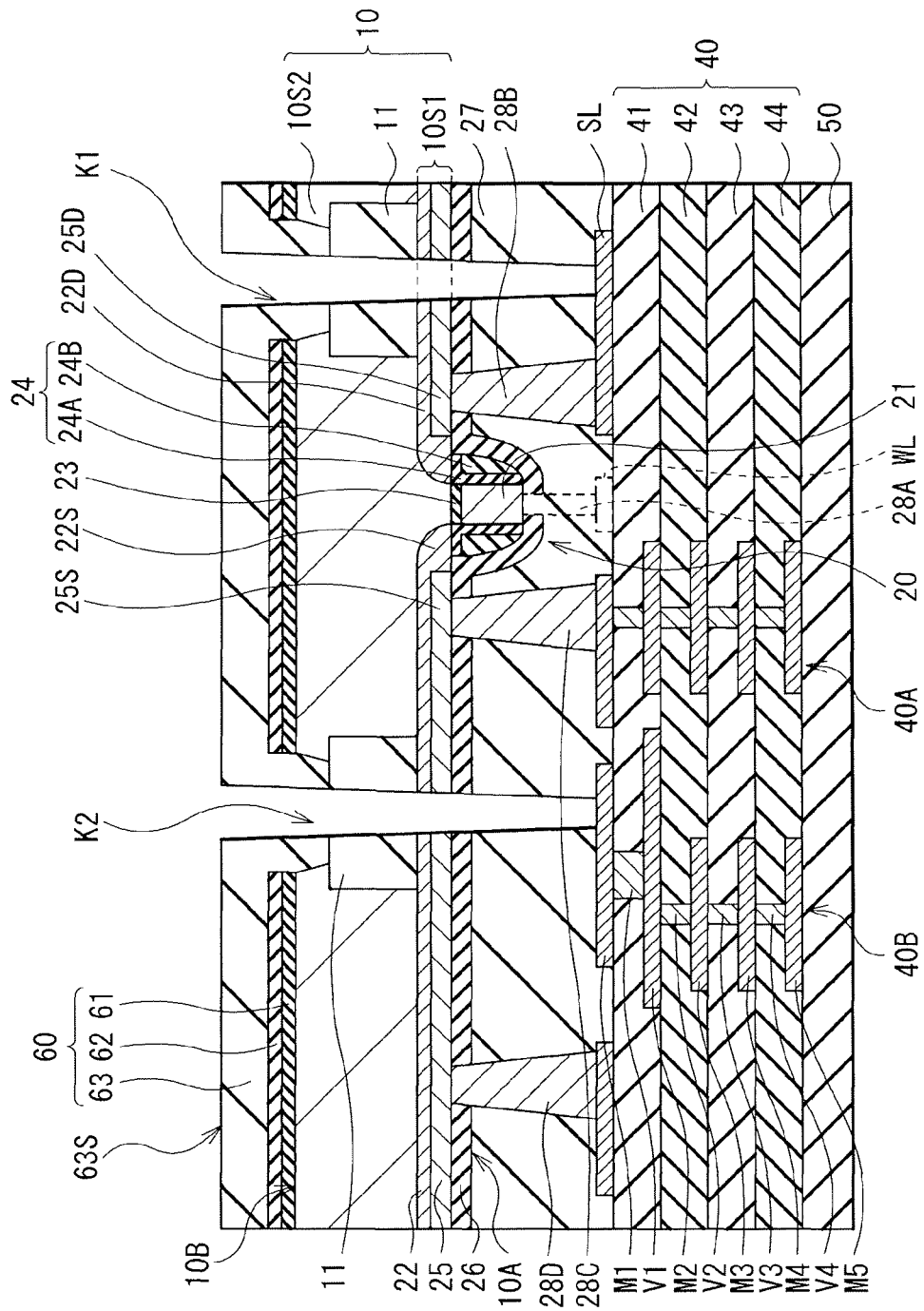
FIG. 4G is a sectional view illustrating a process following FIG. 4F.

Next, as illustrated in FIG. 4E, parts of portions occupying the isolation region R2 of the insulating film 61, the insulating film 62, and the semiconductor substrate 10 are selectively etched to form the opening 10K. After that, as illustrated in FIG. 4F, the insulating film 63 is so formed as to cover the semiconductor substrate 10 covered with the insulating film 61 and the insulating film 62 and as to fill the opening 10K, and a top surface of the insulating film 63 is planarized by a CMP method or the like. Therefore, a portion where the element isolation layer 11 and a part of the insulating film 63 are connected to each other through the opening 10K is formed. Moreover, as illustrated in FIG. 4G, each of through holes K1 and K2 reaching the select line SL or the metal layer M1 of the wiring line 40B is formed in a portion where the element isolation layer 11 and the insulating film 63 are connected to each other of the isolation region R2. Opening areas of the through holes K1 and K2 are allowed to be arbitrarily set. After that, the contact plugs P1 and P2 made of the above-described material are so formed as to fill the through holes K1 and K2. Next, as illustrated in FIG. 1A, the conductive layers 31 and 34 are so formed as to cover the top ends of the contact plugs P1 and P2. The storage section 32 and the conductive layer 33 are formed on the conductive layer 31, the conductive layer 35 is formed on the conductive layer 34, and finally, the common conductive layer 36 is so formed as to come into contact with the top surfaces of both the conductive layer 33 and the conductive layer 35, thereby forming the storage element 30.

Thus, the semiconductor device 1 is completed.

[Operation of Semiconductor Device 1]

In the semiconductor device 1, a current is applied in a direction perpendicular to a film surface of the storage section 32 according to high-low of potentials of the select line SL and the conductive layer 33 as a bit line to cause spin torque magnetization switching. Therefore, the direction of the magnetization M32D of the storage layer 32D is switched to be parallel or antiparallel to the magnetization M32B of the magnetization fixed layer 32B to change a resistance value of the storage section 32 to high or low, thereby executing writing of information.

On the other hand, to read information stored in the storage section 32, a magnetic layer (not illustrated) as a reference of information is provided on the storage layer 32 with a thin insulating film in between, thereby allowing the information to be read by a ferromagnetic tunnel current flowing through the insulating layer 32C. Moreover, the information may be read by a magnetoresistive effect.

[Functions and Effects of Semiconductor Device 1]

In the semiconductor device 1 and the method of manufacturing the same, the contact plugs P1 and P2 are provided in not the element region R1 provided with the transistor 20 but the isolation region R2. The peripheries of the contact plugs P1 and P2 are covered with the element isolation layer 11 and the insulating film 63, and are reliably insulated from the semiconductor substrate 10 (the semiconductor layer 10S2). Therefore, for example, even in a case where the storage element 30 is provided on a side opposite to a surface provided with the transistor 20 of the semiconductor substrate 10, a short circuit between the contact plugs P1 and P2 and an unintended part (for example, the gate electrode 21 or the like) of the transistor 20 is prevented. Thus, while flexibility in design is secured, a larger number of transistors 20 are allowed to be provided in a narrower region, and higher integration is allowed to be achieved.

Moreover, the semiconductor layer 10S2 are provided common to the element region R1, the isolation region R2, and the tap region R3. Therefore, a potential in the element region R1 of the semiconductor substrate 10 is allowed to be arbitrarily set by supplying power to the semiconductor layer 10S2 of the tap region R3 through the connection layer 28D. As a result, the potential of the semiconductor substrate 10 is allowed to be fixed to an arbitrary value, and is allowed to be effectively used as a bulk transistor. Further, for example, higher operation speed or lower power consumption is allowed to be achieved with use of a so-called substrate bias effect. In other words, a threshold voltage Vth is allowed to be reduced by biasing the semiconductor substrate 10 forward during operation, and current leakage is allowed to be reduced by increasing speed of operation of the transistor 20 or biasing the semiconductor substrate 10 backward during standby.

Modification Example 1

Figure 5:
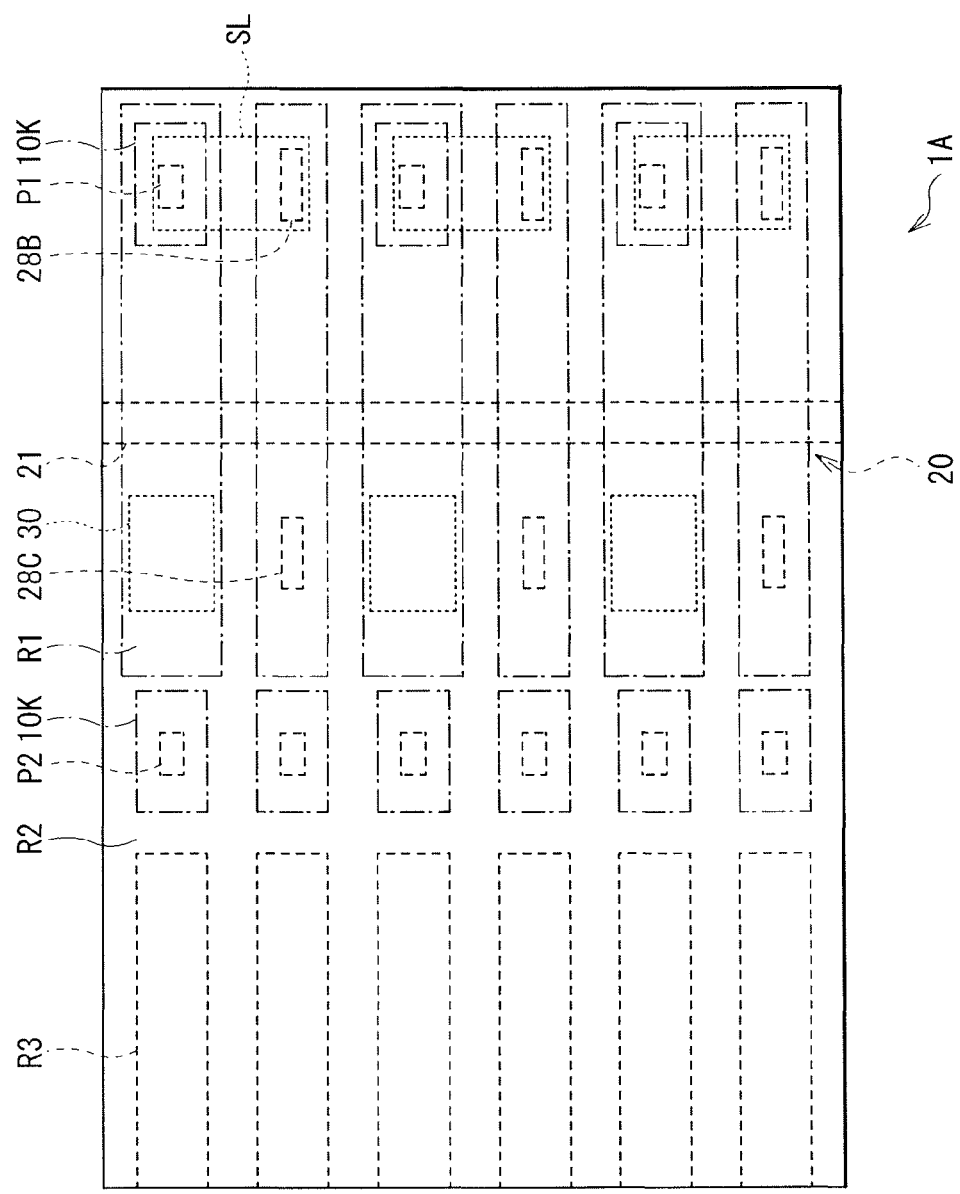
FIG. 5 is a plan view illustrating a first modification example of the semiconductor device according to the first embodiment of the present disclosure.

FIG. 5 illustrates a planar configuration of a semiconductor device 1A according to a first modification example of the above-described semiconductor device 1. In the above-described semiconductor device 1, the contact plug P1 is arranged at an extension of a direction where the connection layer 28A, the connection layer 28B, and the connection layer 28C are aligned; however, the present technology is not limited thereto. As illustrated in the semiconductor device 1A illustrated in FIG. 5, the storage element 30 may be provided in the isolation region R2, and the contact plug P1 may be arranged adjacent to the connection layer 28B in an extending direction of the gate electrode 21. Even in this case, a short circuit between the contact plug P1 and the gate electrode 21 or the like is allowed to be reliably prevented.

Modification Example 2

Figure 6:
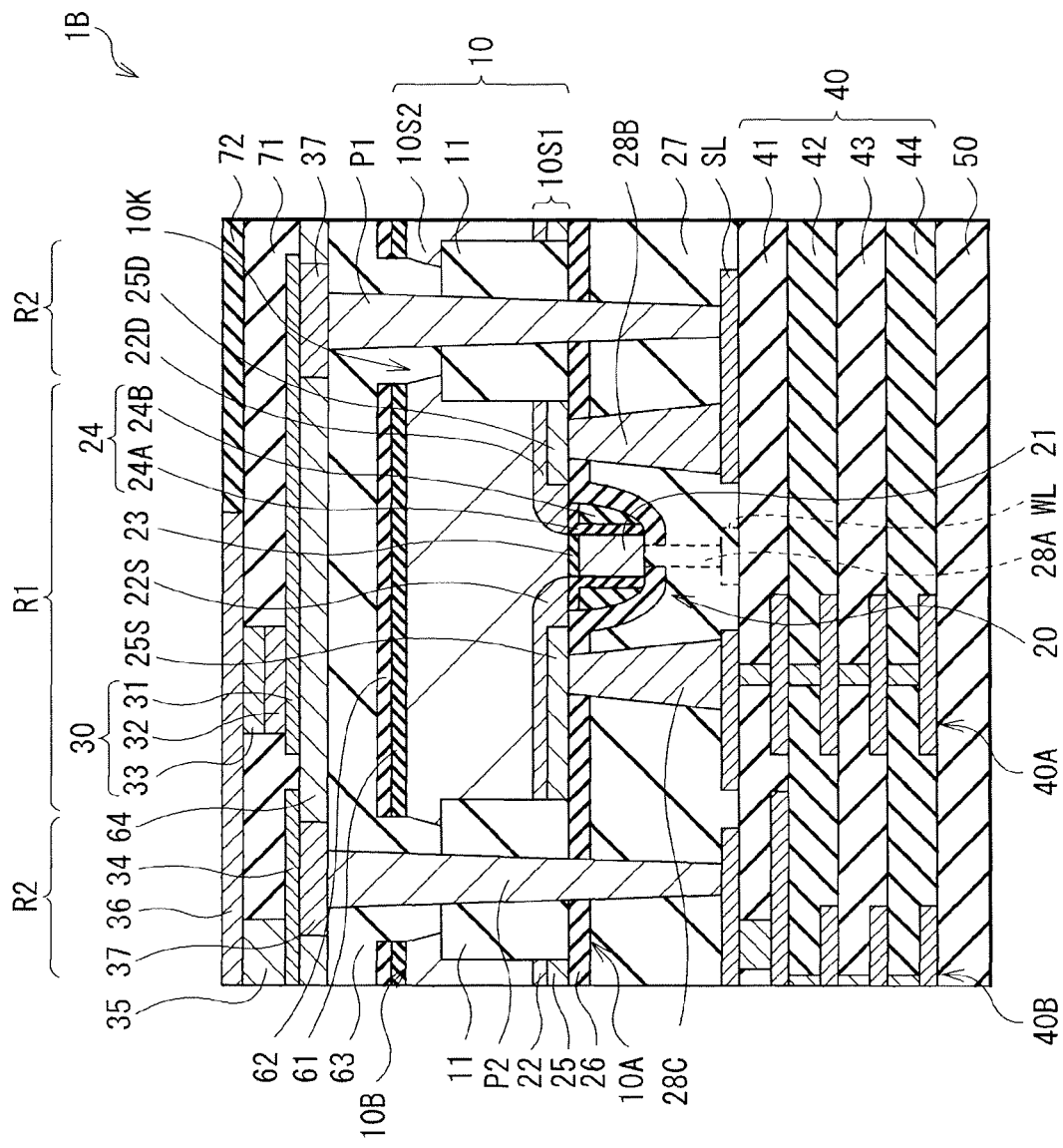
FIG. 6 is a sectional view illustrating a second modification example of the semiconductor device according to the first embodiment of the present disclosure.

FIG. 6 illustrates a sectional configuration of a semiconductor device 1B according to a second modification example of the above-described semiconductor device 1. The semiconductor device 1B has a configuration similar to the semiconductor device 1, except that a low-resistance wiring layer 37 is so provided as to cover the top ends of the contact plugs P1 and P2. The low-resistance wiring layer 37 may be made of Cu that is a material having lower resistance than Ta, and a periphery of the low-resistance wiring layer 37 is surrounded by the insulating layer 64. In the semiconductor device 1B, wiring resistance is allowed to be reduced. It is to be noted that the low-resistance wiring layer 37 may be formed by, for example, a dual damascene method. The dual damascene method is a method in which a wiring groove and a wiring hole (via) are collectively formed, and then the wiring groove and the wiring hole are concurrently filled with a low-resistance material such as Cu by a plating method or the like.

Second Embodiment

[Configuration of Semiconductor Device 2]

Figure 7:
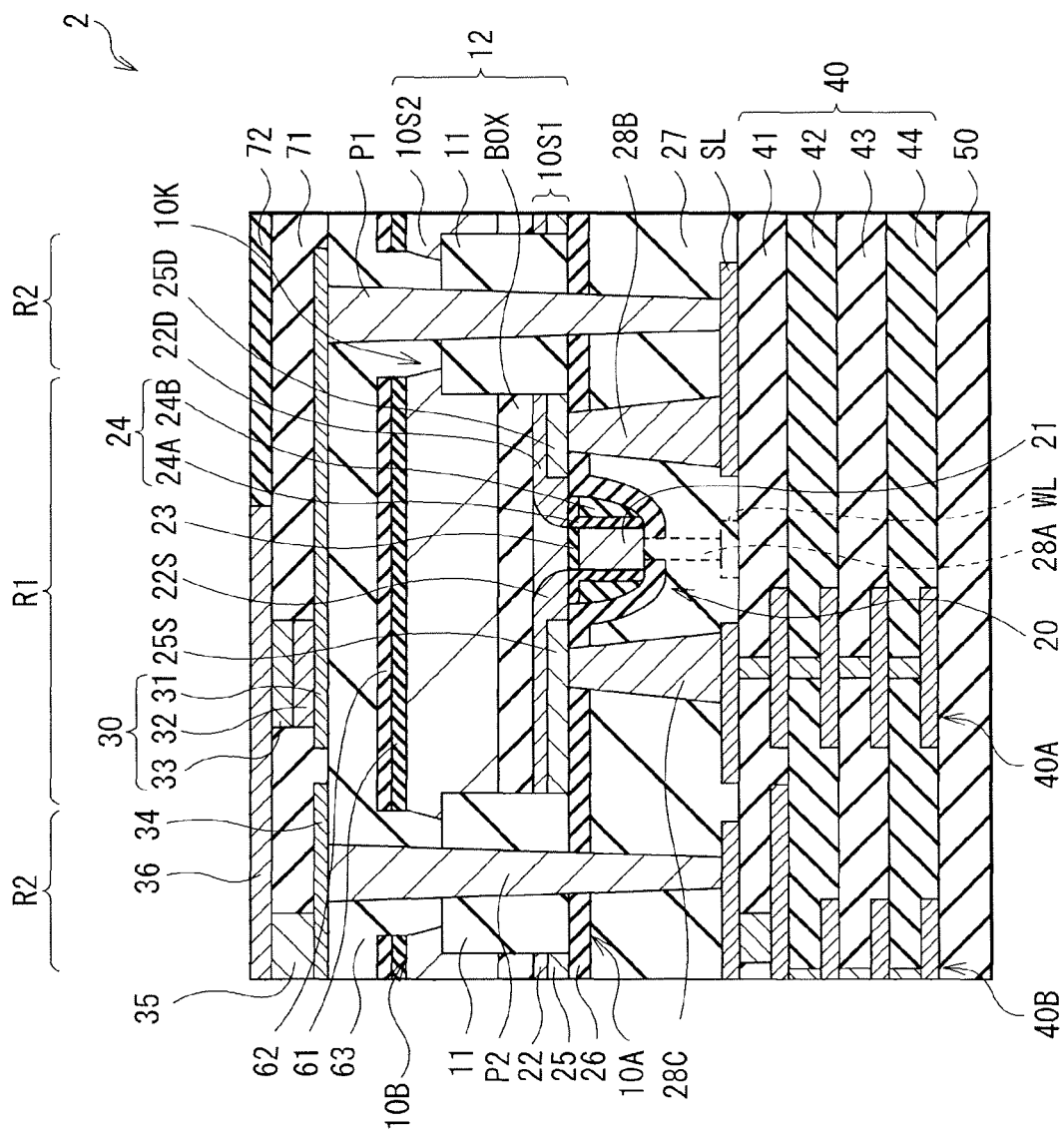
FIG. 7 is a sectional view illustrating a configuration example of a semiconductor device according to a second embodiment of the present disclosure.

FIG. 7 illustrates a sectional configuration of a semiconductor device 2 according to a second embodiment of the present disclosure. The semiconductor device 2 includes a semiconductor substrate 12 with a SOI (Silicon on Insulator) structure, and is superior in operation speed while power consumption is low. More specifically, the semiconductor substrate 12 has a laminate configuration in which a buried oxide film BOX is inserted between the semiconductor layer 10S1 and the semiconductor layer 10S2. The buried oxide film BOX may be configured of, for example, a silicon oxide film, and may have a thickness of, for example, about 20 nm. In the following description, like components are denoted by like numerals as of the semiconductor device 1 according to the above-described first embodiment. It is to be noted that, the tap region R3 is not illustrated in FIG. 7.

[Method of Manufacturing Semiconductor Device 2]

Figure 8A:
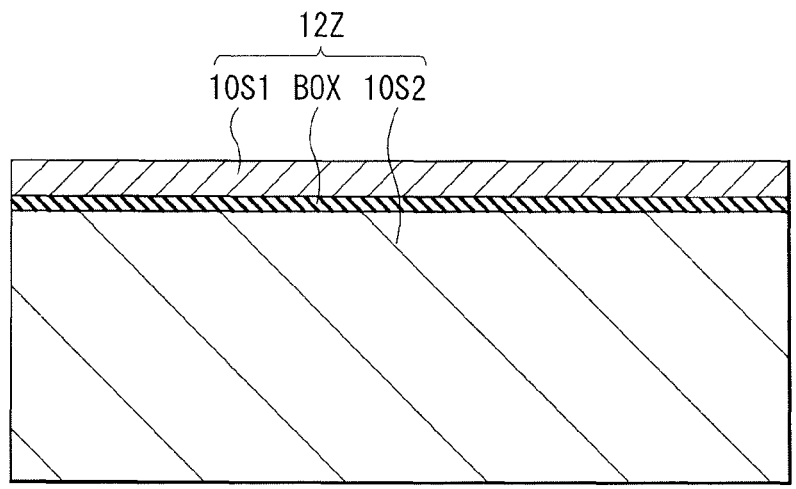
FIG. 8A is a sectional view illustrating a process in a method of manufacturing the semiconductor device illustrated in FIG. 7.
Figure 8B:
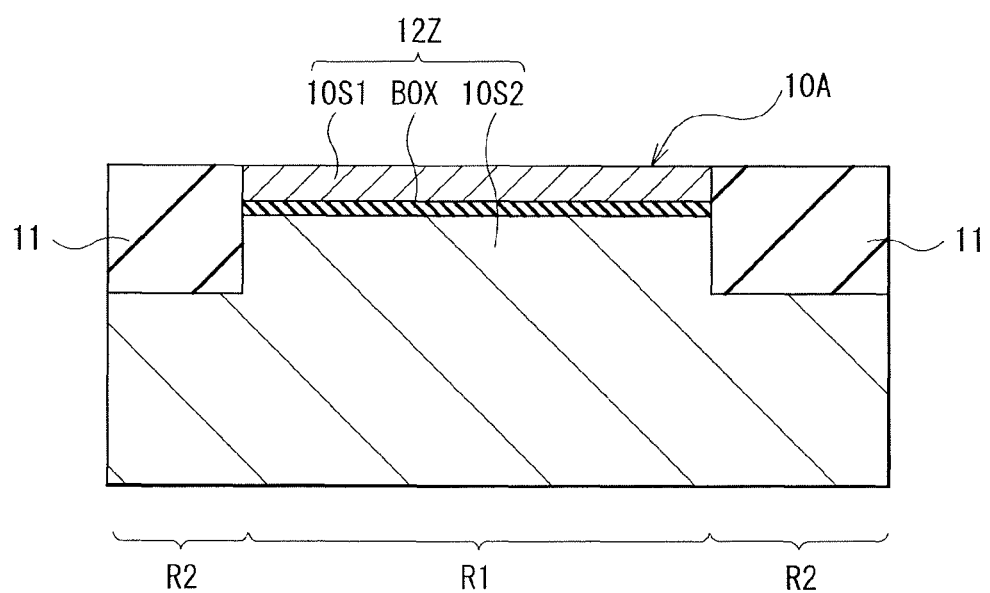
FIG. 8B is a sectional view illustrating a process following FIG. 8A.

FIGS. 8A and 8B illustrate a part of a method of manufacturing the semiconductor device 2 in process order. First, as illustrated in FIG. 8A, a semiconductor substrate 12Z configured by inserting the buried oxide film BOX between the semiconductor layer 10S1 and the semiconductor layer 10S2 that are made of, for example, single-crystal silicon is prepared. Next, as illustrated in FIG. 8B, for example, the element isolation layer 11 is formed in proximity to the principal surface 10A of the semiconductor substrate 12Z in the isolation region R2 by STI. In this case, the semiconductor layer 10S1 and the buried oxide film BOX in the isolation region R2 are removed and dug until reaching the semiconductor layer 10S2 (for example, to a depth of about 20 nm to about 300 nm both inclusive of the semiconductor layer 10S2) to form a groove, and the groove is filled with a predetermined material. After that, ion implantation may be performed on the semiconductor layer 10S2 as necessary to provide a ground plane layer with high-impurity concentration in proximity to an interface adjacent to the buried oxide film BOX of the semiconductor layer 10S2.

After the element isolation layer 11 is formed, the semiconductor device 2 is completed by processes similar to those in the method of manufacturing the semiconductor device 1 according to the above-described first embodiment.

[Functions and Effects of Semiconductor Device 2]

Even in such a semiconductor device 2, functions similar to those of the semiconductor device 1 according to the above-described first embodiment are allowed to be fulfilled. Moreover, even in the semiconductor device 2, a potential of the semiconductor substrate 12 is allowed to be arbitrarily set; therefore, as with the semiconductor device 1 according to the above-described first embodiment, the potential of the semiconductor substrate 12 is allowed to be fixed arbitrarily, or a substrate bias effect is allowed to be used.

Modification Example 3

[Configuration of Semiconductor Device 2A]

Figure 9:
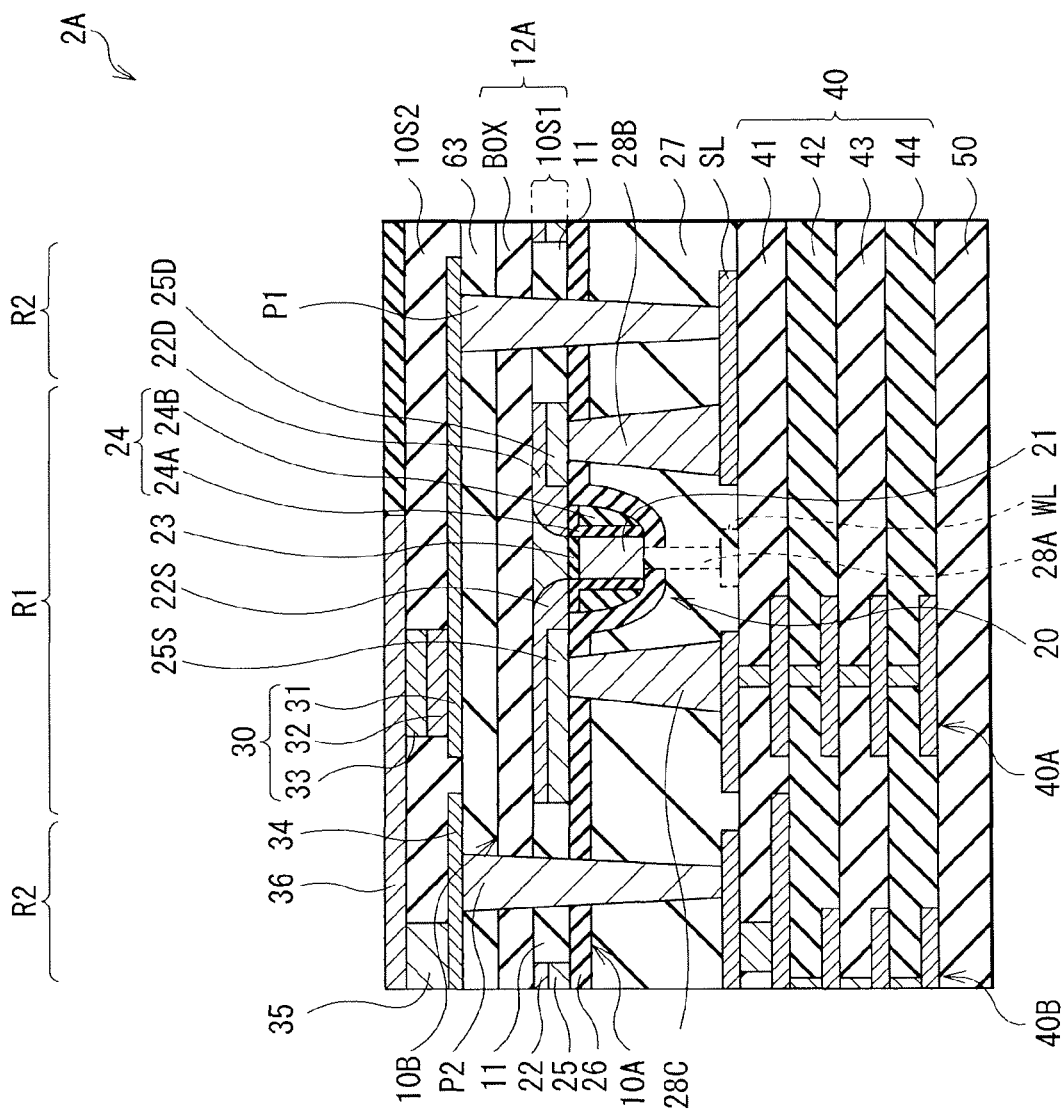
FIG. 9 is a sectional view illustrating a modification example of the semiconductor device according to the second embodiment of the present disclosure.

FIG. 9 illustrates a sectional configuration of a semiconductor device 2A according to a modification example of the above-described semiconductor device 2. The semiconductor device 2A differs from the semiconductor device 2 in that a semiconductor substrate 12A is included instead of the semiconductor substrate 12. The semiconductor substrate 12A has a SOI structure, but does not include the semiconductor layer 10S2. In other words, the semiconductor substrate 12A has a two-layer configuration of the semiconductor layer 10S1 with which the transistor 20 is covered in the element region R1 and the buried oxide film BOX with which the semiconductor layer 10S1 and the element isolation layer 11 are entirely covered. The buried oxide film BOX is entirely covered with an insulating layer 63.

[Method of Manufacturing Semiconductor Device 2A]

Figure 10A:
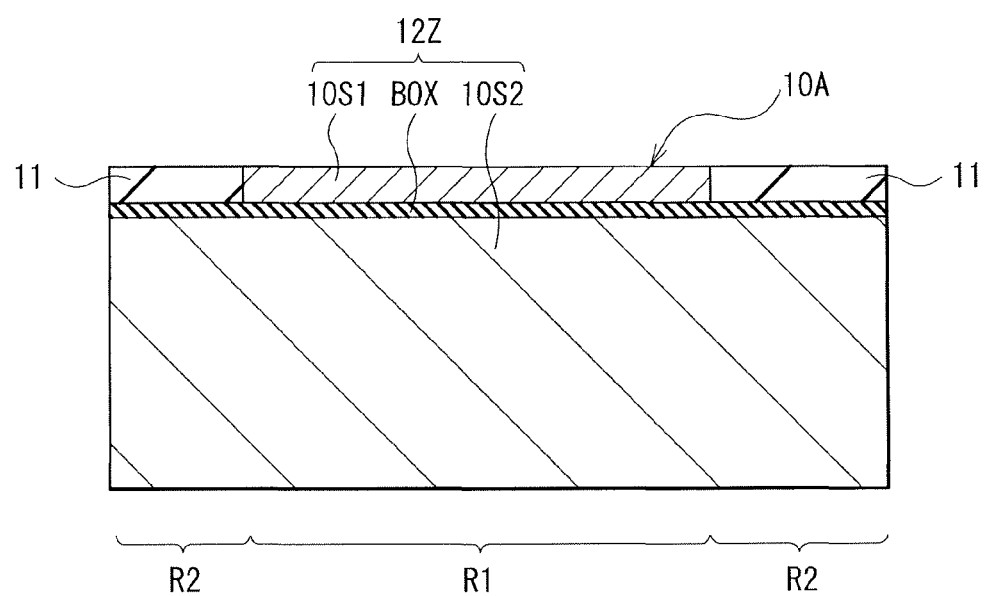
FIG. 10A is a sectional view illustrating a process in a method of manufacturing the semiconductor device illustrated in FIG. 9.

FIGS. 10A to 10G illustrate a part of a method of manufacturing the semiconductor device 2A in process order. First, as illustrated in FIG. 10A, after the semiconductor substrate 12Z is prepared, the element isolation layer 11 is formed in proximity to the principal surface 10A in the isolation region R2 by, for example, STI. In this case, the semiconductor layer 10S1 in the isolation region R2 is removed and dug until reaching the buried oxide film BOX to form a groove, and then the groove is filled with a predetermined material. At this time, the buried oxide film BOX remains even in the isolation region R2.

Figure 10B:
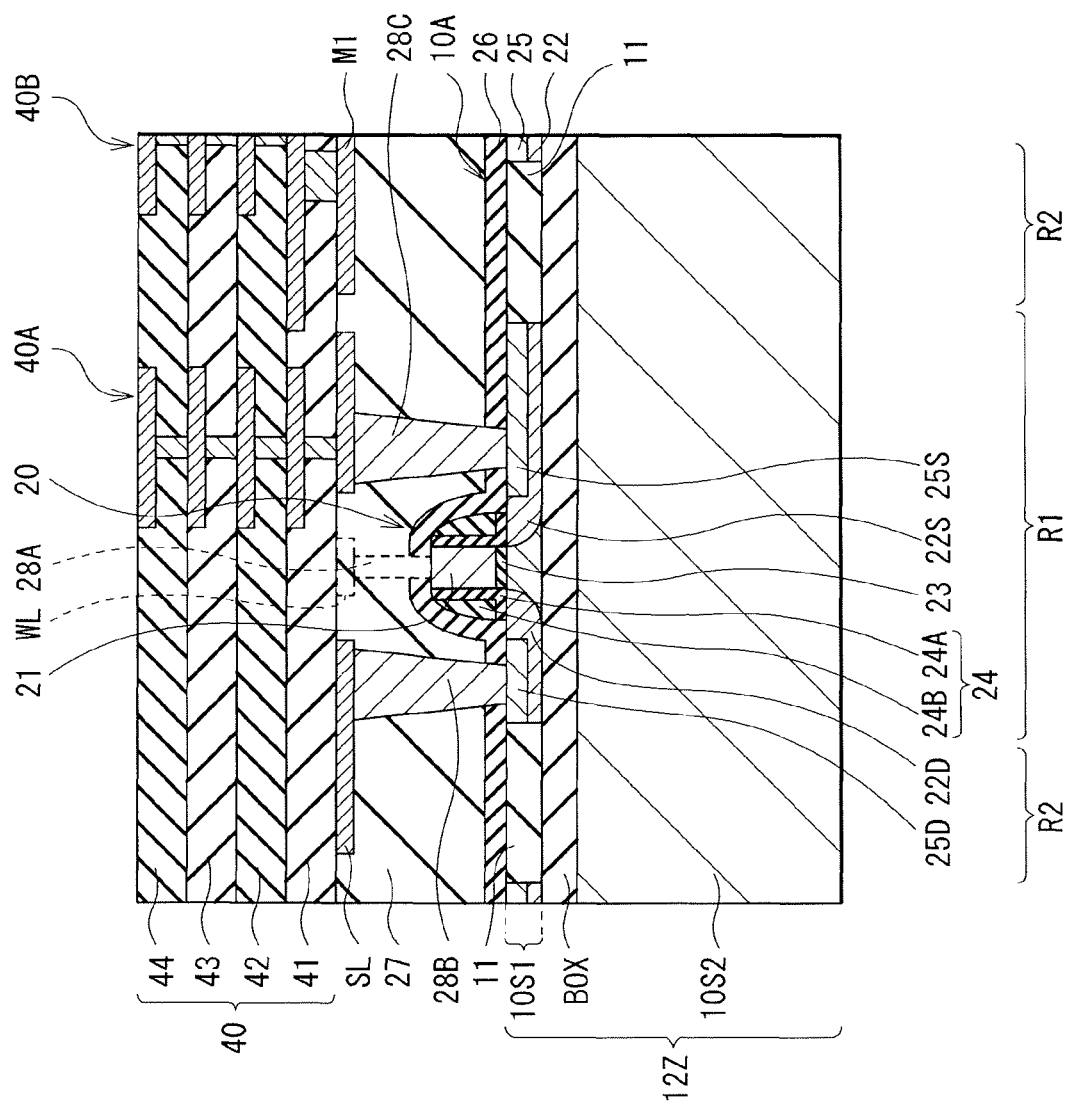
FIG. 10B is a sectional view illustrating a process following FIG. 10A.

Next, as illustrated in FIG. 10B, the transistor 20 including the gate electrode 21 and the pair of diffusion layers 22S and 22D is formed on the semiconductor layer 10S1. Silicide regions 25S and 25D are formed in parts of the diffusion layers 22S and 22D, respectively. Then, after the interlayer insulating films 26 and 27 with which the transistor 20 is covered are formed, and the connection layers 28A to 28C that pass through the interlayer insulating films 26 and 27 are formed, the select line SL and the metal layer M1 are formed. Moreover, the multilayer wiring formation section 40 is formed on the interlayer insulating film 27.

Figure 10C:
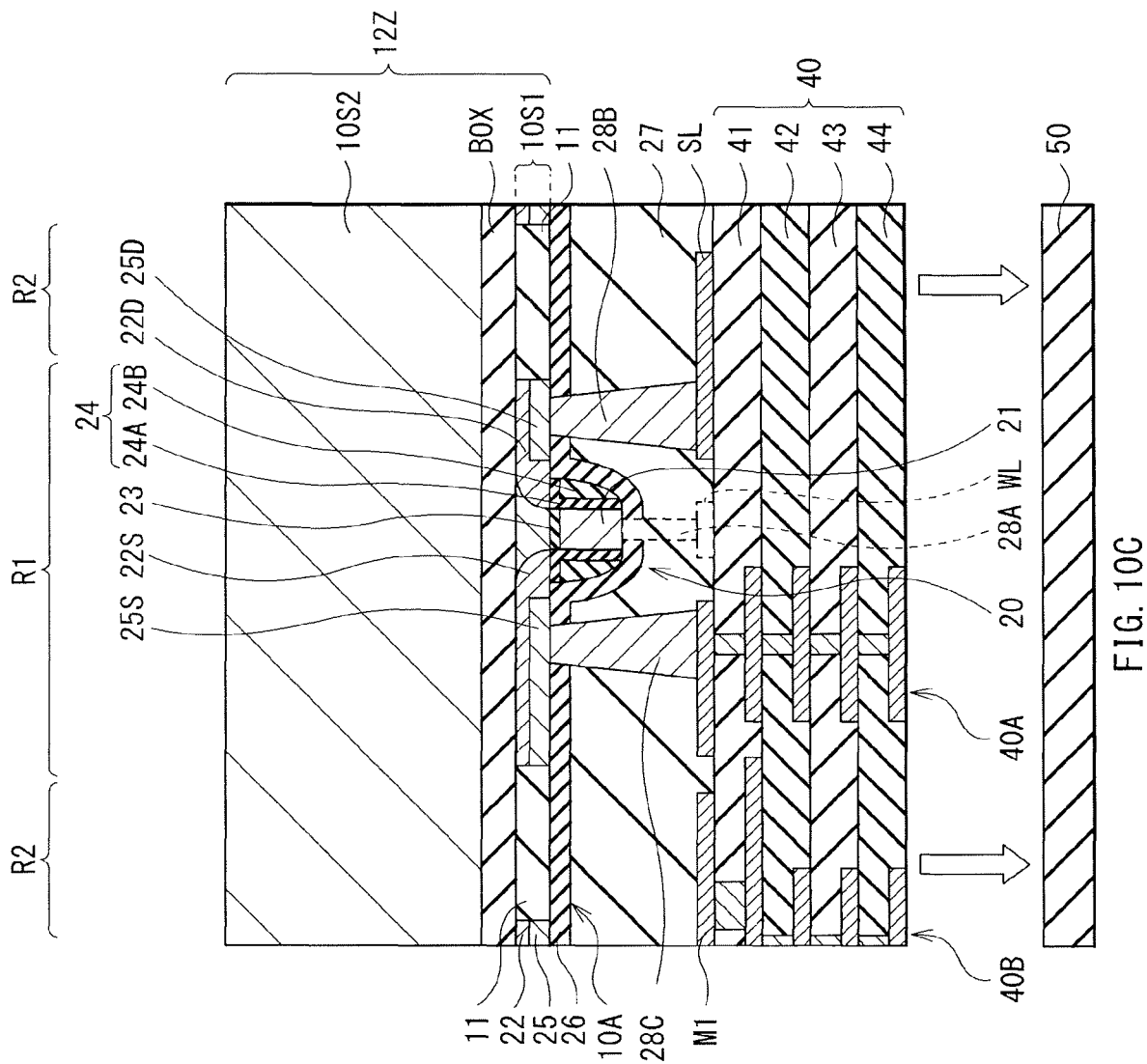
FIG. 10C is a sectional view illustrating a process following FIG. 10B.

Next, as illustrated in FIG. 10C, a laminate configuration formed by the above-described processes is turned upside down, and the supporting substrate 50 is bonded to a surface on a side opposite to the semiconductor substrate 12 of the multilayer wiring formation section 40 at low temperature with use of a technology such as plasma technology.

Figure 10D:
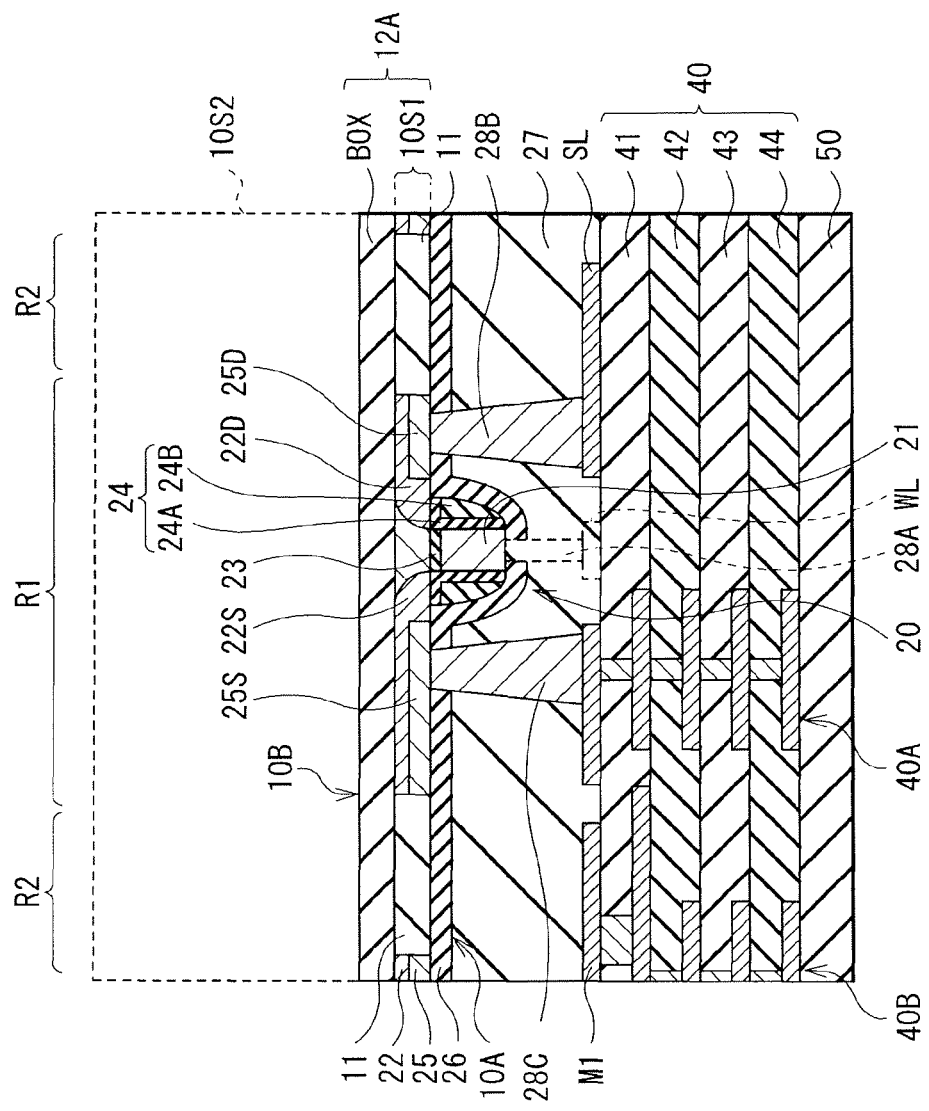
FIG. 10D is a sectional view illustrating a process following FIG. 10C.

Then, as illustrated in FIG. 10D, the semiconductor layer 10S2 of the semiconductor substrate 10 is polished by, for example, CMP, and polishing stops when the buried oxide film is exposed. At this time, the semiconductor layer 10S2 is completely removed, and the semiconductor substrate 12A configured of the semiconductor layer 10S1 and the buried oxide film BOX is formed.

Figure 10E:
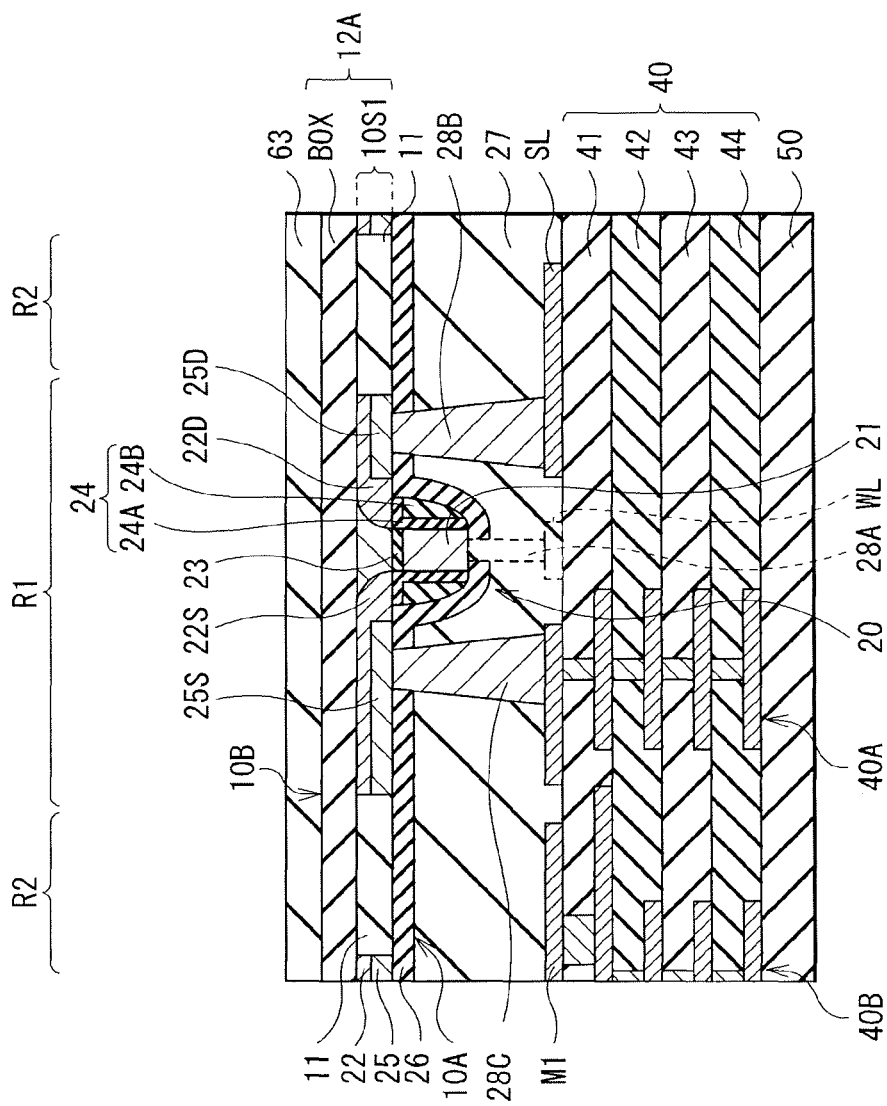
FIG. 10E is a sectional view illustrating a process following FIG. 10D.
Figure 10F:
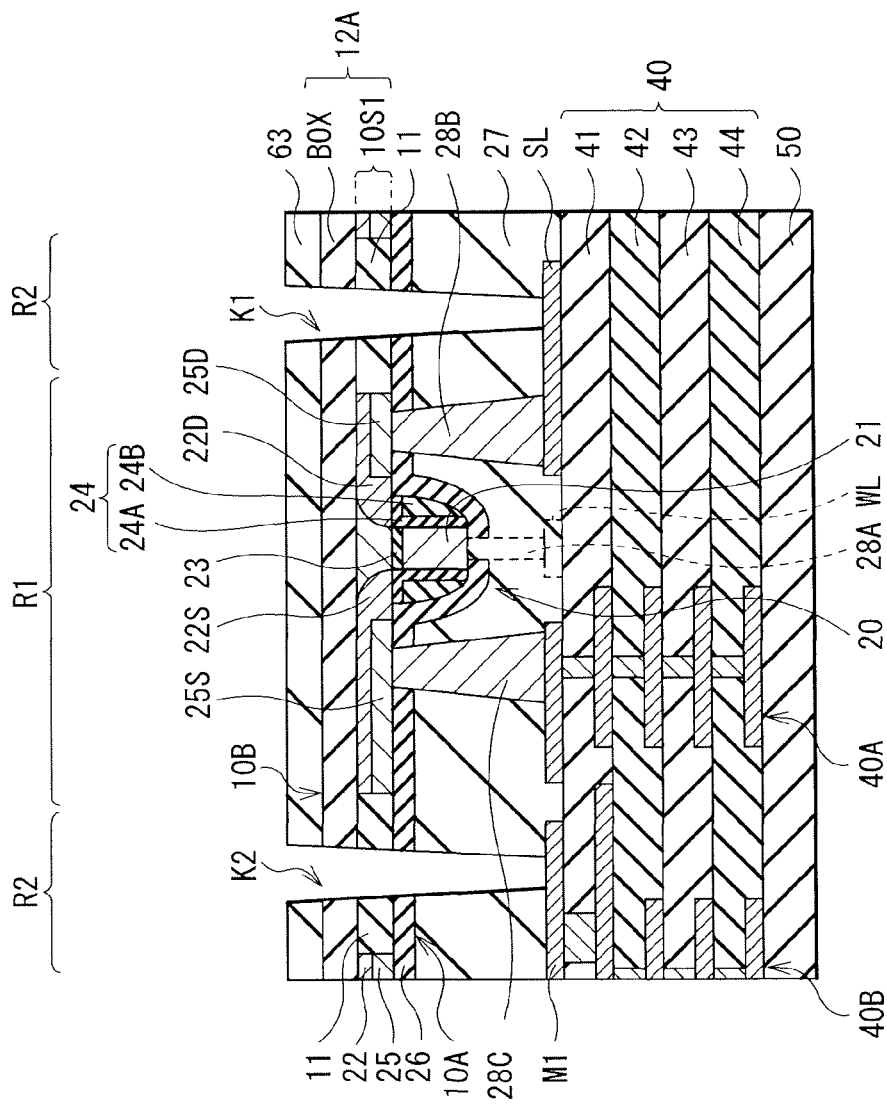
FIG. 10F is a sectional view illustrating a process following FIG. 10E.
Figure 10G:
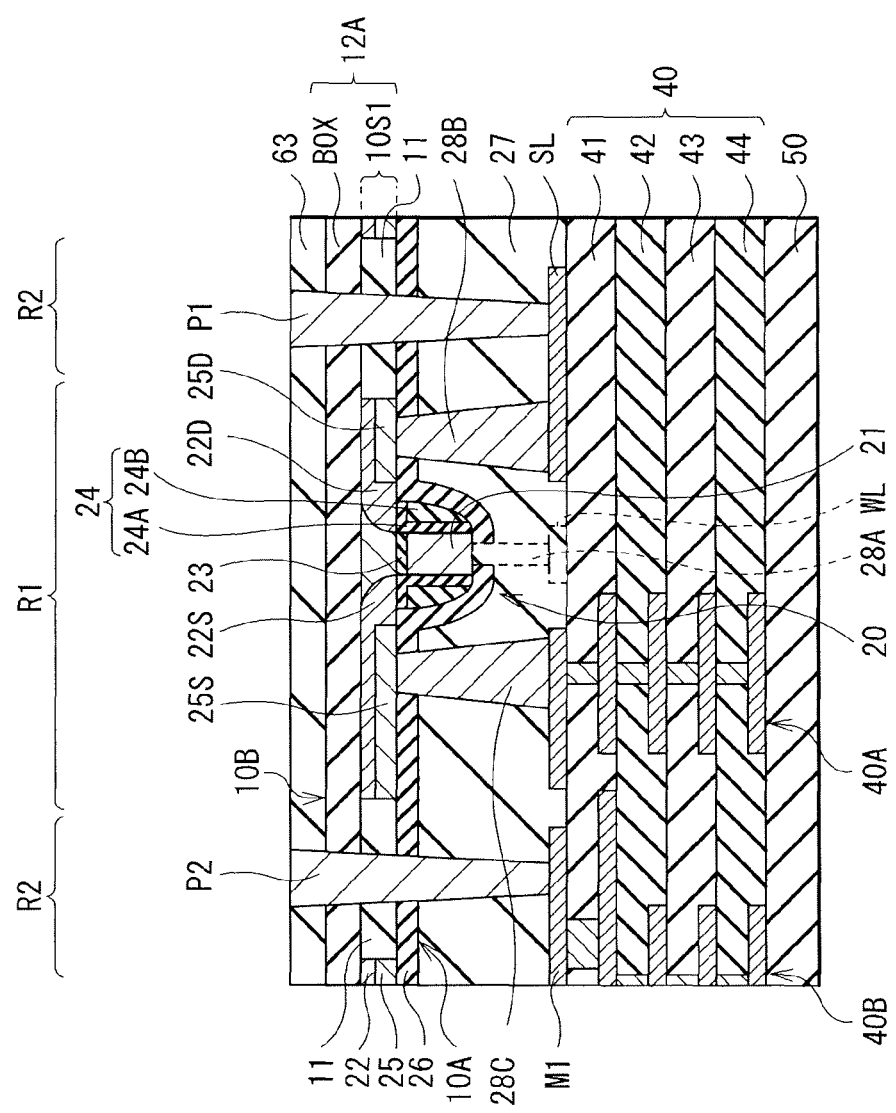
FIG. 10G is a sectional view illustrating a process following FIG. 10F.

Next, as illustrated in FIG. 10E, the insulating film 63 with which the semiconductor substrate 12A is entirely covered is formed, and then, as illustrated in FIG. 10F, the through holes K1 and K2 that pass through the insulating film 63, the buried oxide film BOX, the element isolation layer 11, the interlayer insulating film 26, and the interlayer insulating film 27 in the isolation region R2 to reach the select line SL or the metal layer M1 of the wiring line 40B are formed. The opening areas of the through holes K1 and K2 are allowed to be arbitrarily set. After that, the contact plugs P1 and P2 made of the above-described material are so formed as to fill the through holes K1 and K2 (refer to FIG. 10G). After that, the storage element 30 is formed as with the semiconductor device 1 according to the first embodiment.

Thus, the semiconductor device 2A is completed. Even in such a semiconductor device 2A, while flexibility in design is secured, a larger number of transistors 20 are allowed to be arranged in a narrower region, and higher integration is allowed to be achieved.

Third Embodiment

[Configuration of Semiconductor Device 3]

Figure 11A:
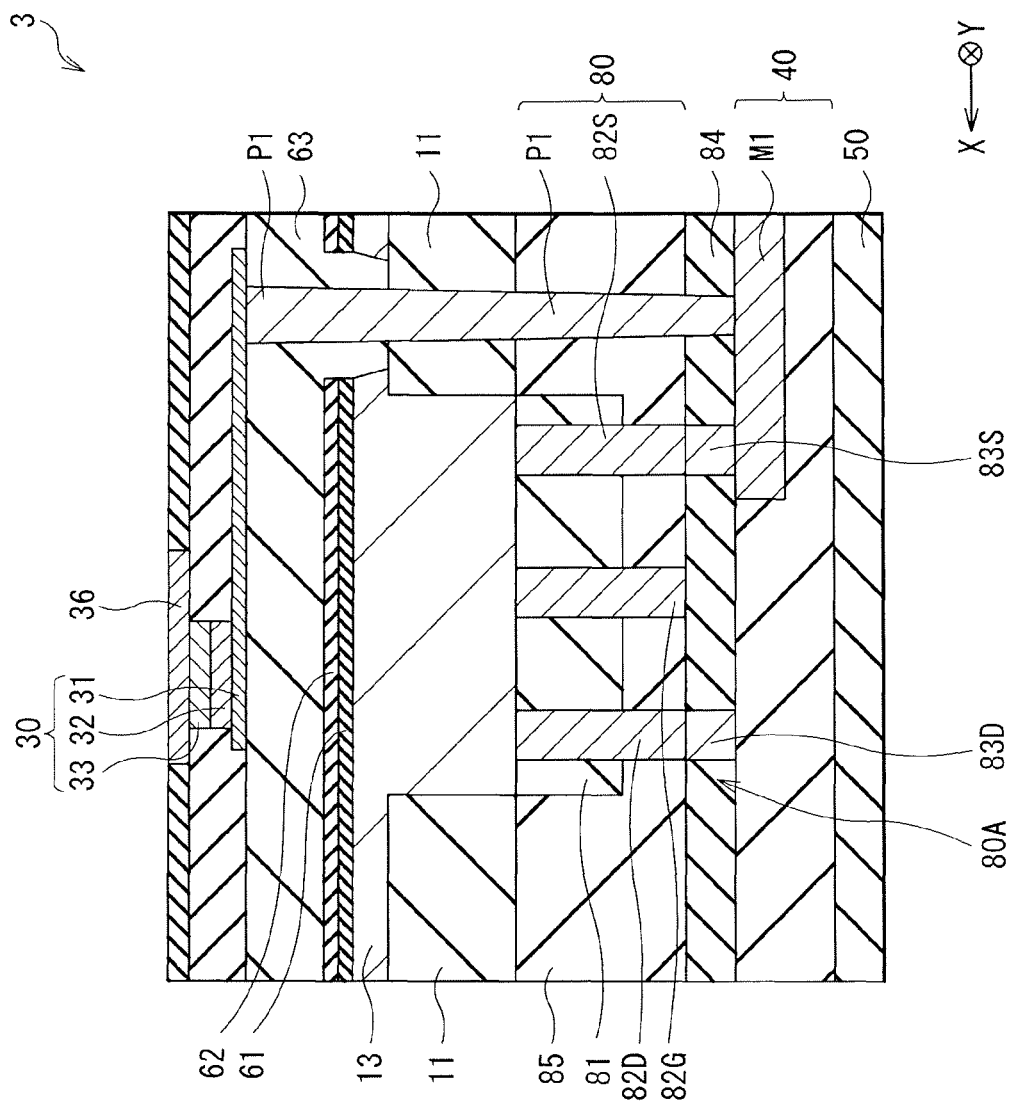
FIG. 11A is a sectional view illustrating a configuration example of a semiconductor device according to a third embodiment of the present disclosure.
Figure 11B:
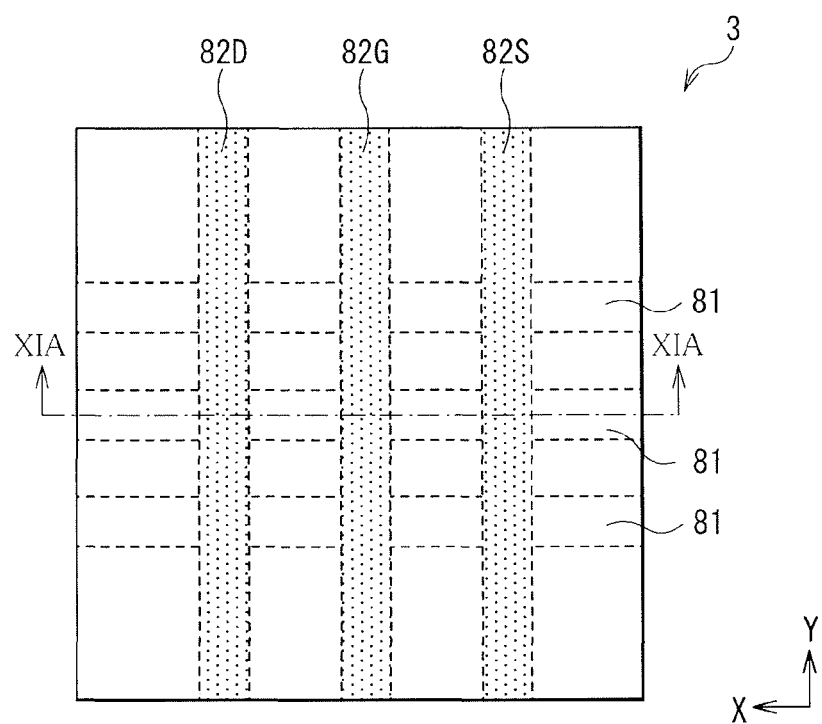
FIG. 11B is a plan view illustrating a configuration example of the semiconductor device illustrated in FIG. 11A.

FIG. 11A illustrates a sectional configuration of a semiconductor device 3 according to a third embodiment of the present disclosure. FIG. 11B illustrates a planar configuration of the semiconductor device 2. FIG. 11A corresponds to a sectional view taken along a line XIA-XIA in an arrow direction of FIG. 11B. The semiconductor device 3 has a configuration similar to the semiconductor device 1, except that a transistor 80A is included instead of the transistor 20. The transistor 80A may be embedded in an element formation layer 80 inserted between a semiconductor substrate 13 made of, for example, silicon and the multilayer wiring formation section 40 (refer to FIG. 11A). It is to be noted that, in FIG. 11A, the tap region R3 is not illustrated, and a specific configuration of the multilayer wiring formation section 40 is also illustrated in a simplified manner. Moreover, in the following description, like components are denoted by like numerals as of the semiconductor device 1 according to the above-described first embodiment.

The element formation layer 80 includes a first layer in which connection layers 83S and 83D are embedded in an insulating layer 84 and a second layer in which the transistor 80A is embedded in an insulating layer 85 (refer to FIG. 11A). The transistor 80A is a transistor for selection of the storage element 30, and may be a fin-field effect transistor (Fin-FET) including a fin 81 made of Si (silicon), a gate wiring line 82G, a source wiring line 82S, and a drain wiring line 82D. Compared to a planar transistor on a bulk substrate, short channel characteristics are allowed to be suppressed with use of the Fin-FET. The gate wiring line 82G also serves as the word line WL of the storage element 30.

The fin 81 has a flat shape, and a plurality of fins 81 may be arranged upright on the semiconductor substrate 13 made of silicon. The plurality of fins 81 may extend in, for example, an X direction, and may be arranged side by side in a Y-axis direction. The gate wiring line 82G, the source wiring line 82S, and the drain wiring line 82D so extend as to stride across the fins 81 in a Y direction intersecting with the extending direction of the fins 81. Surfaces other than back surfaces, i.e., surfaces in contact with the semiconductor substrate 31 of the fins 81 are covered with the gate wiring line 82G, the source wiring line 82S, and the drain wiring line 82D. In this case, for example, the source wiring line 82S is connected to the bottom end of the contact plug P1 through the connection layer 83S and the metal layer M1.

[Functions and Effect of Semiconductor Device 3]

Even in such a semiconductor device 3, effects similar to those in the semiconductor device 1 according to the above-described first embodiment are allowed to be expected. Moreover, even in the semiconductor device 3, a potential of the semiconductor substrate 13 is allowed to be arbitrarily set; therefore, as with the semiconductor device 1 according to the above-described first embodiment, the potential of the semiconductor substrate 13 is allowed to be fixed arbitrarily, or the substrate bias effect is allowed to be used.

Moreover, in this embodiment, the transistor 80A that are a Fin-FET with high current drive capability is mounted, and is used as a transistor for selection of the storage element 30; therefore, high-speed reading and writing are made possible.

Modification Example 4

Figure 12A:
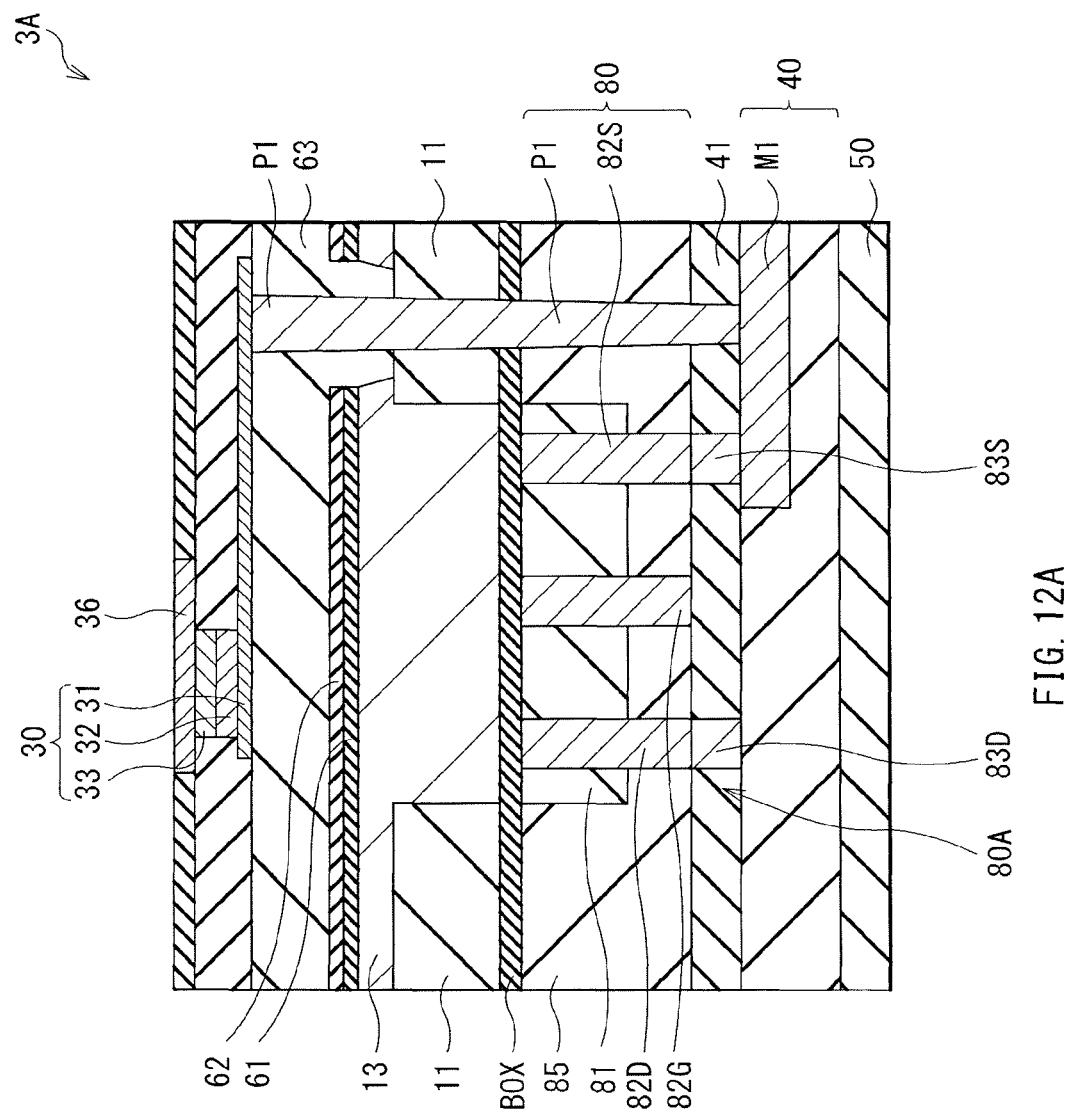
FIG. 12A is a sectional view illustrating a modification example of the semiconductor device according to the third embodiment of the present disclosure.

FIG. 12A illustrates a sectional configuration of a semiconductor device 3A according to a modification example of the above-described semiconductor device 3. The semiconductor device 3A differs from the semiconductor device 3 in that the buried oxide film BOX is provided to a front surface of the semiconductor substrate 13. In other words, back surfaces of the fins 81, the gate wiring line 82G, the source wiring line 82S, and the drain wiring line 82D are in contact with the buried oxide film BOX.

Thus, the semiconductor device 3A includes the semiconductor substrate 13 with a SOI structure, and is allowed to be expected to have superior operation speed while power consumption is low.

Modification Example 5

Figure 12B:
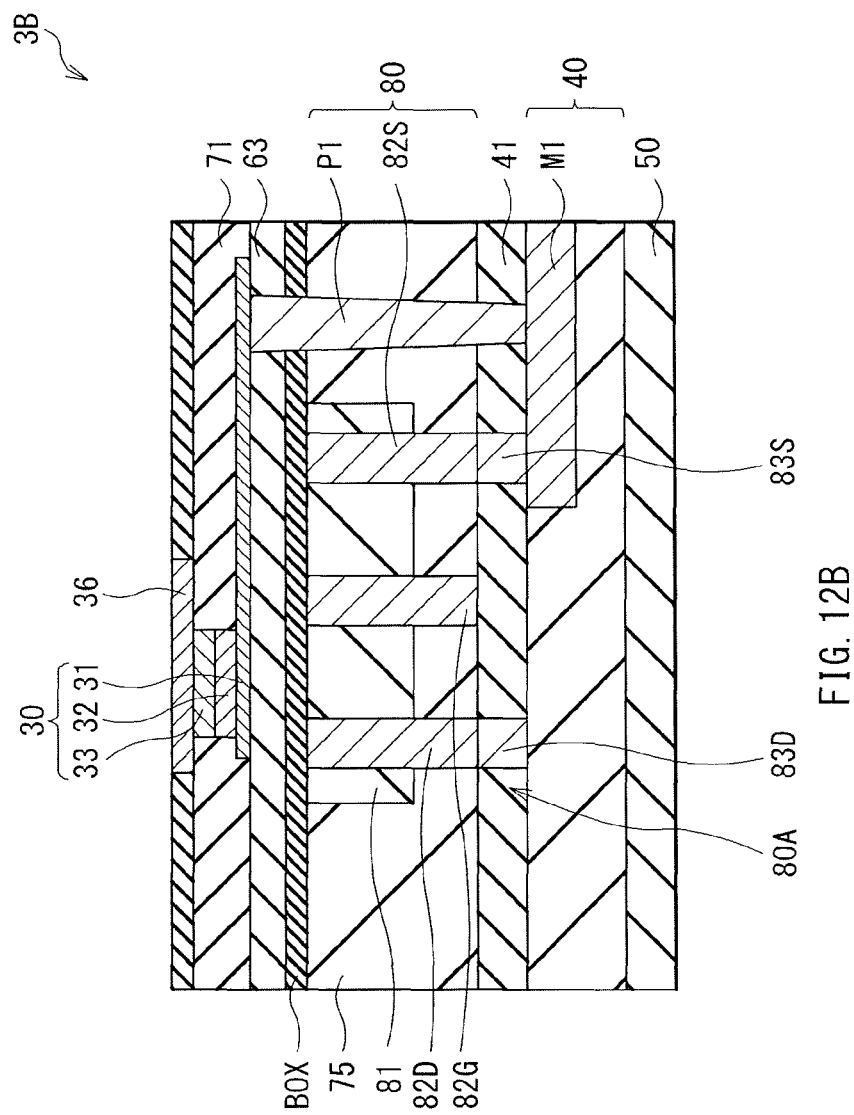
FIG. 12B is a sectional view illustrating another modification example of the semiconductor device according to the third embodiment of the present disclosure.

FIG. 12B illustrates a sectional configuration of a semiconductor device 3B according to another modification example of the above-described semiconductor device 3. The semiconductor device 3B differs from the semiconductor device 3 in that the semiconductor substrate 13 is not included, and the buried oxide film BOX and the insulating film 63 are laminated in order on the element formation layer 80 in which the transistor 80A is formed. In this case, the contact plug P1 passes through a region other than a region where the transistor 80A is formed of the element formation layer 80. Even in such a semiconductor device 3B, while flexibility in design is secured, a larger number of transistors 80A are allowed to be arranged in a narrower region, and higher integration is allowed to be achieved.

Fourth Embodiment

Figure 13:
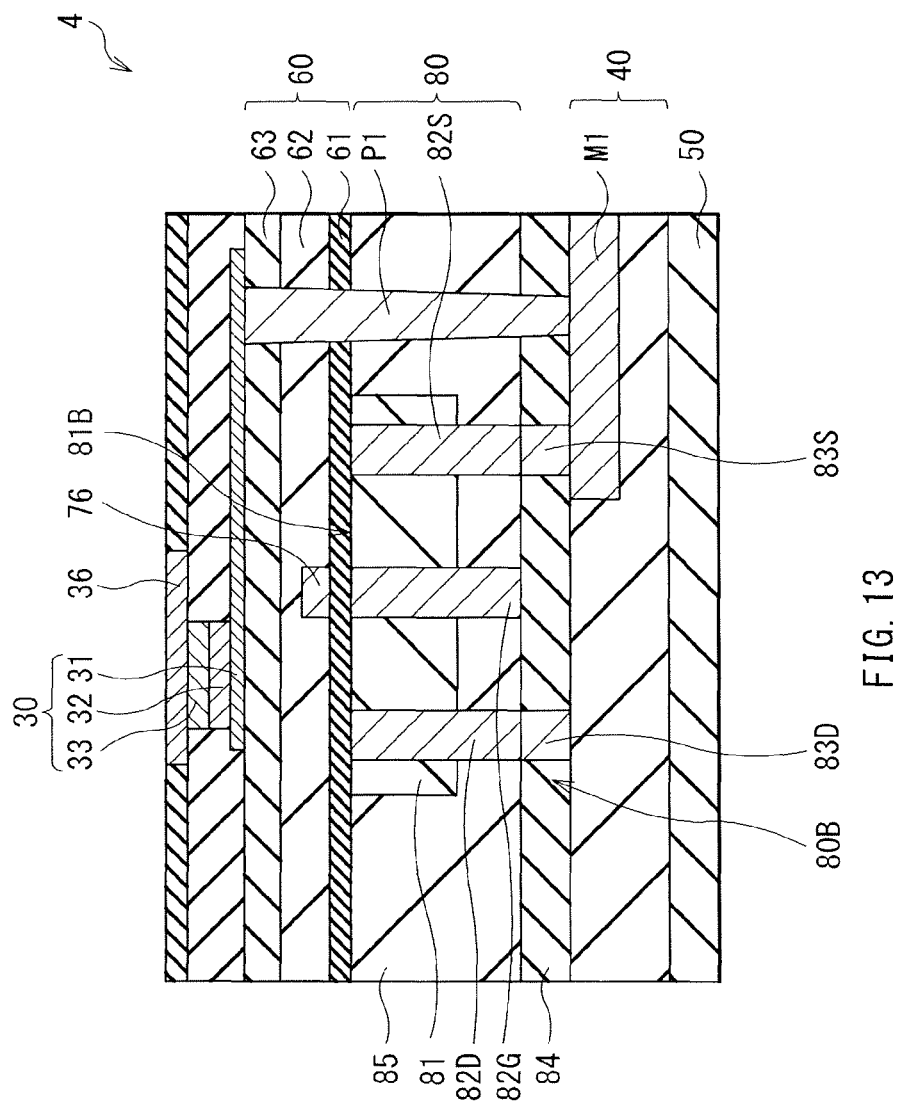
FIG. 13 is a sectional view illustrating a configuration example of a semiconductor device according to a fourth embodiment of the present disclosure.

FIG. 13 illustrates a sectional configuration of a semiconductor device 4 according to a fourth embodiment of the present disclosure. The semiconductor device 4 differs from the semiconductor device 3B according to Modification Example 5 of the above-described third embodiment in that a transistor 80B that is a nanowire FET is included. More specifically, instead of the buried oxide film BOX in the semiconductor device 3B, in the semiconductor device 4, the insulating film 61 and the insulating film 62 are so laminated as to cover a back surface 81B of the fin 81. Moreover, a fourth gate electrode 76 is so provided as to face the back surface 81B of the fin 81 with the insulating film 61 in between. The fourth gate electrode 76 is covered with the insulating film 62. The semiconductor device 4 has a configuration similar to that of the semiconductor device 3B in other points.

Even in such a semiconductor device 4, while flexibility in design is secured, a larger number of transistors 80B are allowed to be arranged in a narrower region, and higher integration is allowed to be achieved.

Fifth Embodiment

[Configuration of Semiconductor Device 5]

Figure 14:
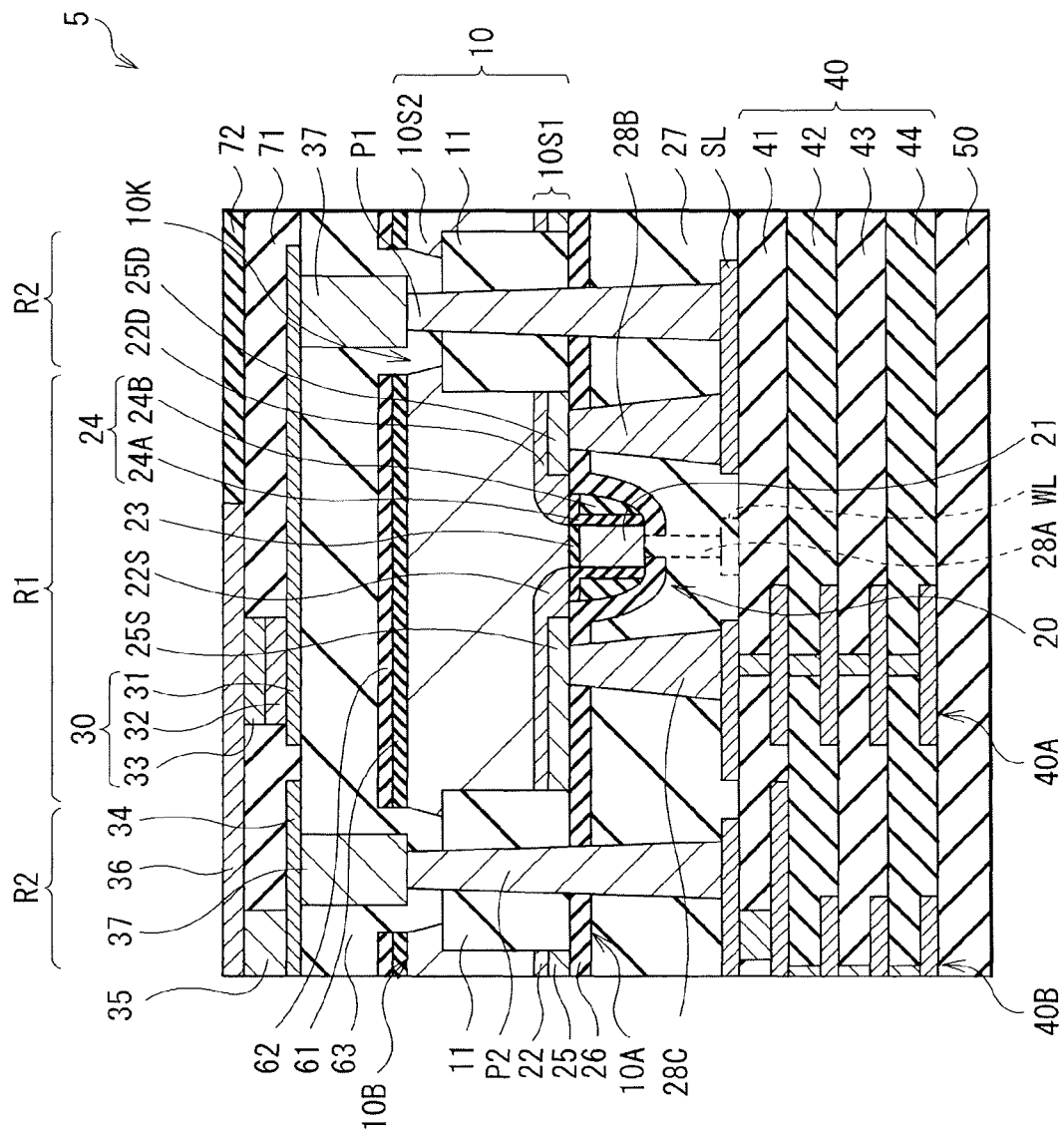
FIG. 14 is a sectional view illustrating a configuration example of a semiconductor device according to a fifth embodiment of the present disclosure.

FIG. 14 illustrates a sectional configuration of a semiconductor device 5 according to a fifth embodiment of the present disclosure. In the semiconductor device 5, occupancy areas of the contact plugs P1 and P2 decrease from the principal surface 10A toward the back surface 10B (i.e., from the bottom end toward the top end). The semiconductor device 5 has a configuration similar to that of the semiconductor device 1B according to the modification example of the above-described first embodiment, except for this point. Therefore, in the following description, like components are denoted by like numerals as of the semiconductor device 1B. It is to be noted that the tap region R3 is not illustrated in FIG. 14.

[Method of Manufacturing Semiconductor Device 5]

To manufacture the semiconductor device 5, the through holes K1 and K2 where the contact plugs P1 and P2 are embedded are formed from the principal surface 10A of the semiconductor substrate 10. FIGS. 15A to 15H illustrate a part of a method of manufacturing the semiconductor device 5 in process order.

Figure 15A:
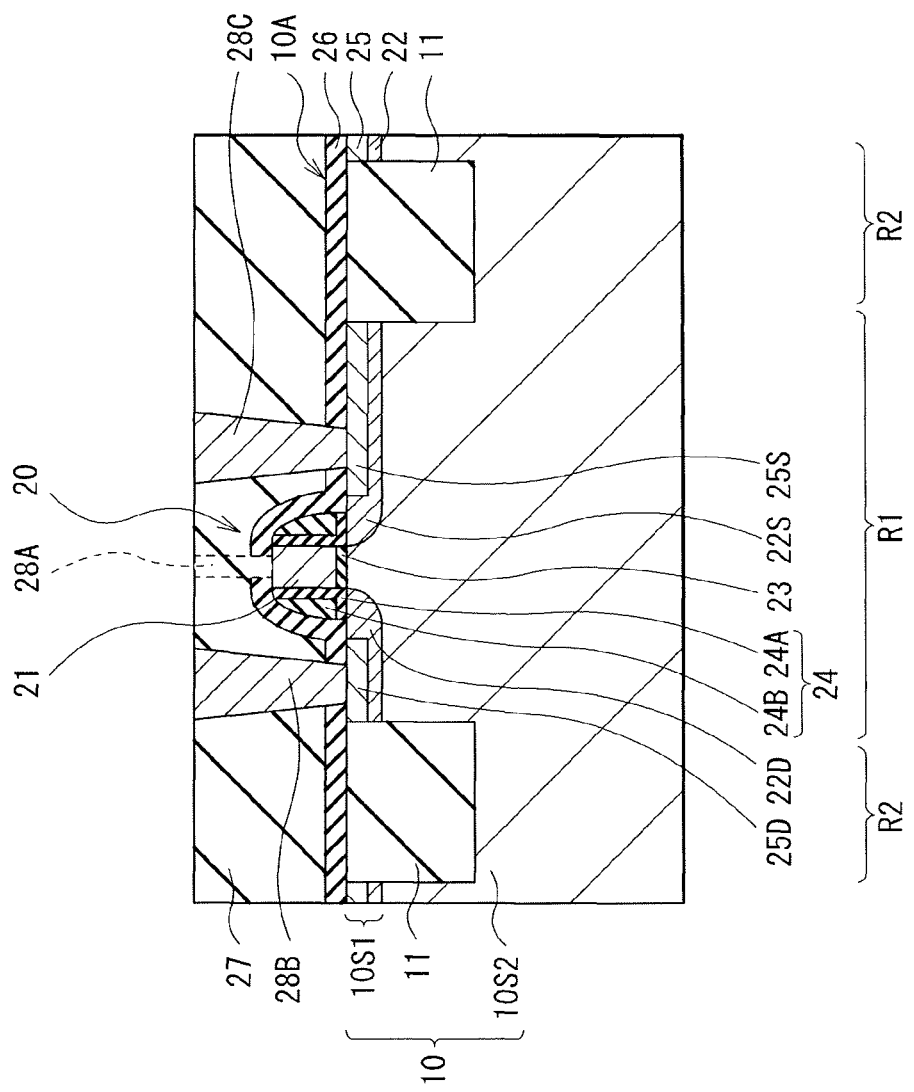
FIG. 15A is a sectional view illustrating a process in a method of manufacturing the semiconductor device illustrated in FIG. 14.
Figure 15B:
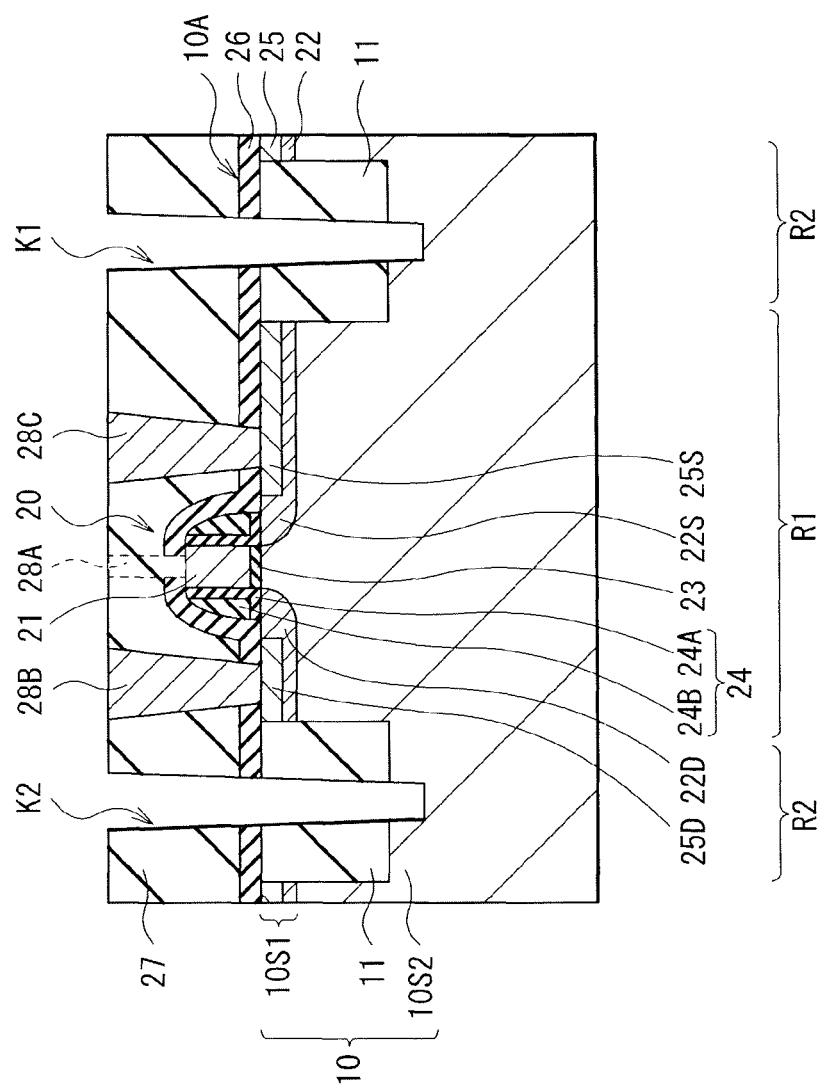
FIG. 15B is a sectional view illustrating a process following FIG. 15A.

First, the semiconductor substrate 10 is prepared, and an LSI is formed on the principal surface 10A of the semiconductor substrate 10 by a typical manufacturing process. More specifically, as illustrated in FIG. 15A, after the element isolation layer 11 is formed on the principal surface 10A side of the semiconductor substrate 10, the transistor 20 including the gate electrode 21 and the pair of diffusion layers 22 is formed in the element region R1. Respective silicide regions 25 are formed in parts of the respective diffusion layers 22.

Next, after the interlayer insulating films 26 and 27 with which the transistor 20 is covered are formed, connection layers 28A to 28C that pass through the interlayer insulating films 26 and 27 are formed. Moreover, the through holes K1 and K2 that reach the semiconductor layer 10S2 are formed by selectively digging the interlayer insulating films 26 and 27 and the element isolation layer 11 that occupy the isolation region R2 (refer to FIG. 15B). In other words, the through holes K1 and K2 are obtained by digging and passing though the element isolation layer 11 from the principal surface 10A.

Figure 15C:
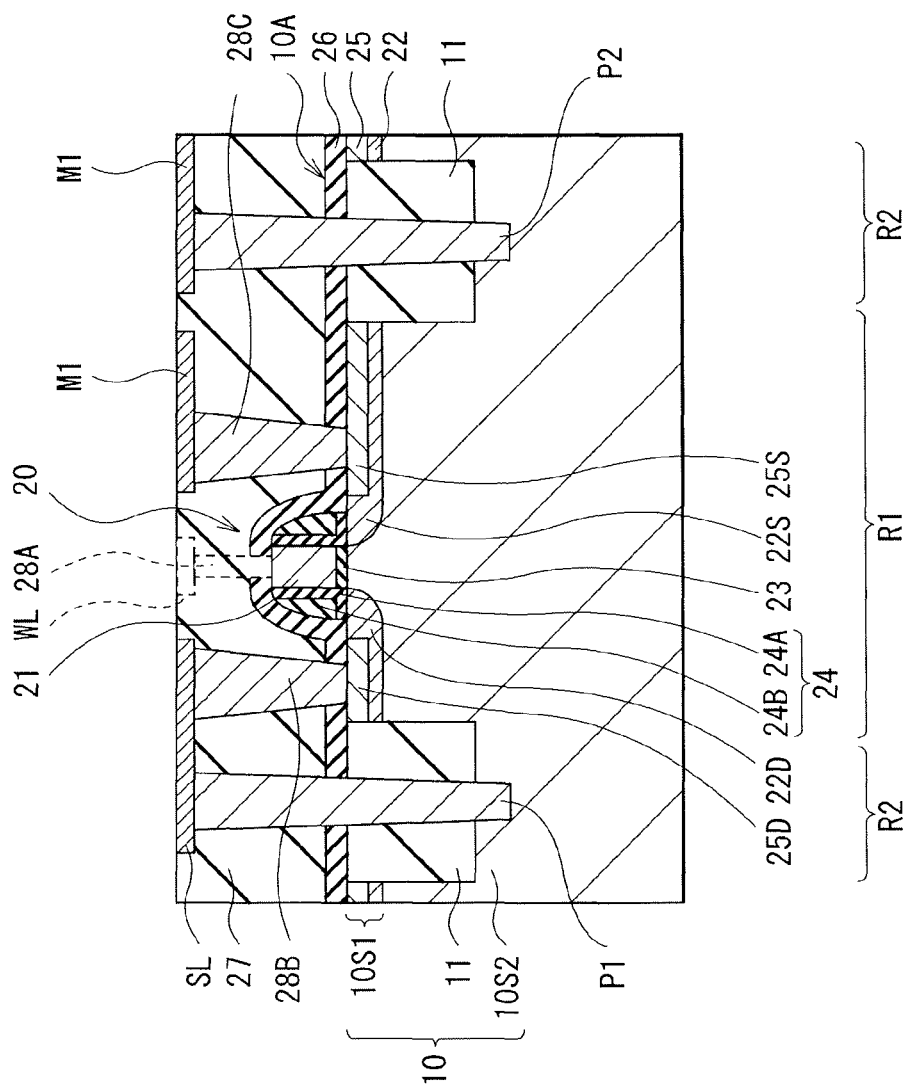
FIG. 15C is a sectional view illustrating a process following FIG. 15B.
Figure 15D:
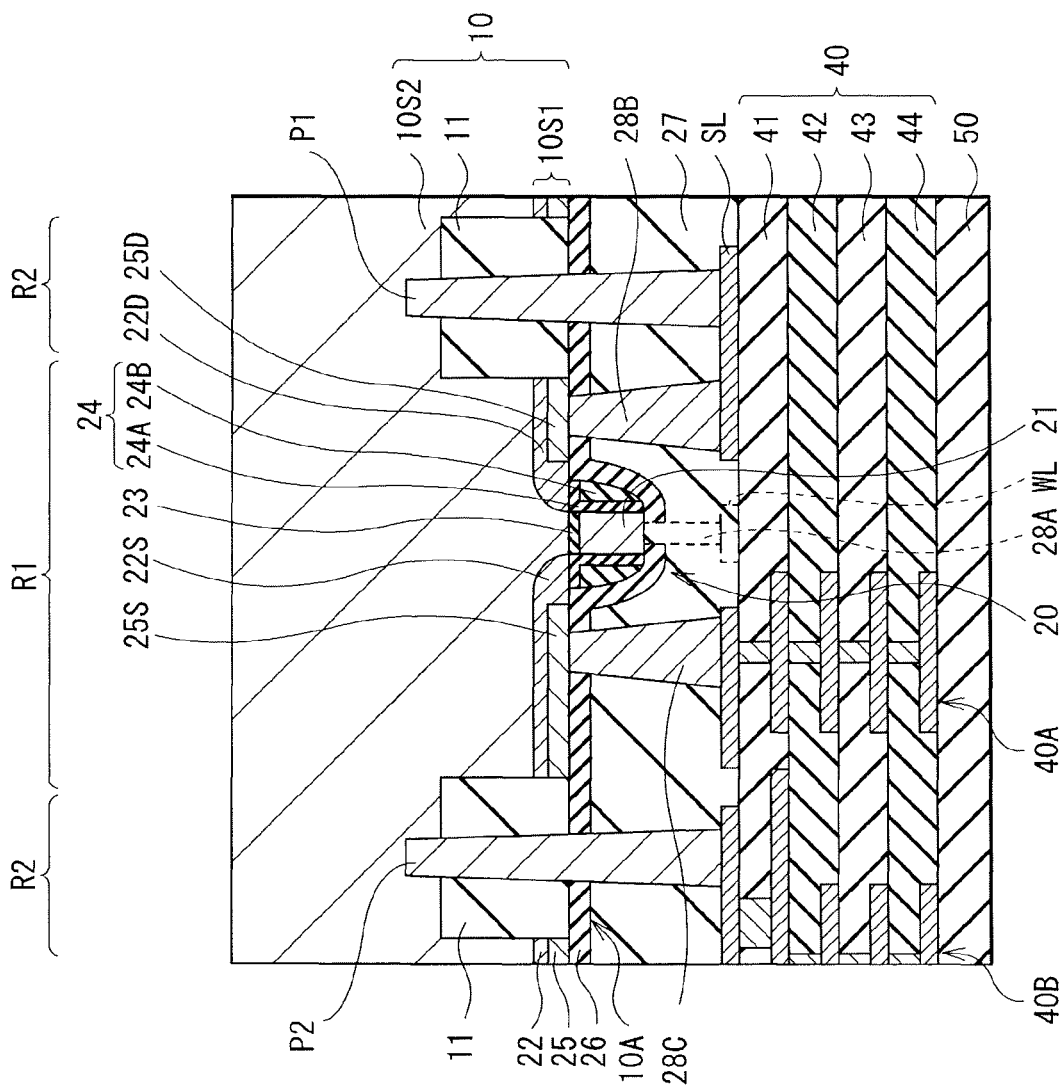
FIG. 15D is a sectional view illustrating a process following FIG. 15C.

After the contact plugs P1 and P2 are formed by filling the through holes K1 and K2 with a predetermined material, the word line WL, the select line SL, and the metal layer M1 are so formed as to cover the contact plugs P1 and P2 and the connection layers 28A, 28B, and 28C (refer to FIG. 15C). Moreover, the multilayer wiring formation section 40 is formed on the interlayer insulating film 27, and is bonded to the supporting substrate 50 (refer to FIG. 15D).

Figure 15E:
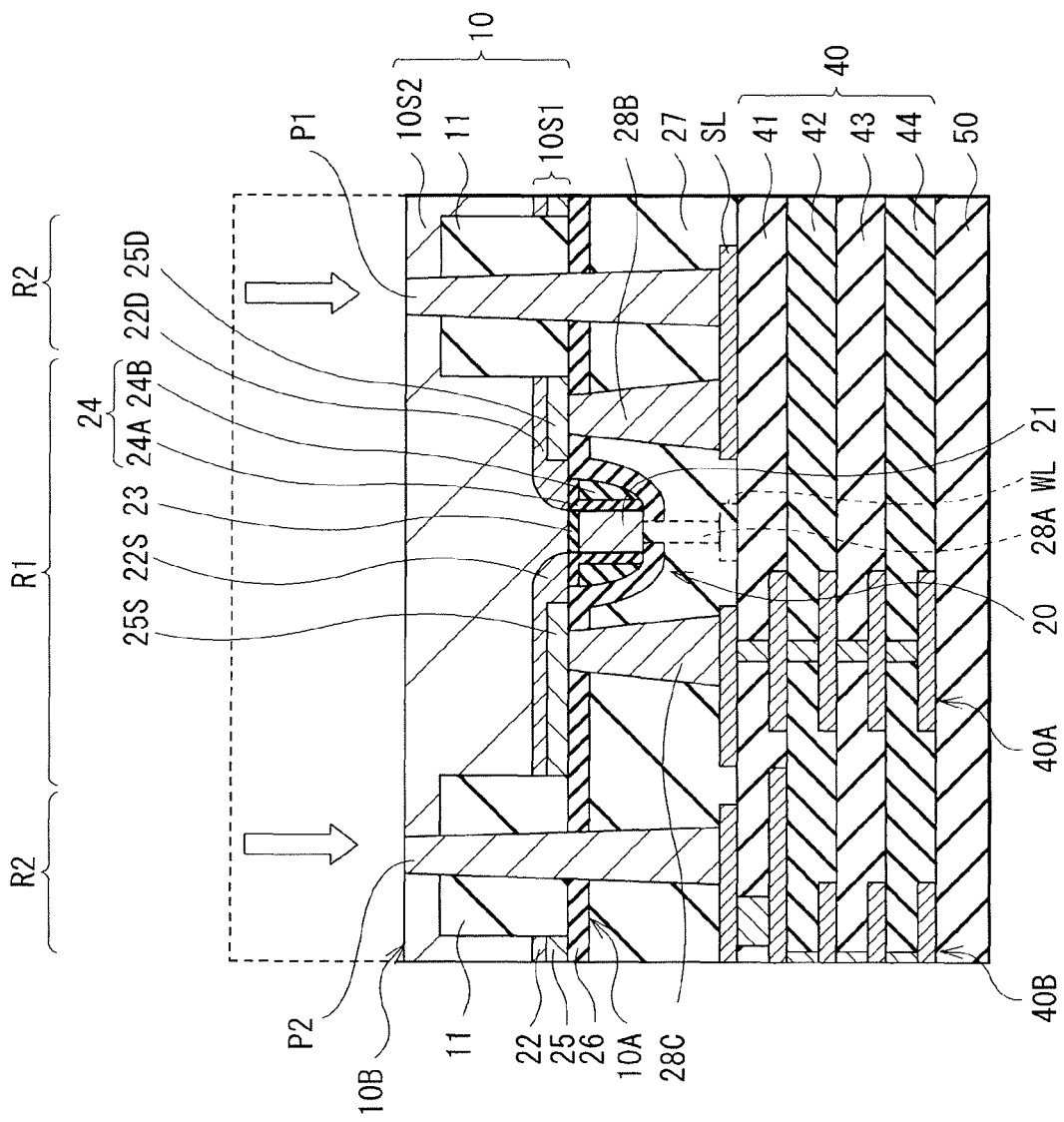
FIG. 15E is a sectional view illustrating a process following FIG. 15D.

Next, as illustrated in FIG. 15E, the semiconductor layer 10S2 is polished by a CMP method or the like, and polishing stops before reaching the element isolation layer 11. Accordingly, the back surface 10B is formed.

Figure 15F:
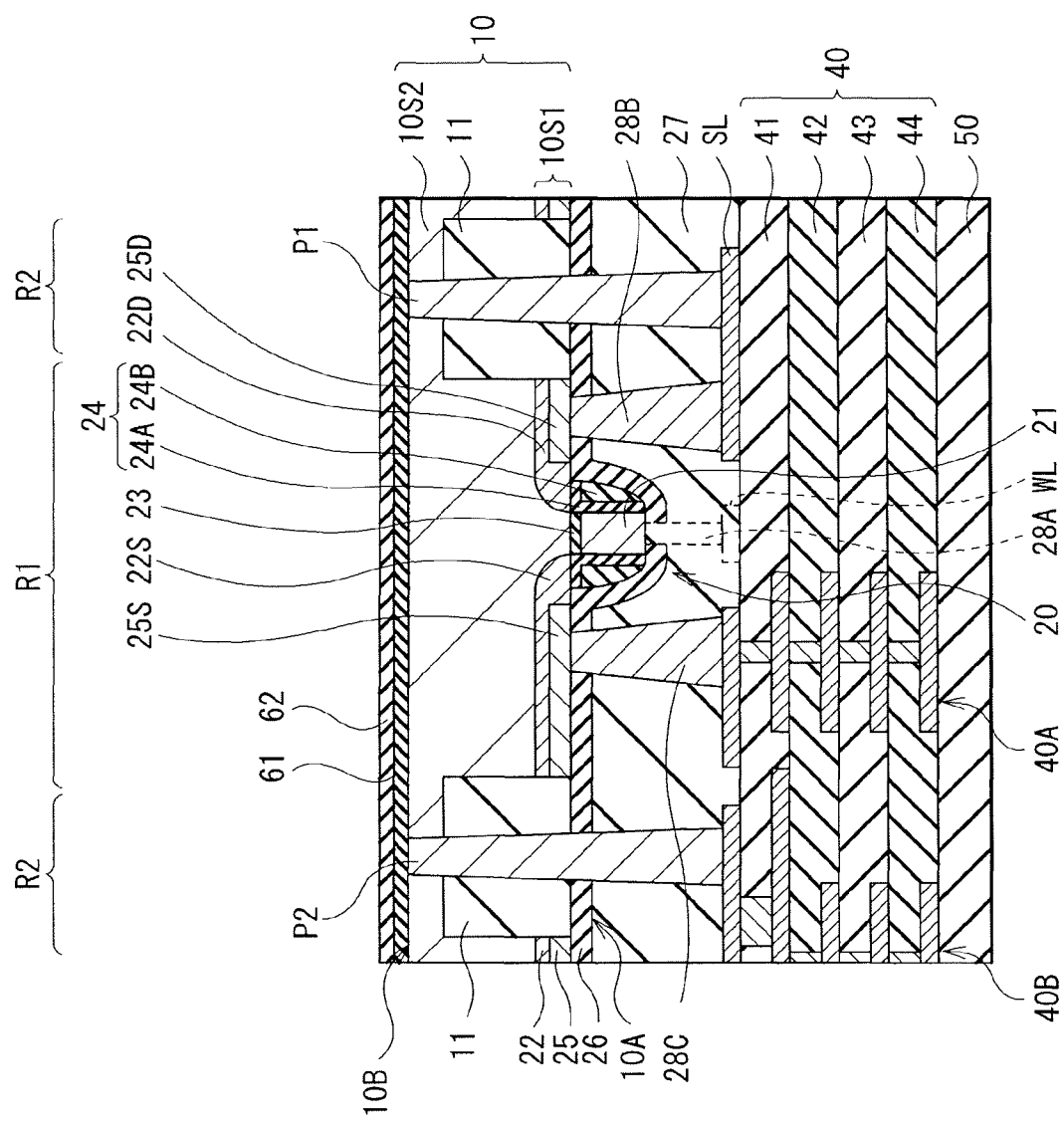
FIG. 15F is a sectional view illustrating a process following FIG. 15E.

After that, the insulating film 61 and the insulating film 62 are so formed in order by, for example, CVD as to cover the back surface 10B of the semiconductor substrate 10 (refer to FIG. 15F).

Figure 15G:
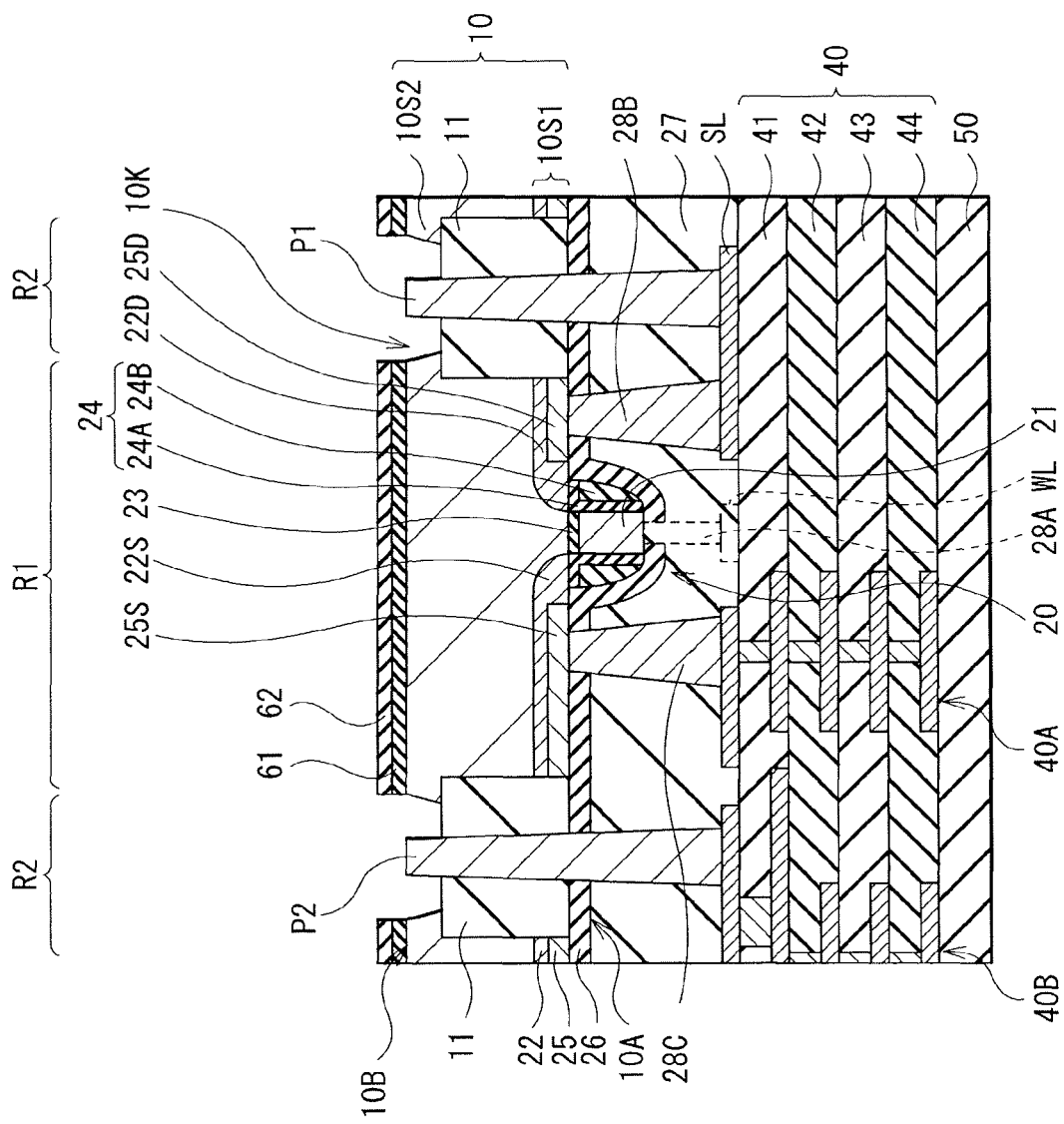
FIG. 15G is a sectional view illustrating a process following FIG. 15F.
Figure 15H:
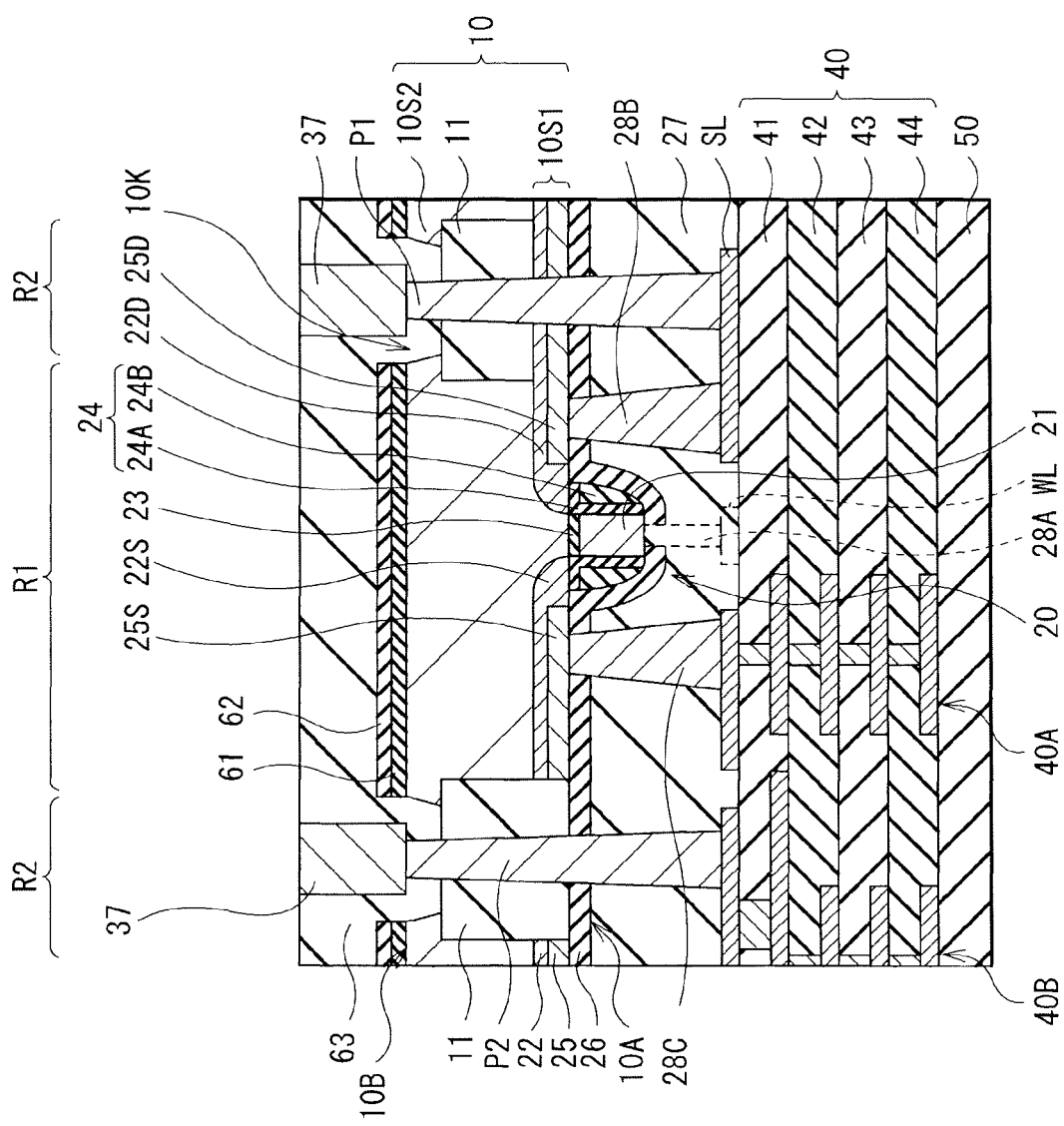
FIG. 15H is a sectional view illustrating a process following FIG. 15G.

Next, as illustrated in FIG. 15G, the opening 10K is formed by selectively etching parts of portions occupying the isolation region R2 of the insulating film 61 and the insulating film 62. After that, as illustrated in FIG. 15H, the insulating film 63 is so formed as to cover the semiconductor substrate 10 covered with the insulating film 61 and the insulating film 62 and as to fill the opening 10K, and a top surface of the insulating film 63 is planarized by a CMP method or the like. Moreover, portions with which the contact plugs P1 and P2 are covered of the insulating film 63 with which the opening 10K is filled are removed to expose the top ends of the contact plugs P1 and P2, and then the low-resistance wiring layer 37 is so formed as to cover the top ends of the contact plugs P1 and P2.

Finally, the semiconductor device 5 is completed by formation of the storage element 30, and the like.

Even in such a semiconductor device 5, while reliability in design is secured, a larger number of transistors 20 are allowed to be arranged in a narrower region, and higher integration is allowed to be achieved. Further, since the through holes K1 and K2 are formed from the principal surface 10A of the semiconductor substrate 10, a load in manufacturing processes on the back surface of the semiconductor substrate 10 is allowed to be reduced.

Sixth Embodiment

[Configuration of Semiconductor Device 6]

Figure 16:
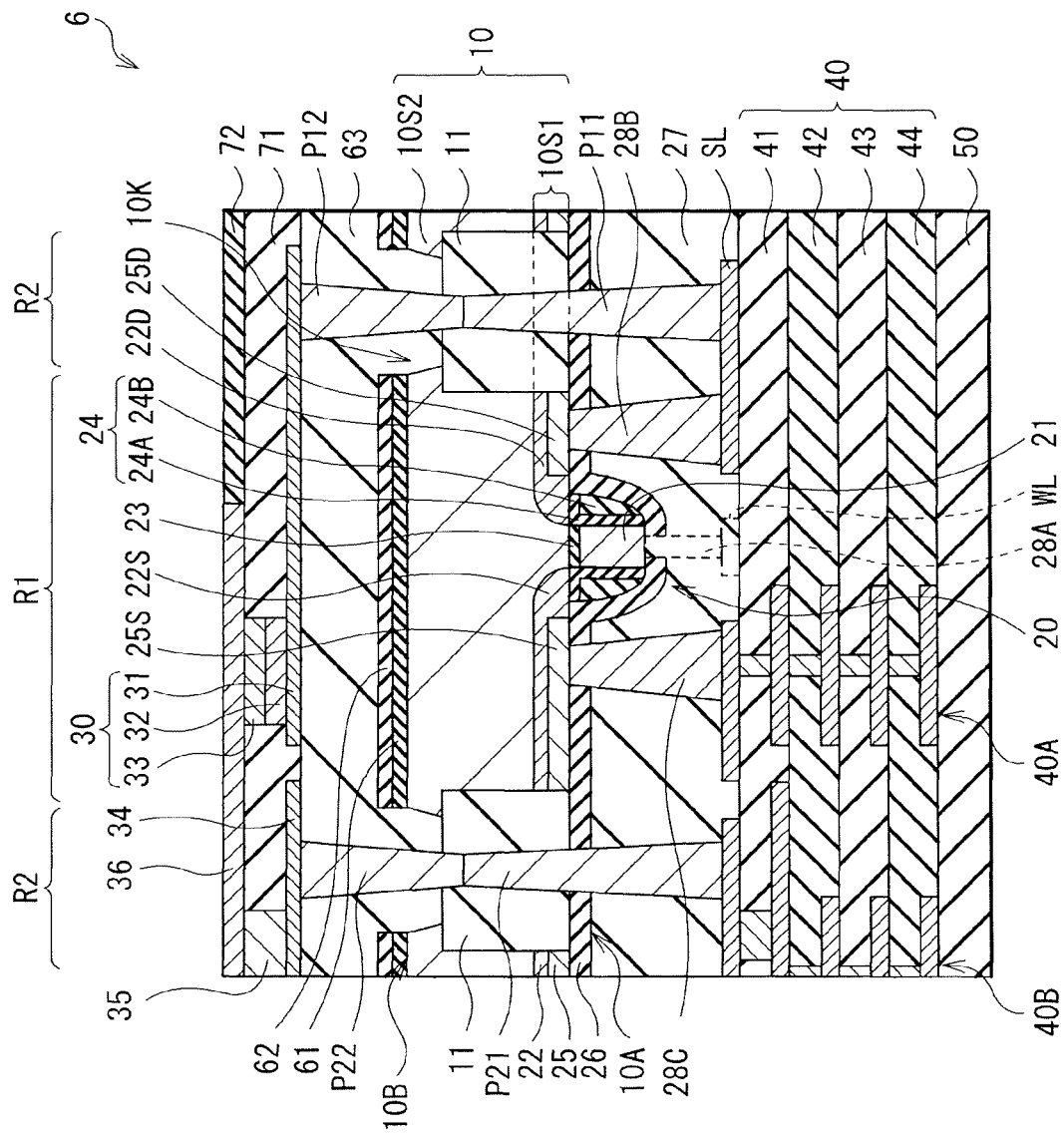
FIG. 16 is a sectional view illustrating a configuration example of a semiconductor device according to a sixth embodiment of the present disclosure.

FIG. 16 illustrates a sectional configuration of a semiconductor device 6 according to a sixth embodiment of the present disclosure. In this semiconductor device 6, the contact plug P1 is configured of two portions, i.e., a bottom portion P11 and a top portion P12. Likewise, the contact plug P2 is configured of a bottom portion P21 and a top portion P22. In this case, occupancy areas of the bottom portions P11 and P21 decrease in a direction from the principal surface 10A toward the back surface 10B (i.e., from a bottom end toward a top end). On the other hand, occupancy areas of the top portions P12 and P22 increase from a bottom end toward a top end. The semiconductor device 6 has a configuration similar to that of the semiconductor device 1 according to the above-described first embodiment, except for these points. Therefore, in the following description, like components are denoted by like numerals as of the semiconductor device 1. It is to be noted that the tap region R3 is not illustrated in FIG. 16.

[Method of Manufacturing Semiconductor Device 6]

To manufacture the semiconductor device 6, through holes K11 and K21 in which the bottom portions P11 and P21 of the contact plugs P1 and P2 are embedded are formed from the principal surface 10A of the semiconductor substrate 10. FIGS. 17A to 17H illustrate a part of a method of manufacturing the semiconductor device 6 in process order.

Figure 17A:
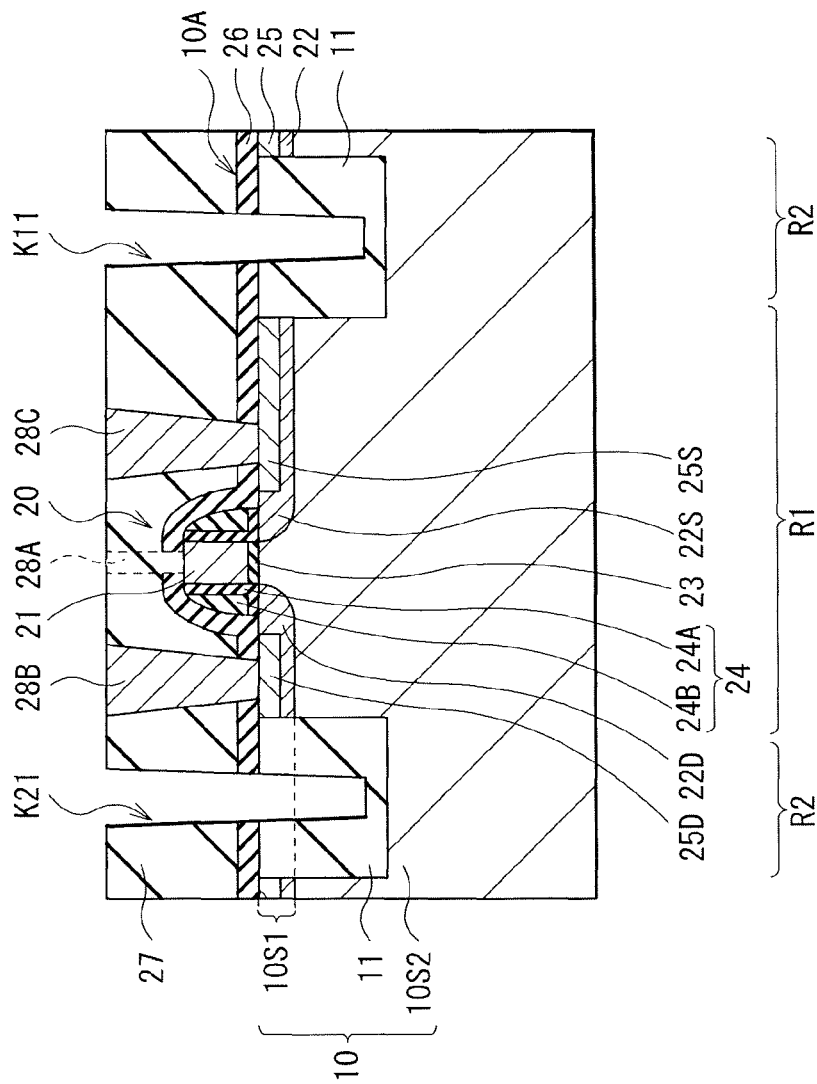
FIG. 17A is a sectional view illustrating a process in a method of manufacturing the semiconductor device illustrated in FIG. 16.

First, the semiconductor substrate 10 is prepared, and an LSI is formed on the principal surface 10A of the semiconductor substrate 10 by a typical manufacturing process. More specifically, as illustrated in FIG. 17A, after the element isolation layer 11 is formed on the principal surface 10A side of the semiconductor substrate 10, the transistor 20 including the gate electrode 21 and the pair of diffusion layers 22 is formed in the element region R1. The respective silicide regions 25 are formed in parts of the respective diffusion layers 22. Next, after the interlayer insulating films 26 and 27 with which the transistor 20 is covered are formed, the connection layers 28A to 28C that pass through the interlayer insulating films 26 and 27 are formed. Moreover, the through holes K22 and K21 are formed by selectively digging the interlayer insulating films 26 and 27 and the element isolation layer 11 that occupy the isolation region R2. It is to be noted that the through holes K11 and K21 each have a bottom surface inside the element isolation layer 11. In other words, in this case, a part of the element isolation layer 11 remains by excavating the element isolation layer 11 from the principal surface 10A.

Figure 17B:
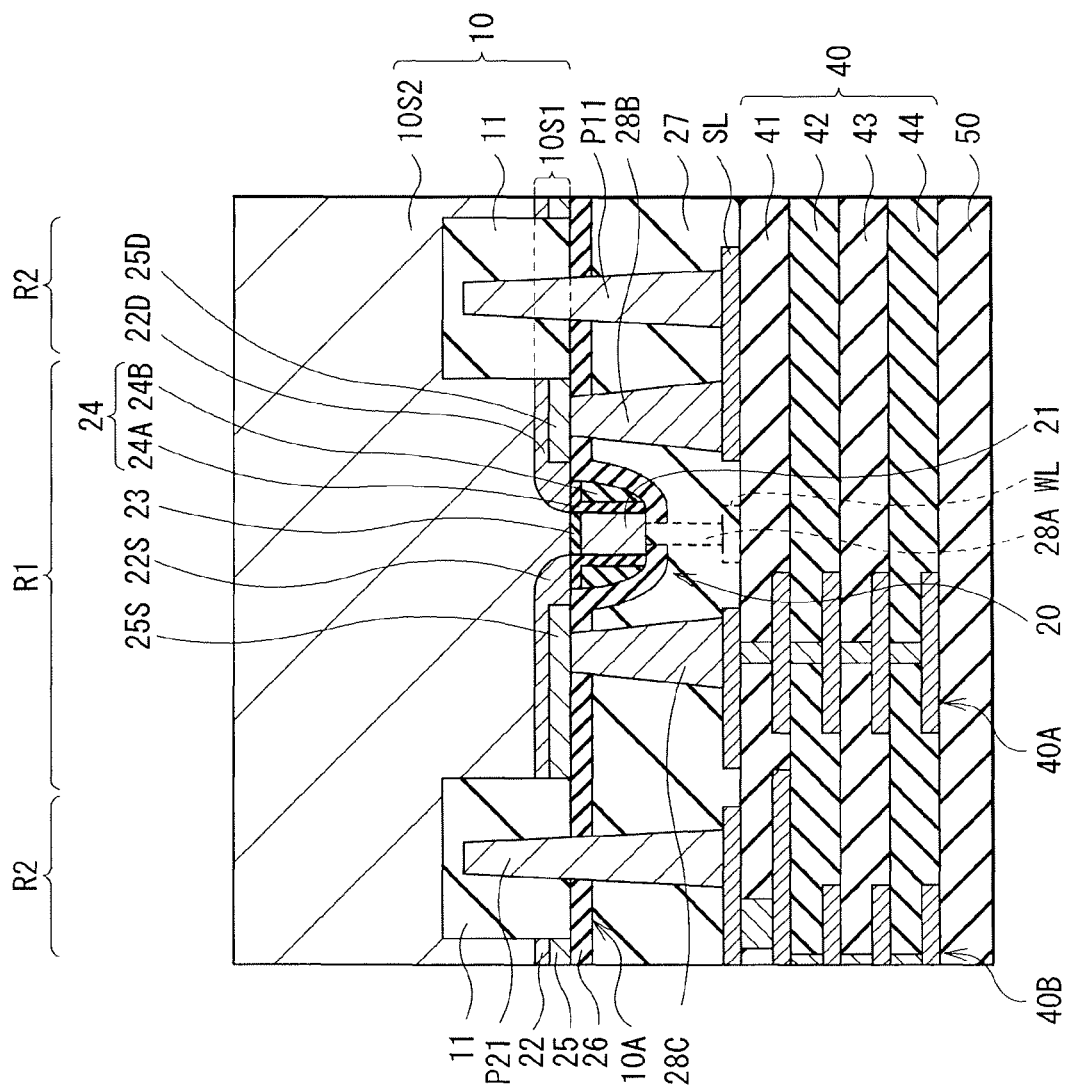
FIG. 17B is a sectional view illustrating a process following FIG. 17A.

After the bottom portions P11 and P21 are formed by filling the through holes K11 and K21 with a predetermined material, as illustrated in FIG. 17B, the word line WL, the select line SL, and the metal layer M1 are so formed as to cover the bottom portions P11 and P21 and the connection layers 28A, 28B, and 28C. Moreover, the multilayer wiring formation section 40 is formed on the interlayer insulating film 27, and is bonded to the supporting substrate 50.

Figure 17C:
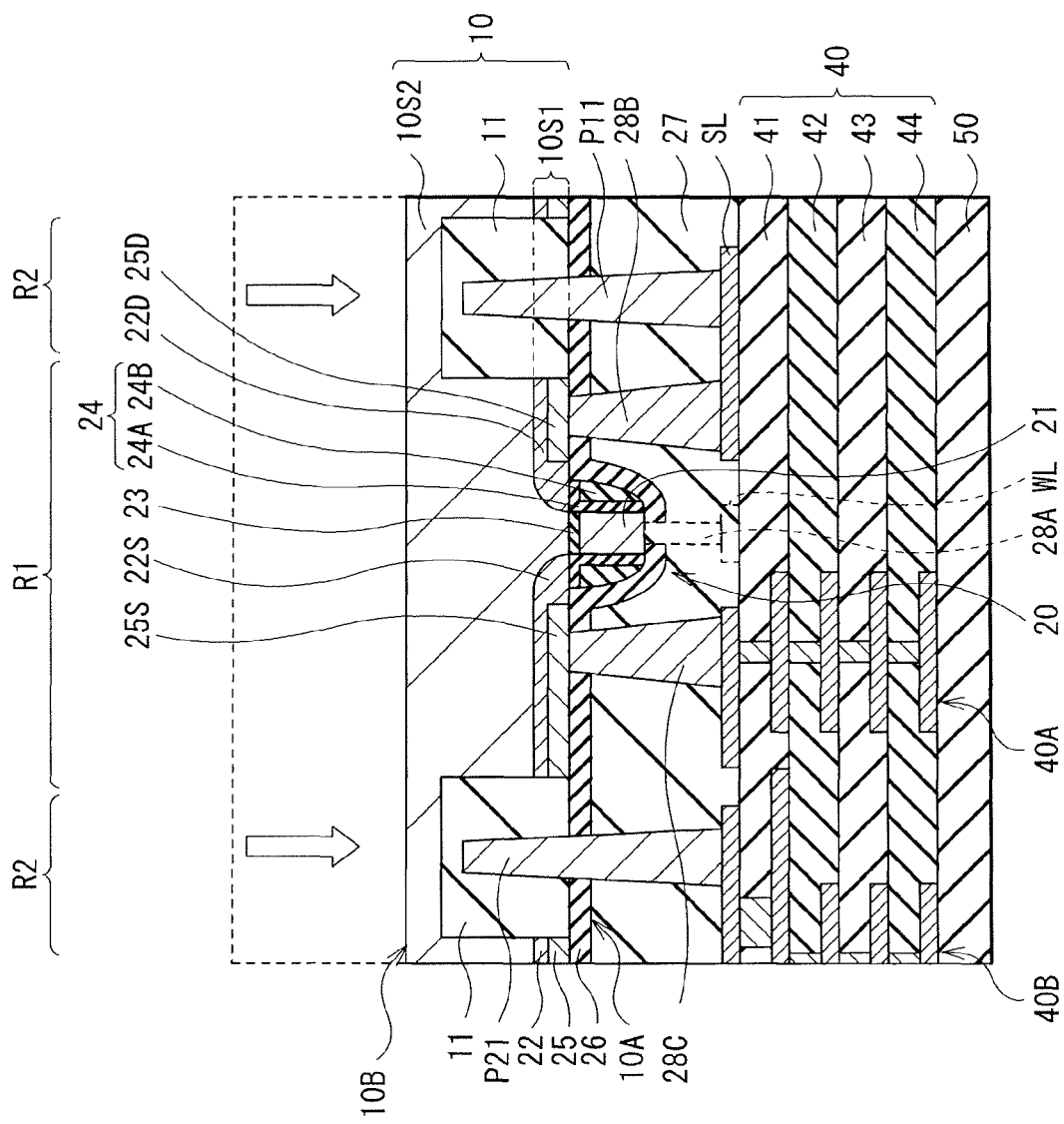
FIG. 17C is a sectional view illustrating a process following FIG. 17B.

Next, as illustrated in FIG. 17C, the semiconductor layer 10S2 is polished by a CMP method or the like, and polishing stops before reaching the element isolation layer 11. Thus, the back surface 10B is formed.

Figure 17D:
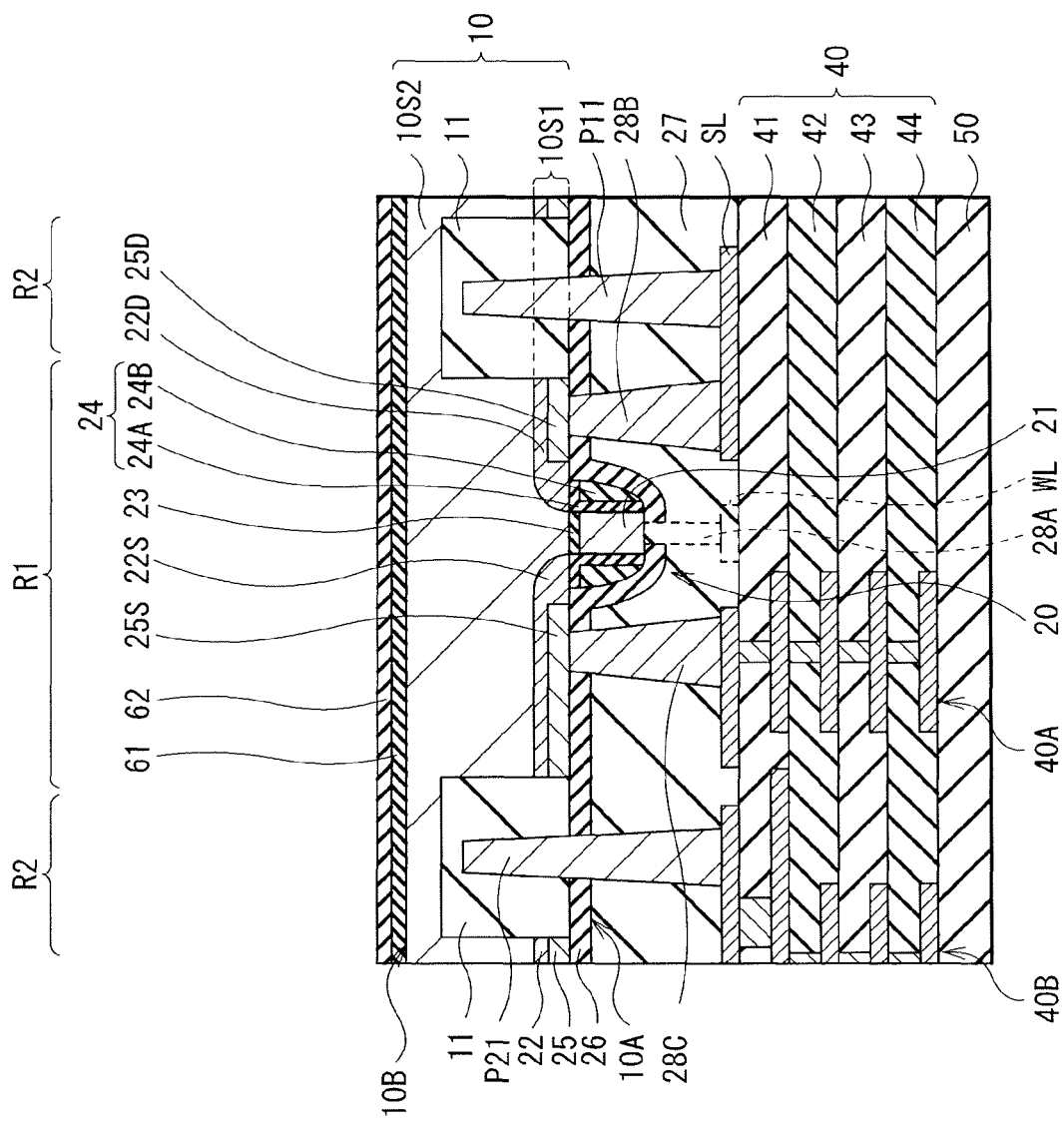
FIG. 17D is a sectional view illustrating a process following FIG. 17C.

After that, the insulating film 61 and the insulating film 62 are so formed in order by, for example, CVD as to cover the back surface 10B of the semiconductor substrate 10 (refer to FIG. 17D).

Figure 17E:
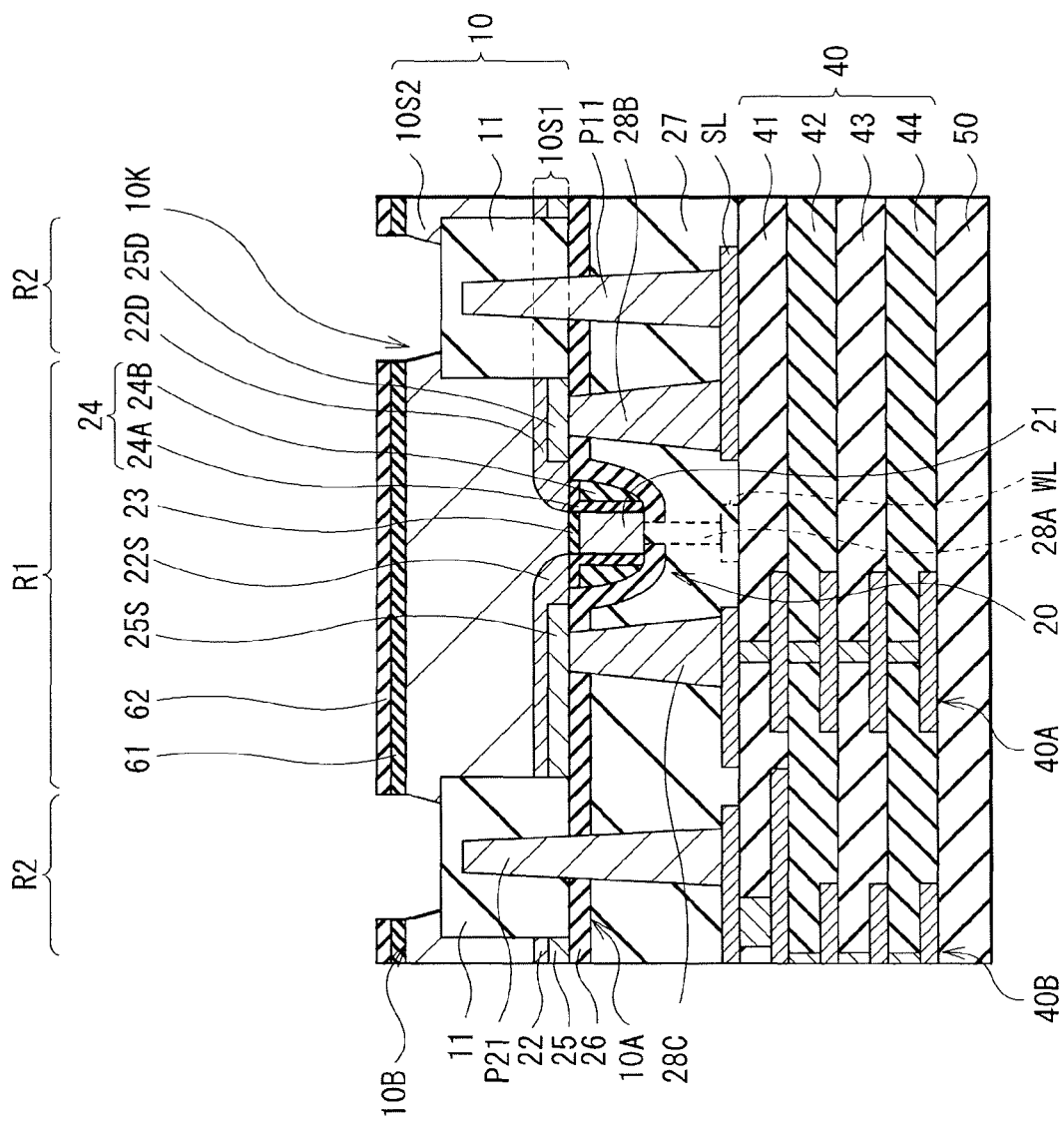
FIG. 17E is a sectional view illustrating a process following FIG. 17D.
Figure 17F:
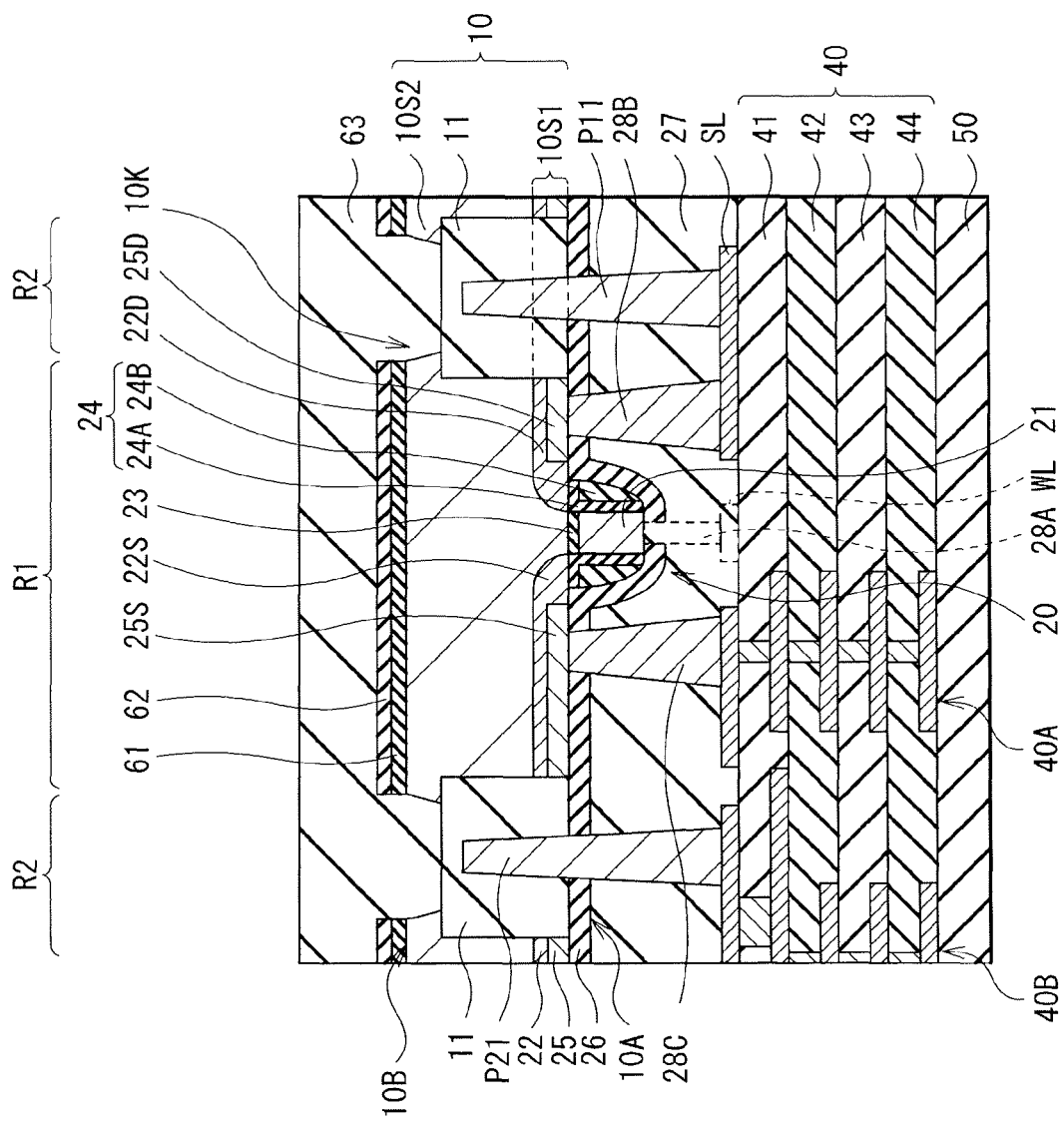
FIG. 17F is a sectional view illustrating a process following FIG. 17E.

Next, as illustrated in FIG. 17E, the opening 10K is formed by selectively etching parts of portions occupying the isolation region R2 of the insulating film 61 and the insulting film 62. After that, as illustrated in FIG. 17F, the insulating film 63 is so formed as to cover the semiconductor substrate 10 covered with the insulating film 61 and the insulating film 62 and as to fill the opening 10K, and the top surface of the insulating film 63 is planarized by a CMP method or the like.

Figure 17G:
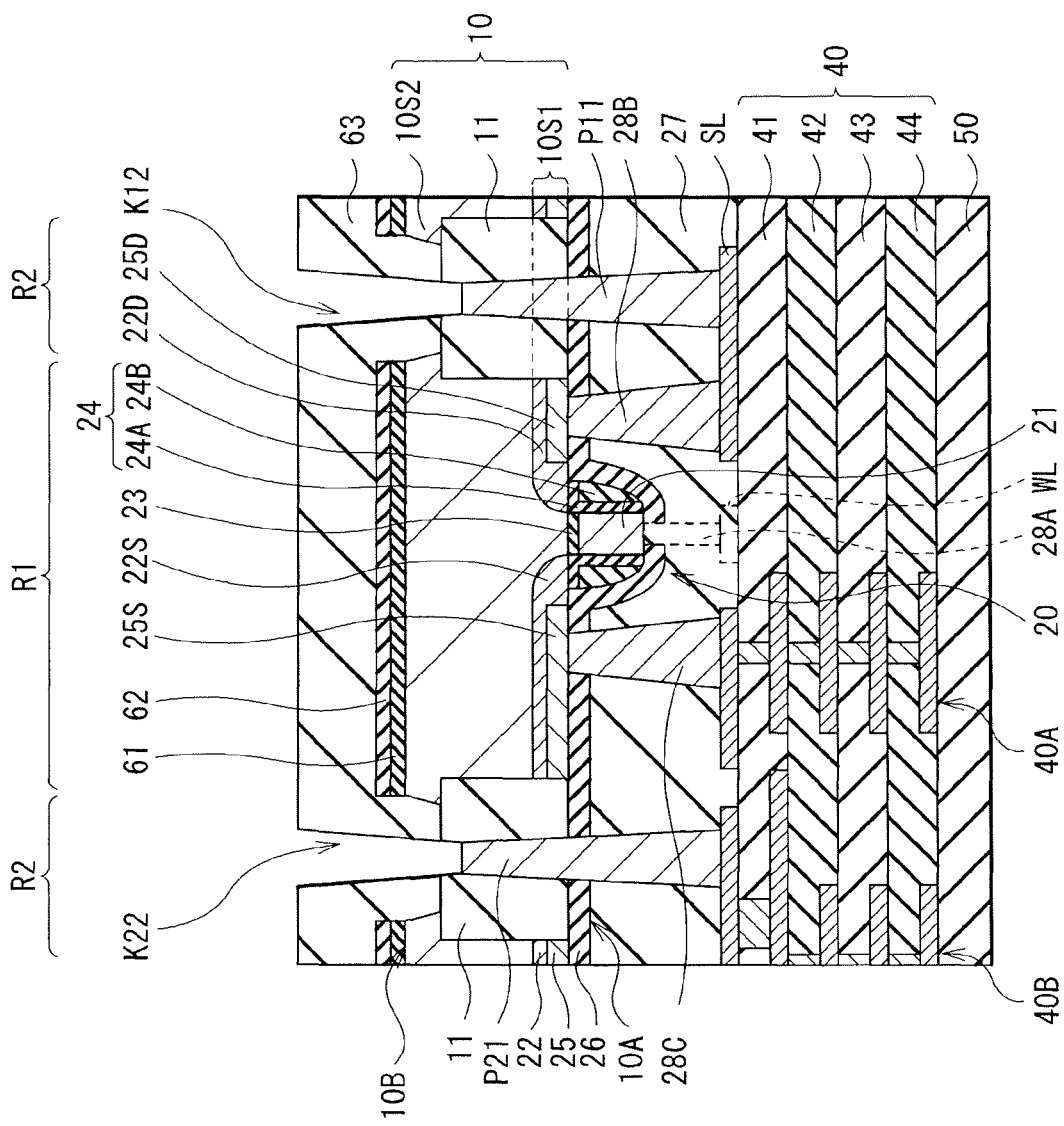
FIG. 17G is a sectional view illustrating a process following FIG. 17F.
Figure 17H:
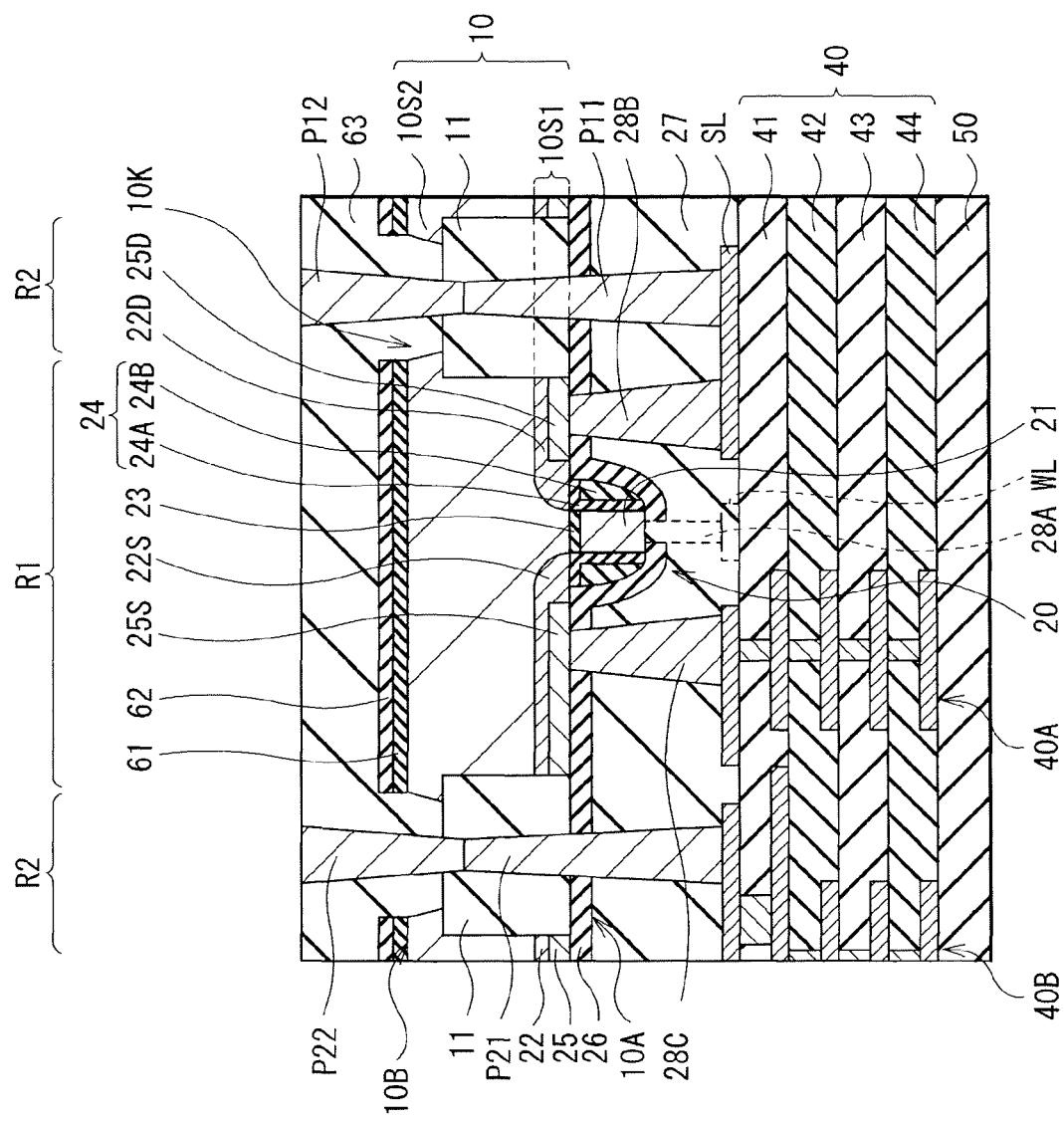
FIG. 17H is a sectional view illustrating a process following FIG. 17G.

Moreover, as illustrated in FIG. 17G, the through holes K12 and K22 reaching the bottom portions P11 and P21 that have been already formed are formed by selectively removing parts of the insulating film 63 and the element isolation layer 11 in the isolation region R2. In this case, the through holes K12 and K22 are obtained by excavating and removing, from the back surface 10B, the parts remaining when the through holes K11 and K21 are formed of the element isolation layer 11. Next, as illustrated in FIG. 17H, the top portions P12 and P22 are formed by filling the through holes K12 and K22 with a predetermined material. Thus, the contact plug P1 and P2 are obtained.

Finally, the semiconductor device 6 is completed by formation of the storage element 30, and the like.

Even in such a semiconductor device 6, while flexibility in design is secured, a larger number of transistors 20 are allowed to be arranged in a narrower region, and higher integration is allowed to be achieved.

Seventh Embodiment

[Configuration of Semiconductor Device 7]

Figure 18:
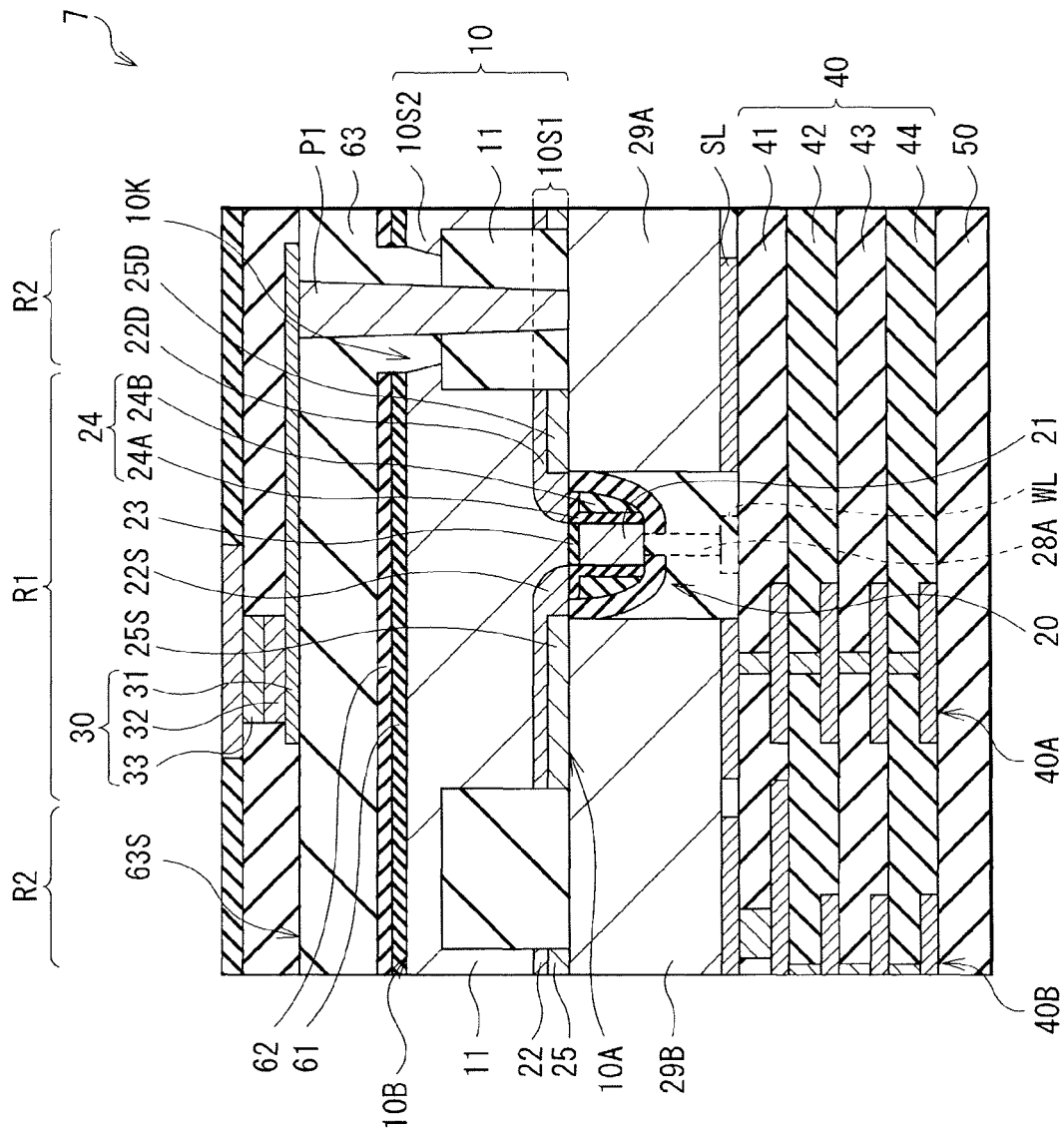
FIG. 18 is a sectional view illustrating a configuration example of a semiconductor device according to a seventh embodiment of the present disclosure.

FIG. 18 illustrates a sectional configuration of a semiconductor device 7 according to a seventh embodiment of the present disclosure. The semiconductor device 7 does not include the connection layers 28B and 28C, and includes wiring lines 29A and 29B that so spread from the element region R1 to the isolation region R2 as to come into contact with the principal surface 10A of the semiconductor substrate 10. The contact plug P1 extends from a front surface 63S of the insulating layer 63 to the principal surface 10A through the insulating layer 63 and the element isolation layer 11, and the bottom end of the contact plug P1 is in contact with a part of a top surface of the wiring line 29A. Another part of the top surface of the wiring line 29A is in contact with the silicide region 25D in the element region R1. A part of a top surface of the wiring line 29B is in contact with the silicide region 25S in the element region R1. The semiconductor device 7 has a configuration similar to that of the semiconductor device 1 according to the above-described first embodiment, except for these points. It is to be noted that the tap region R3 is not illustrated in FIG. 18.

[Method of Manufacturing Semiconductor Device 7]

Figure 19:
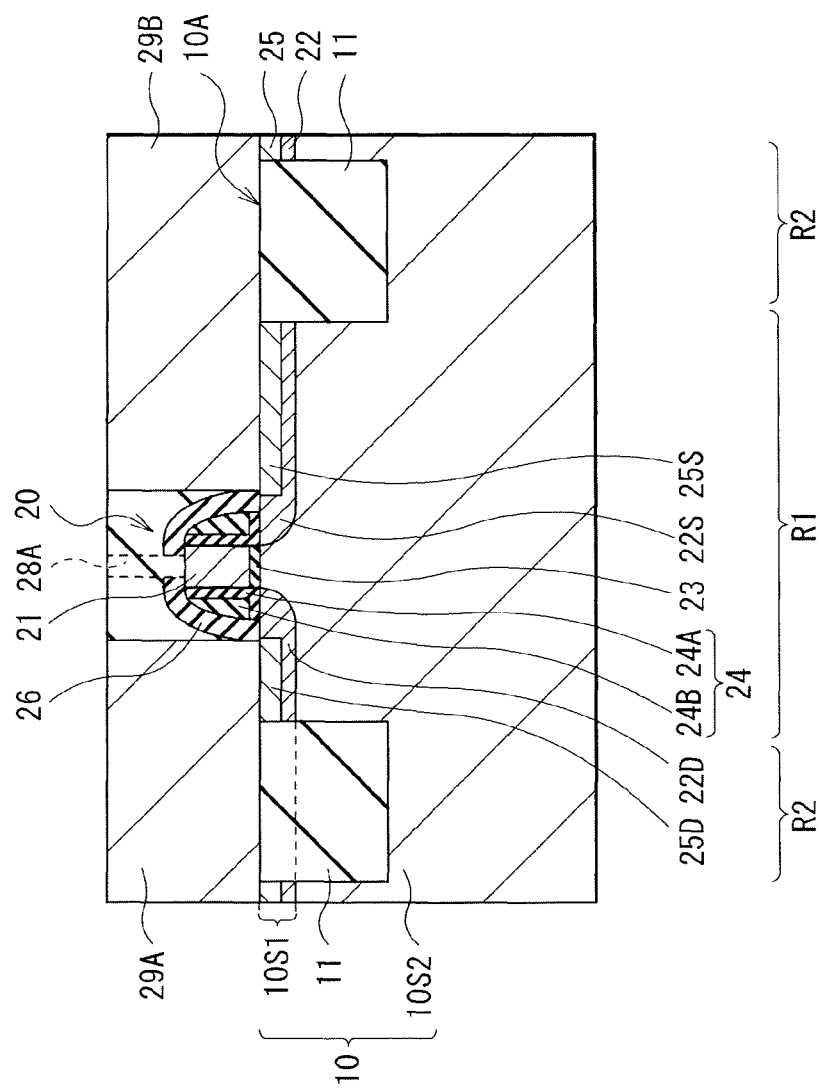
FIG. 19 is a sectional view illustrating a process in a method of manufacturing the semiconductor device illustrated in FIG. 18.

To manufacture the semiconductor device 7, as illustrated in FIG. 19, first, the semiconductor substrate 10 is prepared, and an LSI is formed on the principal surface 10A of the semiconductor substrate 10 by a typical manufacturing process. More specifically, after the element isolation layer 11 is formed on the principal surface 10A side of the semiconductor substrate 10, the transistor 20 including the gate electrode 21 and the pair of diffusion layers 22 is formed in the element region R1. The respective silicide regions 25 are formed in parts of the respective diffusion layers 22. Next, after the interlayer insulating films 26 and the 27 with which the transistor 20 is covered are formed, the connection layer 28A that passes through the interlayer insulating films 26 and 27 is formed. Moreover, the wiring lines 29A and 29B are formed on both sides of the gate electrode 21 on the principal surface 10A. After that, the semiconductor device 7 is completed by a method similar to the method of manufacturing the semiconductor device 1.

Even in such a semiconductor device 7, while flexibility in design is secured, a larger number of transistors 20 are allowed to be arranged in a narrower region, and higher integration is allowed to be achieved. Compared to the semiconductor device 1, a dimension in a depth direction of the contact plug P1 is allowed to be reduced; therefore, necessary time to form the through hole K1 is allowed to be reduced, and a manufacturing load on the insulating film 63 and the like is allowed to be reduced.

Modification Example 6

Figure 20:
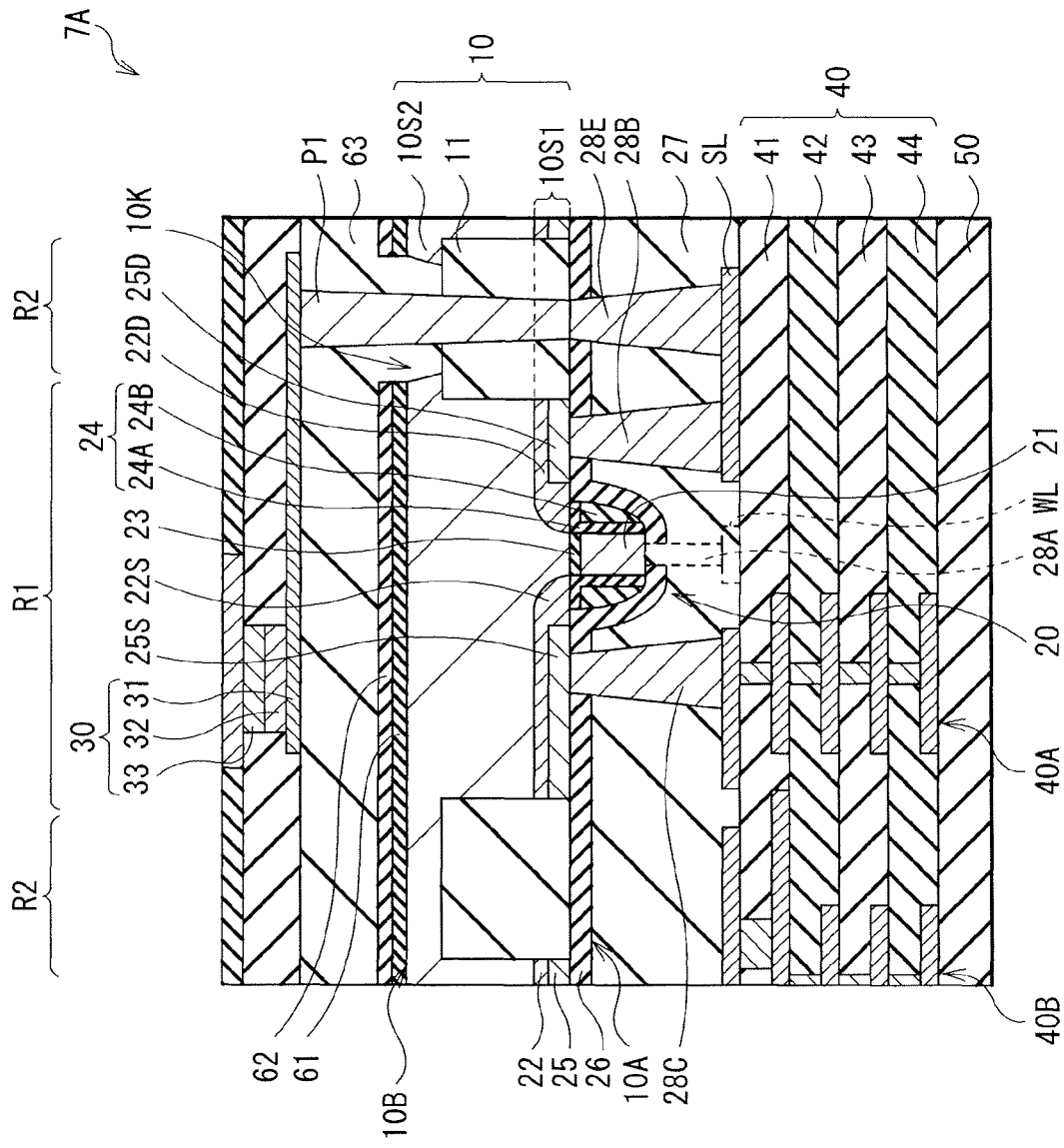
FIG. 20 is a sectional view illustrating a modification example of the semiconductor device according to the seventh embodiment of the present disclosure.

FIG. 20 illustrates a sectional configuration of a semiconductor device 7A according to a first modification example of the above-described semiconductor device 7. The semiconductor device 7A includes a connection layer 28E at a position corresponding to the contact plug P1 in a same layer as the connection layer 28B and the like. The bottom end of the contact plug P1 and a top end of the connection layer 28E come into contact with each other on the principal surface 10A. Even in this case, the dimension in the depth direction of the contact plug P1 is allowed to reduced; therefore, effects similar to those in the semiconductor device 7 are allowed to be obtained.

Modification Example 7

Figure 21:
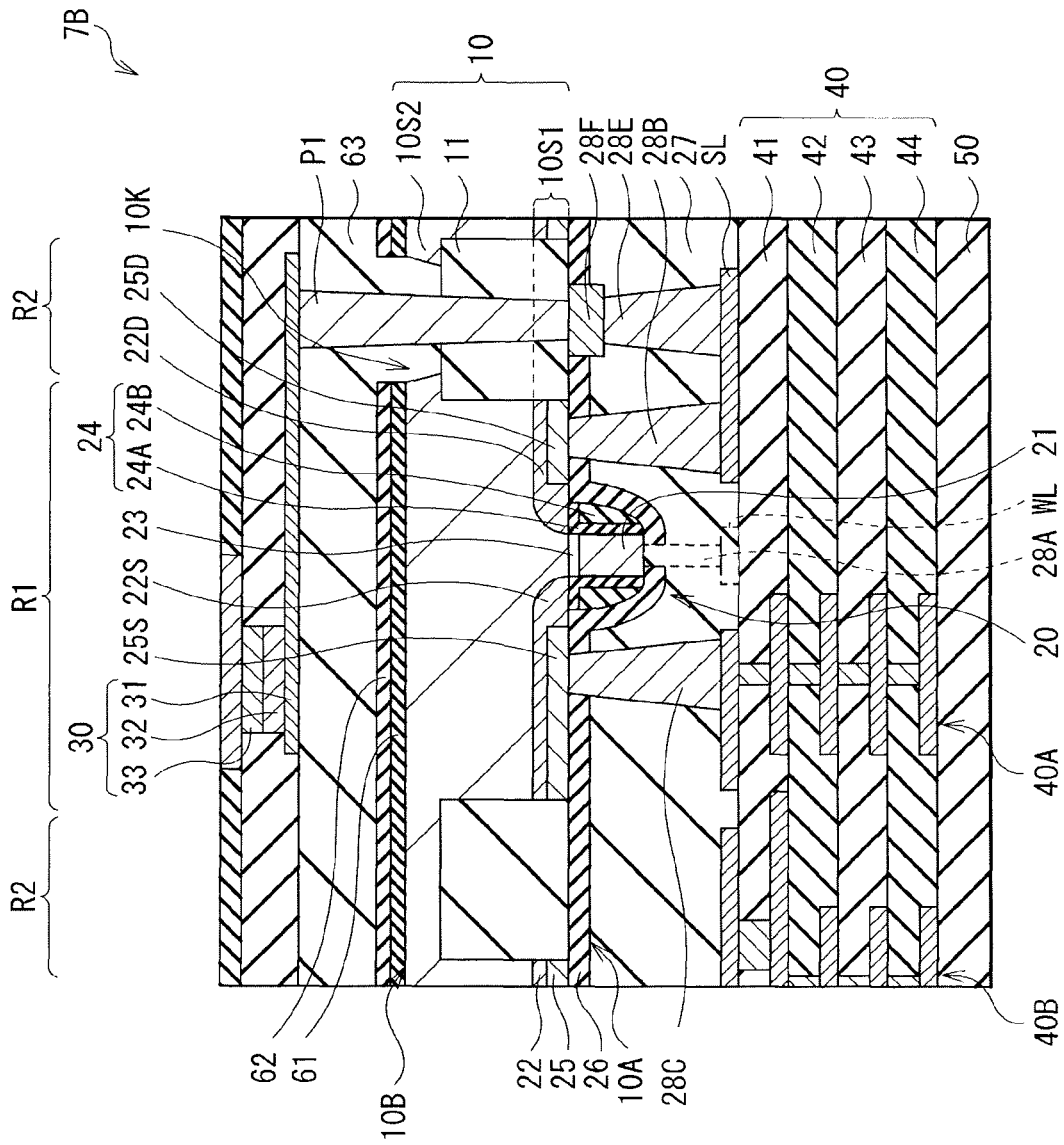
FIG. 21 is a sectional view illustrating another modification example of the semiconductor device according to the seventh embodiment of the present disclosure.

FIG. 21 illustrates a sectional configuration of a semiconductor device 7B according to a second modification example of the above-described semiconductor device 7. The semiconductor device 7B differs from the semiconductor device 7A in that a plate-shaped connection layer 28F is further included between the contact plug P1 and the connection layer 28E. The connection layer 28F may have, for example, a larger occupancy area than an occupancy area of the top end of the connection layer 28E. In this modification example, effects similar to those of the semiconductor device 7A are allowed to be obtained, and alignment when the contact plug P1 and the connection layer 28E are connected to each other is easily performed; therefore, manufacturability is improved.

Eighth Embodiment

[Configuration of Semiconductor Device 8]

Figure 22:
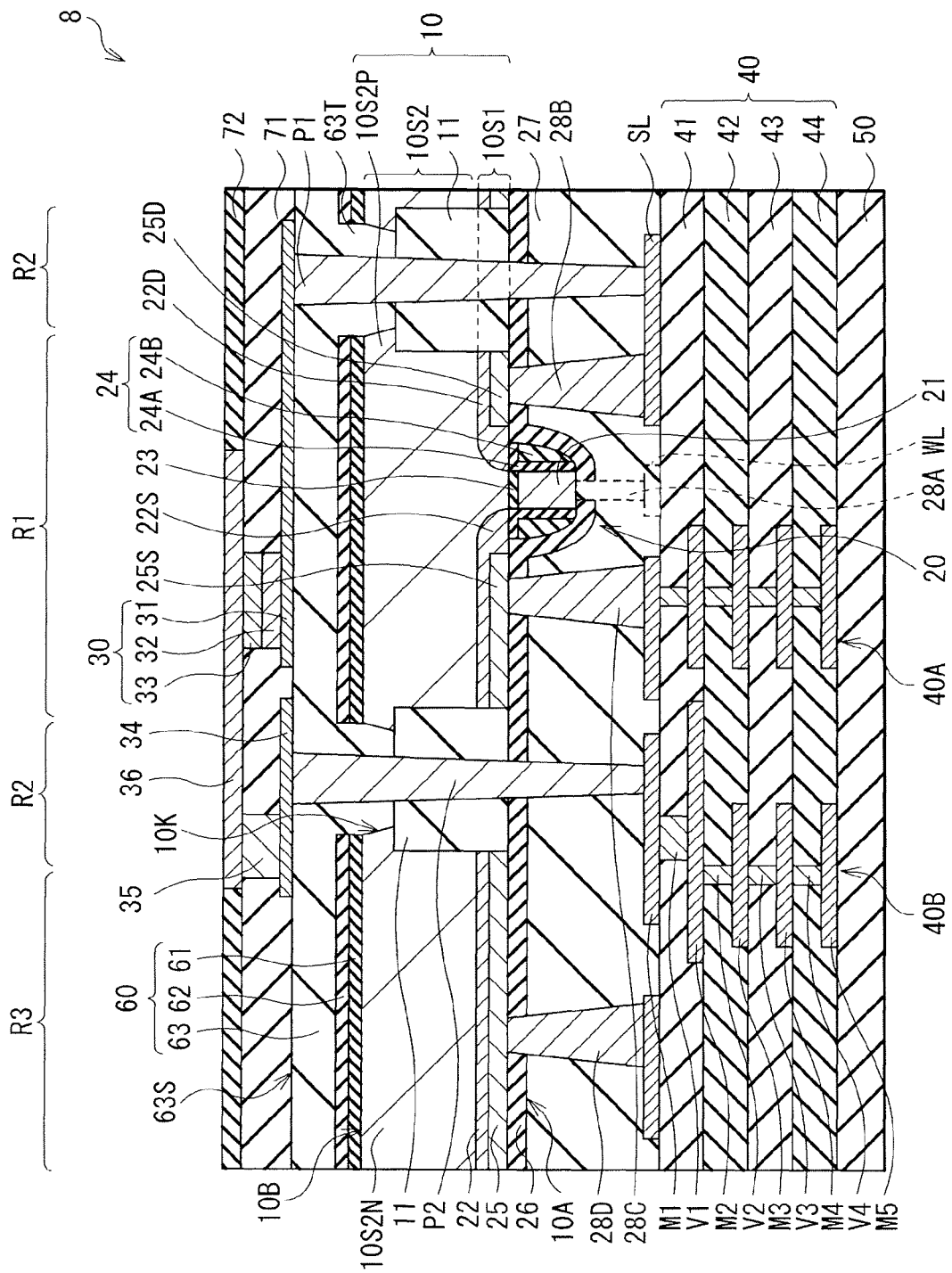
FIG. 22 is a sectional view illustrating a configuration example of a semiconductor device according to an eighth embodiment of the present disclosure.

FIG. 22 illustrates a sectional configuration of a semiconductor device 8 according to an eighth embodiment of the present disclosure. In the semiconductor device 8, the semiconductor substrate 10 has the element region R1 provided with the transistor 20, the isolation region R2 provided with the element isolation layer 11 surrounding the element region R1, and the tap region R3 isolated from the element region R1 by the isolation region R2. For example, a P-well 10S2P may be provided as a first conductive semiconductor portion in the element region R1 of the semiconductor substrate 10, and, for example, an N-well 10S2N may be provided as a second conductive semiconductor portion in the tap region R3 of the semiconductor substrate 10. In other words, in the semiconductor device 8, the semiconductor layer 10S2 is configured of the P-well 10S2P and the N-well 10S2N. The P-well 10S2P may be formed, for example, by ion-implanting a p-type impurity such as B (boron) into silicon. On the other hand, the N-well 10S2N may be formed, for example, by ion-implanting an N-type impurity such as P (phosphorus) into silicon. The pair of diffusion layers 22S and 22D in the element region R1 may be formed, for example, by diffusing an N-type impurity into silicon, and may have a polarity different from that of the P-well 10S2P. The diffusion layer 22 in the tap region R3 may be formed, for example, by diffusing a P-type impurity into silicon, and may have a polarity different from that of the N-well 10S2N.

In the isolation region R2, the protrusion section 63T of the insulating film 63 sandwiched between the P-well 10S2P and the N-well 10S2N is provided on the back surface 10B. In the isolation region R2, a portion where a bottom surface of the protrusion section 63T of the insulating film 63 is in contact with the top surface of the element isolation layer 11 is present, and in that portion, the contact plugs P1 and P2 so extend as to pass through the interlayer insulating film 27, the element isolation layer 11, and the insulating layer 60.

[Method of Manufacturing Semiconductor Device 8]

A method of manufacturing the semiconductor device 8 is similar to the method of manufacturing the semiconductor device 1 according to the above-described first embodiment, except that the P-well 10S2P and the N-well 10S2N are formed in the semiconductor substrate 10.

Figure 23A:
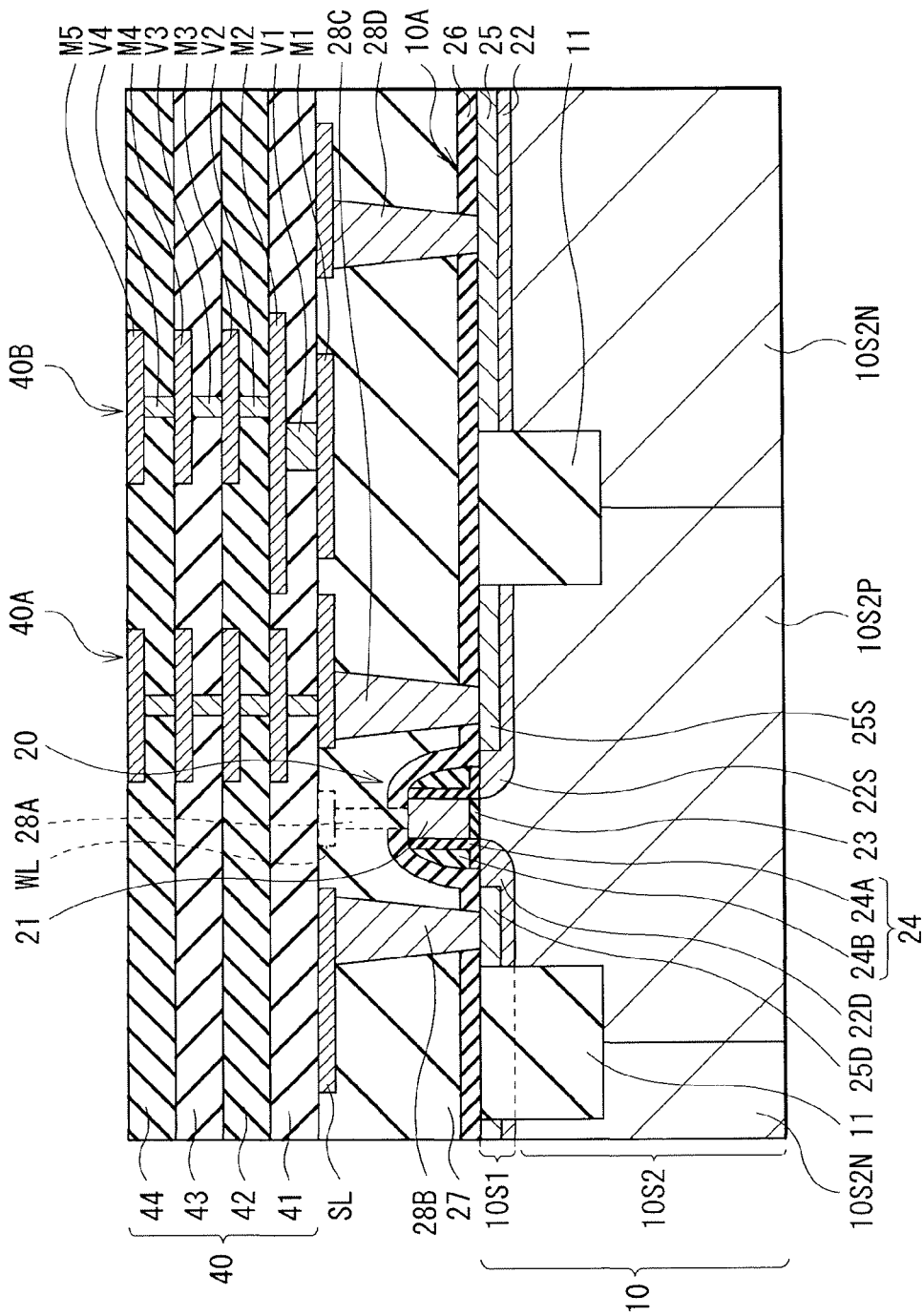
FIG. 23A is a sectional view illustrating a process in a method of manufacturing the semiconductor device illustrated in FIG. 22.
Figure 23B:
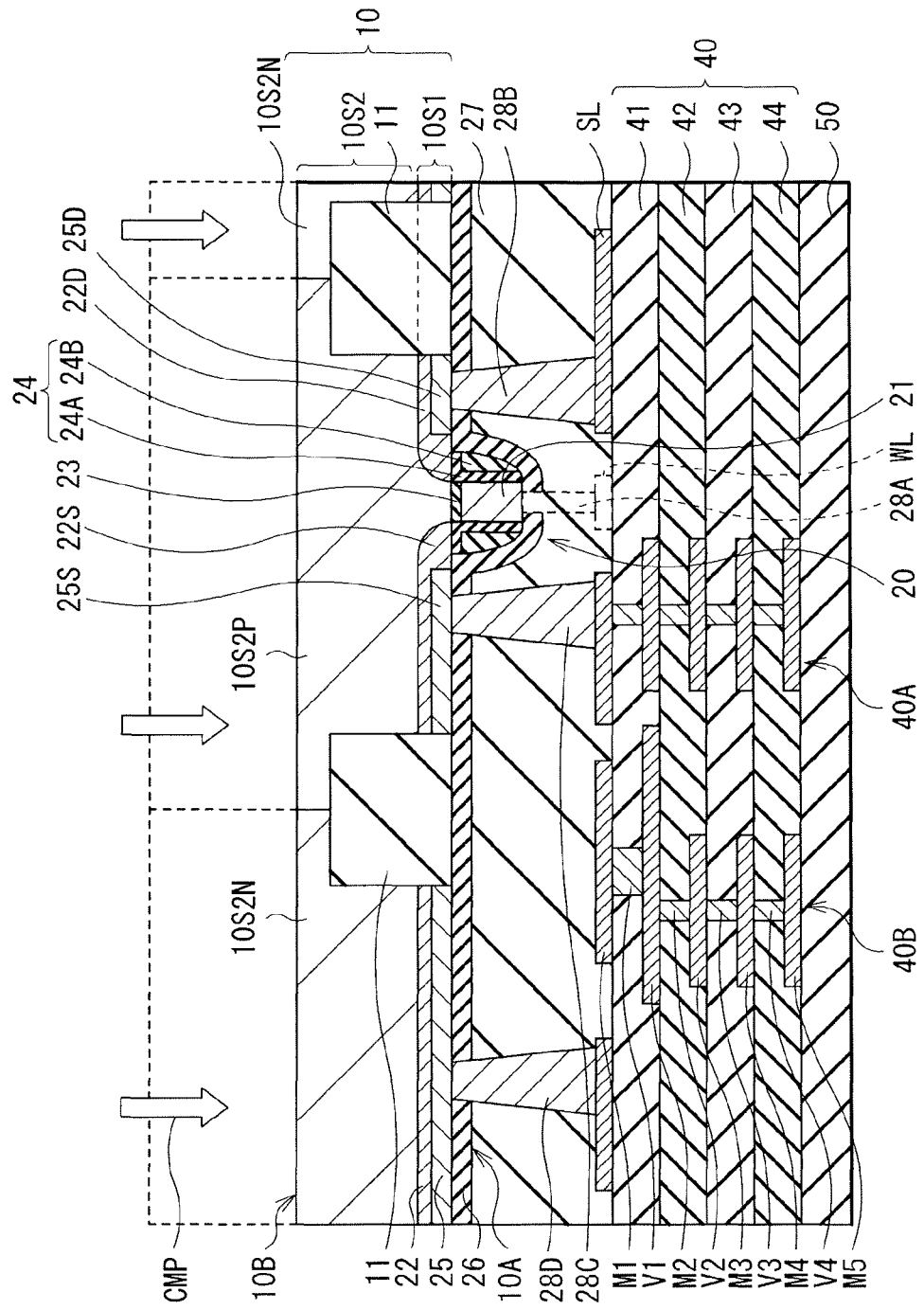
FIG. 23B is a sectional view illustrating a process following FIG. 23A.

More specifically, for example, as illustrated in FIG. 23A, the element isolation layer 11, the transistor 20, the interlayer insulating films 26 and 27, the connection layers 28A to 28D, the word line WL, the select line SL, and the metal layer M1 are formed on the principal surface 10A of the semiconductor substrate 10. Moreover, the multilayer wiring formation section 40 is formed on the interlayer insulating film 27. Next, as illustrated in FIG. 23B, after the supporting substrate 50 is bonded to a surface on an side opposite to the semiconductor substrate 10 of the multilayer wiring formation section 40, the semiconductor layer 10S2 of the semiconductor substrate 10 is polished by CMP, and polishing stops before reaching the element isolation layer 11. Thus, the back surface 10B is formed. At this time, the semiconductor layer 10S2 may have, for example, a thickness large enough for a depletion layer to reach the back surface 10B. When a defect or a flaw is produced on the back surface 10B during the polishing, a surface leakage current may be generated in proximity to the back surface 10B.

Figure 23C:
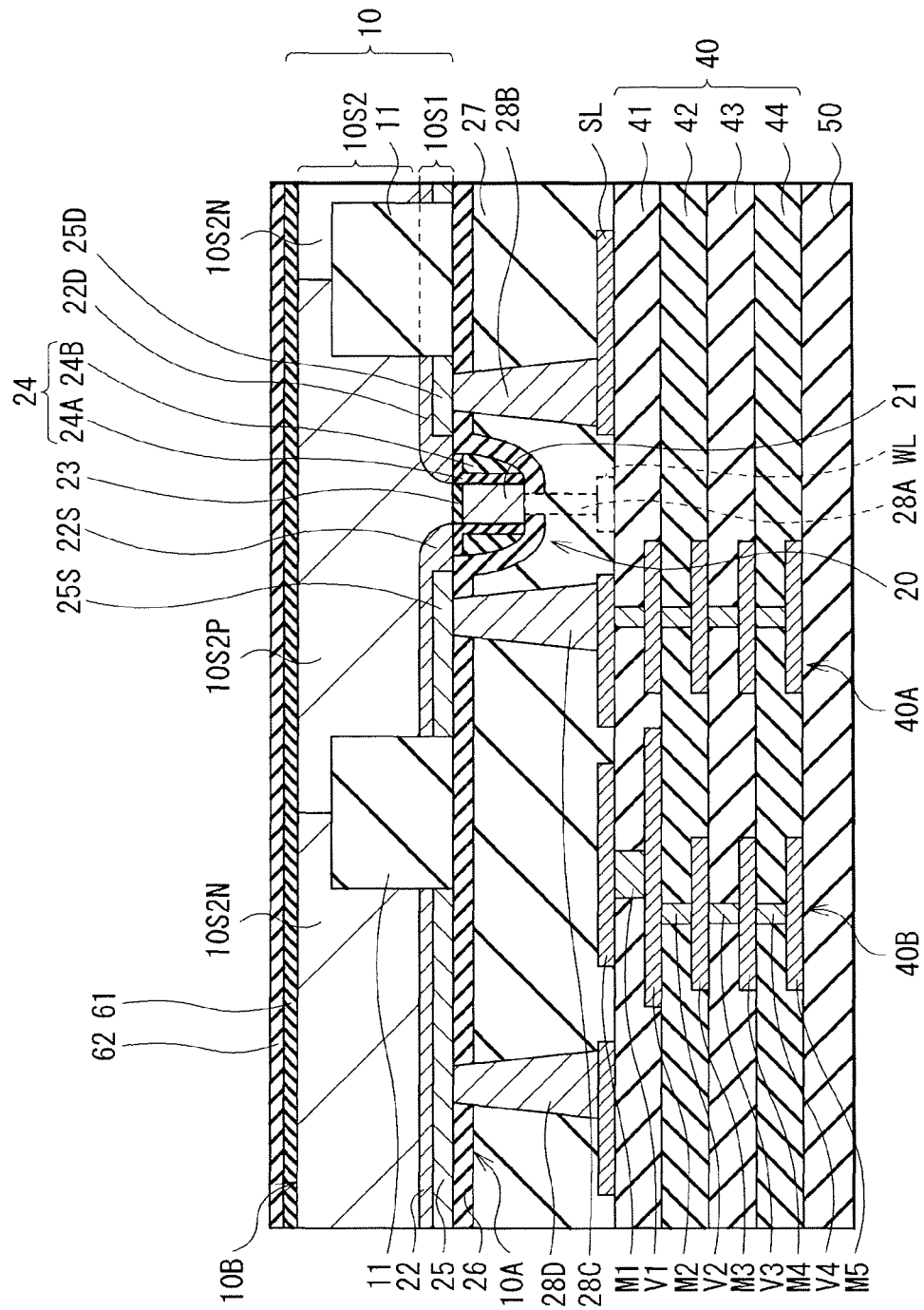
FIG. 23C is a sectional view illustrating a process following FIG. 23B.
Figure 23D:
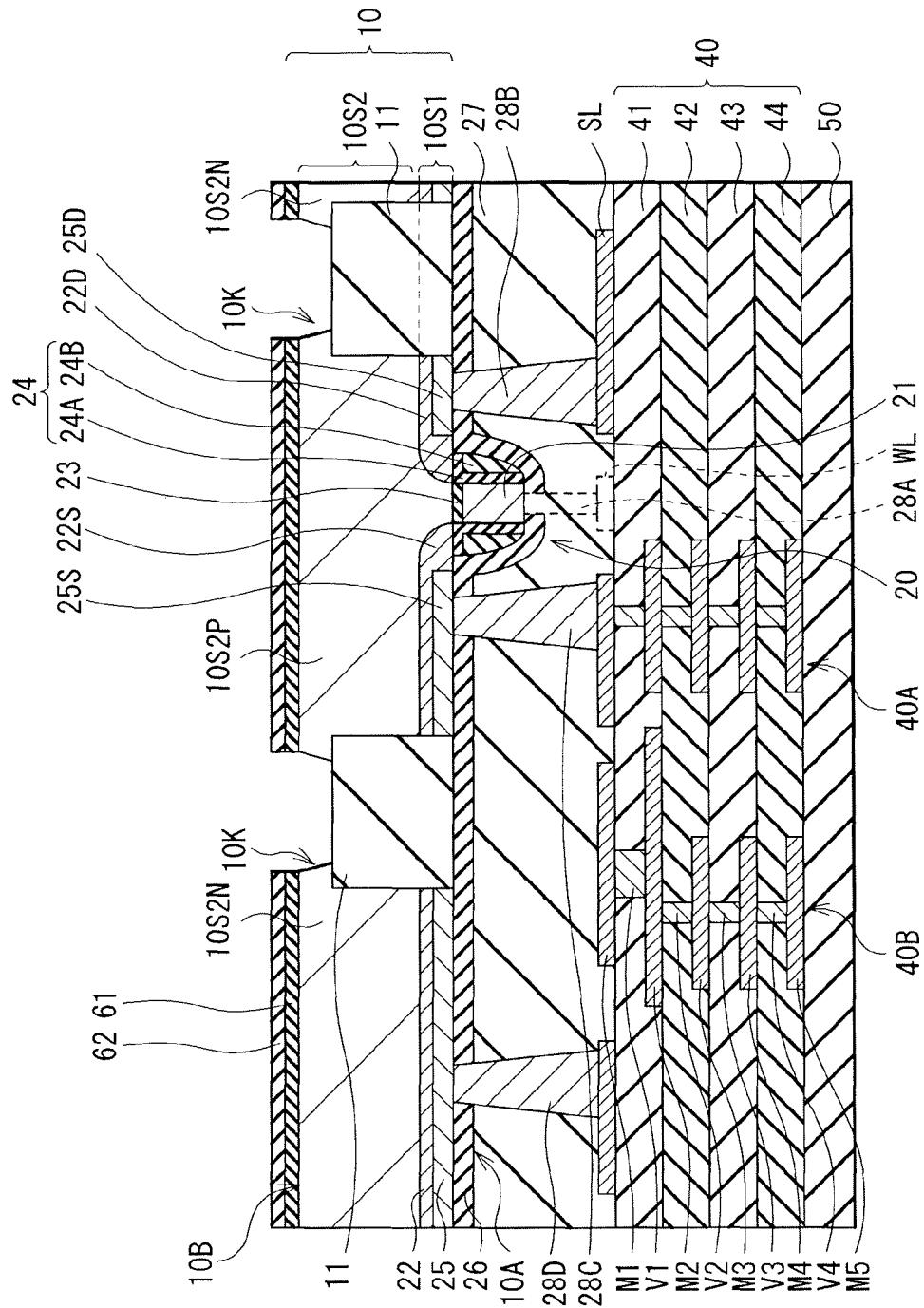
FIG. 23D is a sectional view illustrating a process following FIG. 23C.
Figure 23E:
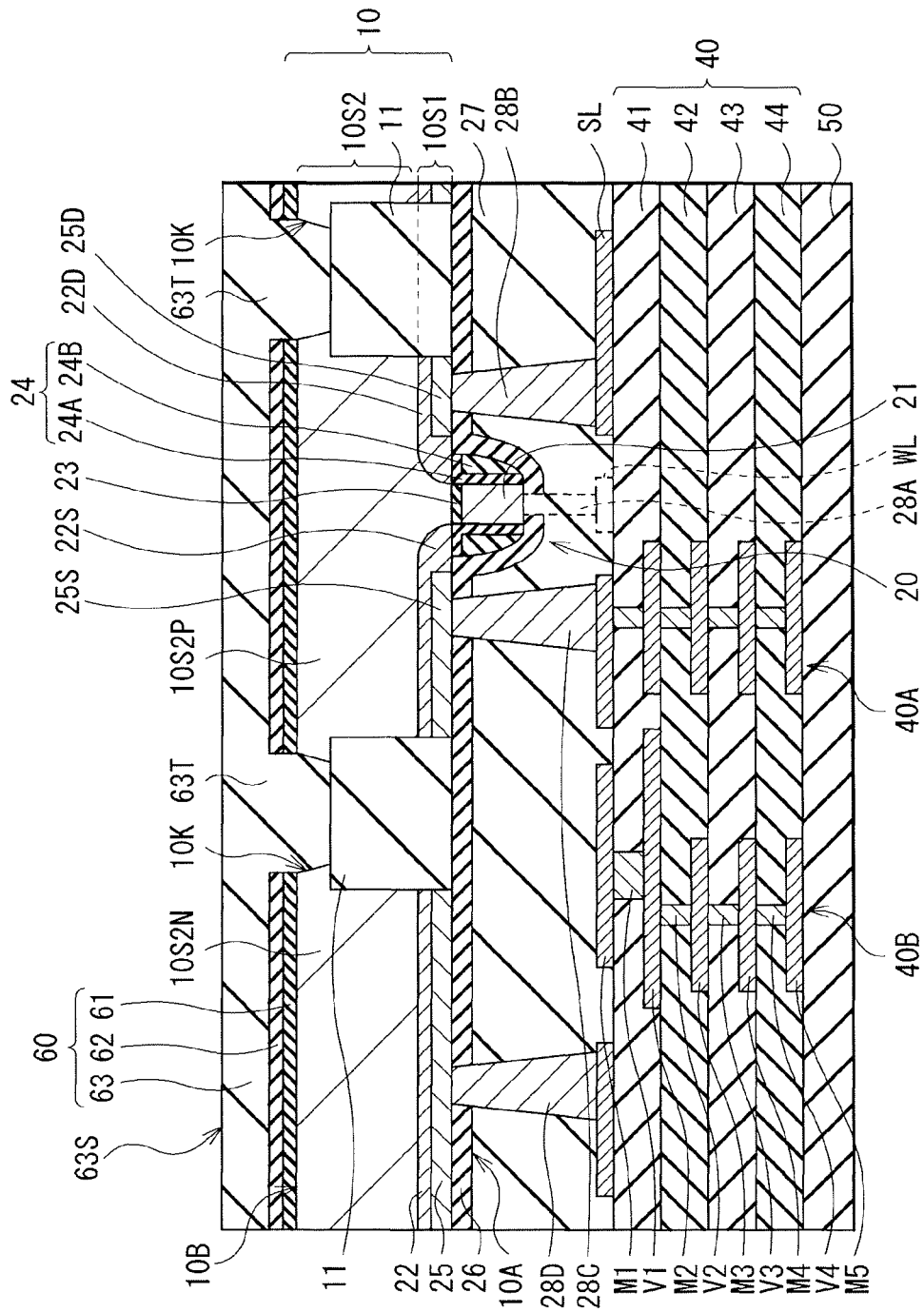
FIG. 23E is a sectional view illustrating a process following FIG. 23D.
Figure 23F:
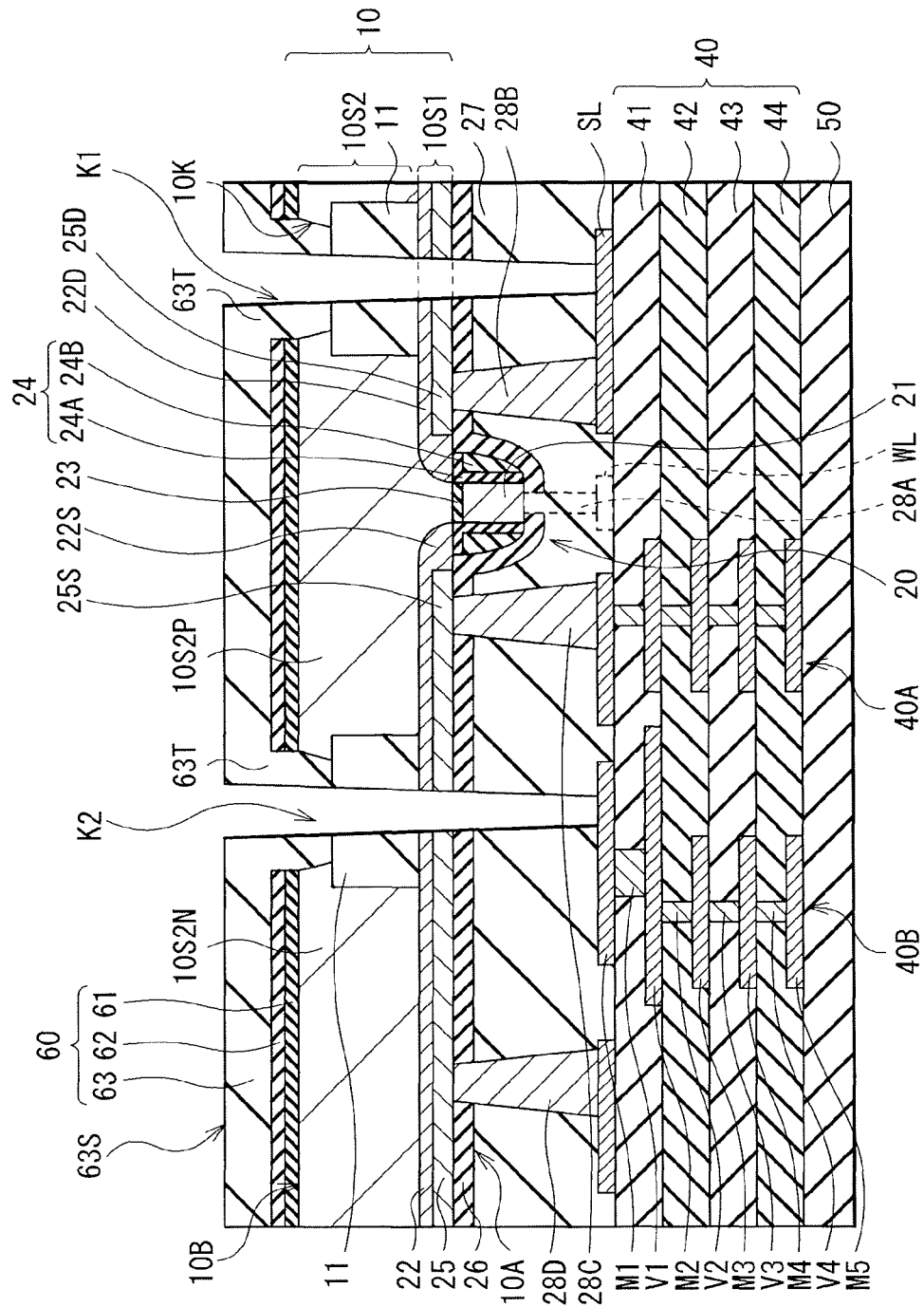
FIG. 23F is a sectional view illustrating a process following FIG. 23E.

Therefore, to prevent the surface leakage current, the protrusion section 63T of the insulating film 63 that isolates the P-well 10S2P and the N-well 10S2N from each other on the back surface 10B is provided in the following manner. First, as illustrated in FIG. 23C, the insulating film 61 and the insulating film 62 are so formed in order as to cover the back surface 10B of the semiconductor substrate 10. After that, as illustrated in FIG. 23D, the opening 10K is formed by selectively etching parts of portions occupying the isolation region R2 of the insulating film 61, the insulating film 62, and the semiconductor substrate 10. Moreover, as illustrated in FIG. 23E, the insulating film 63 is so formed as to cover the semiconductor substrate 10 covered with the insulating film 61 and the insulating film 62 and as to fill the opening 10K, and the top surface 63S of the insulating film 63 is planarized by a CMP method or the like. Thus, a portion where the element isolation layer 11 and the protrusion section 63T of the insulating film 63 are connected to each other through the opening 10K is formed. Further, as illustrated in FIG. 23F, the through holes K1 and K2 reaching the select line SL or the metal layer M1 of the wiring line 40B are formed in the portions where the element isolation layer 11 and the insulating film 63 are connected to each other of the isolation region R2. The opening areas of the through holes K1 and K2 are allowed to be arbitrarily set. After that, the contact plugs P1 and P2 made of the above-described material are so formed as to fill the through holes K1 and K2. Next, as illustrated in FIG. 22, the conductive layers 31 and 34 are so formed as to cover the top ends of the contact plugs P1 and P2, respectively. The storage section 32 and the conductive layer 33 are formed on the conductive layer 31, the conductive layer 35 is formed on the conductive layer 34, and finally, the common conductive layer 36 is so formed as to come into contact with top surfaces of both the conductive layer 33 and the conductive layer 35, thereby forming the storage element 30.

Even in such a semiconductor device 8, while flexibility in design is secured, a larger number of transistors 20 are allowed to be arranged in a narrower region, and higher integration is allowed to be achieved. Moreover, the protrusion section 63T isolates the P-well 10S2P and the N-well 10S2N from each other on the back surface 10B; therefore, generation of a leakage current in proximity to the back surface 10B caused by polishing in formation of the back surface 10B of the semiconductor device 8 is prevented.

Modification Example 8

Figure 24A:
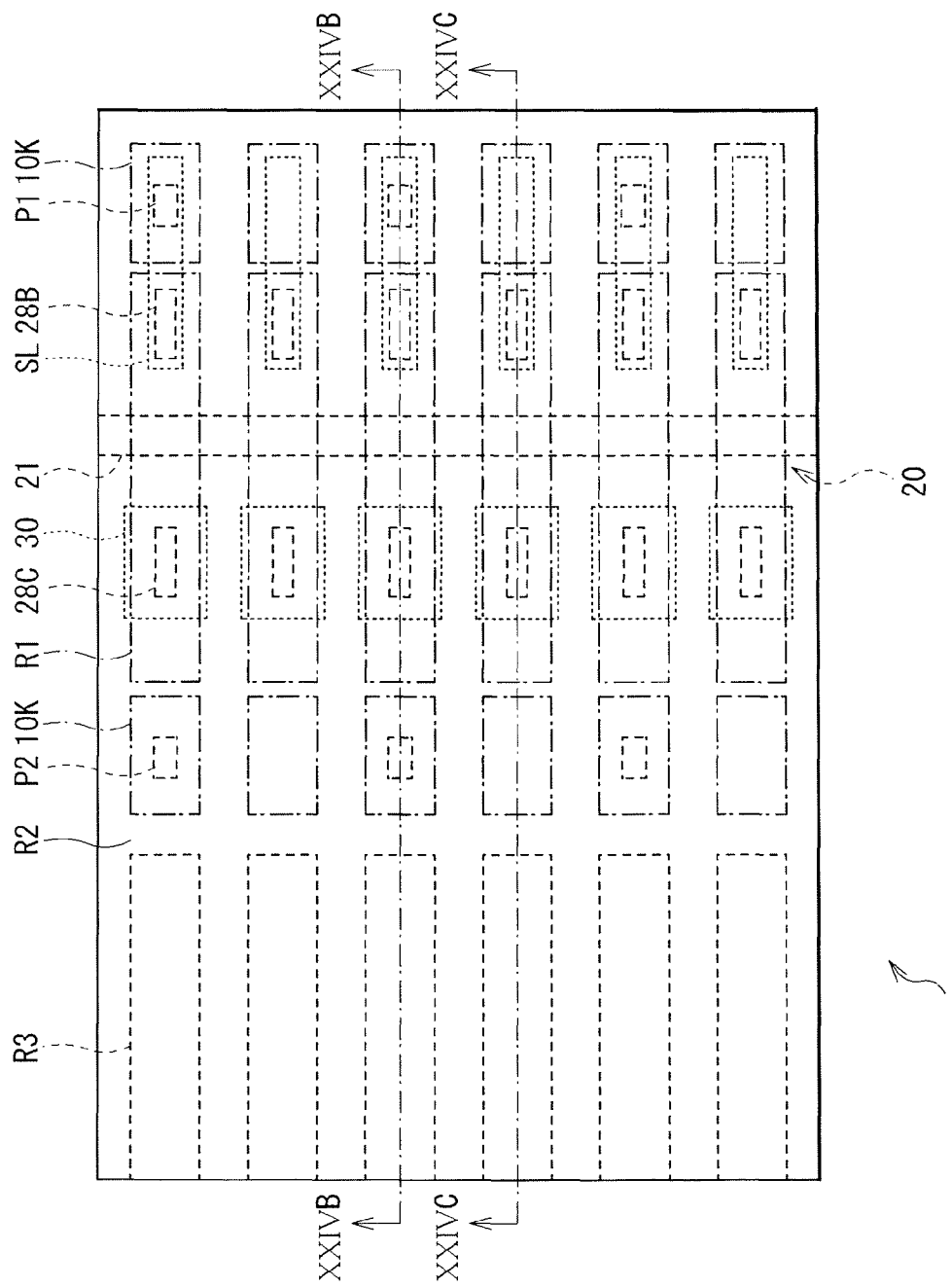
FIG. 24A is a plan view illustrating a first modification example of the semiconductor device according to the eighth embodiment of the present disclosure.
Figure 24B:
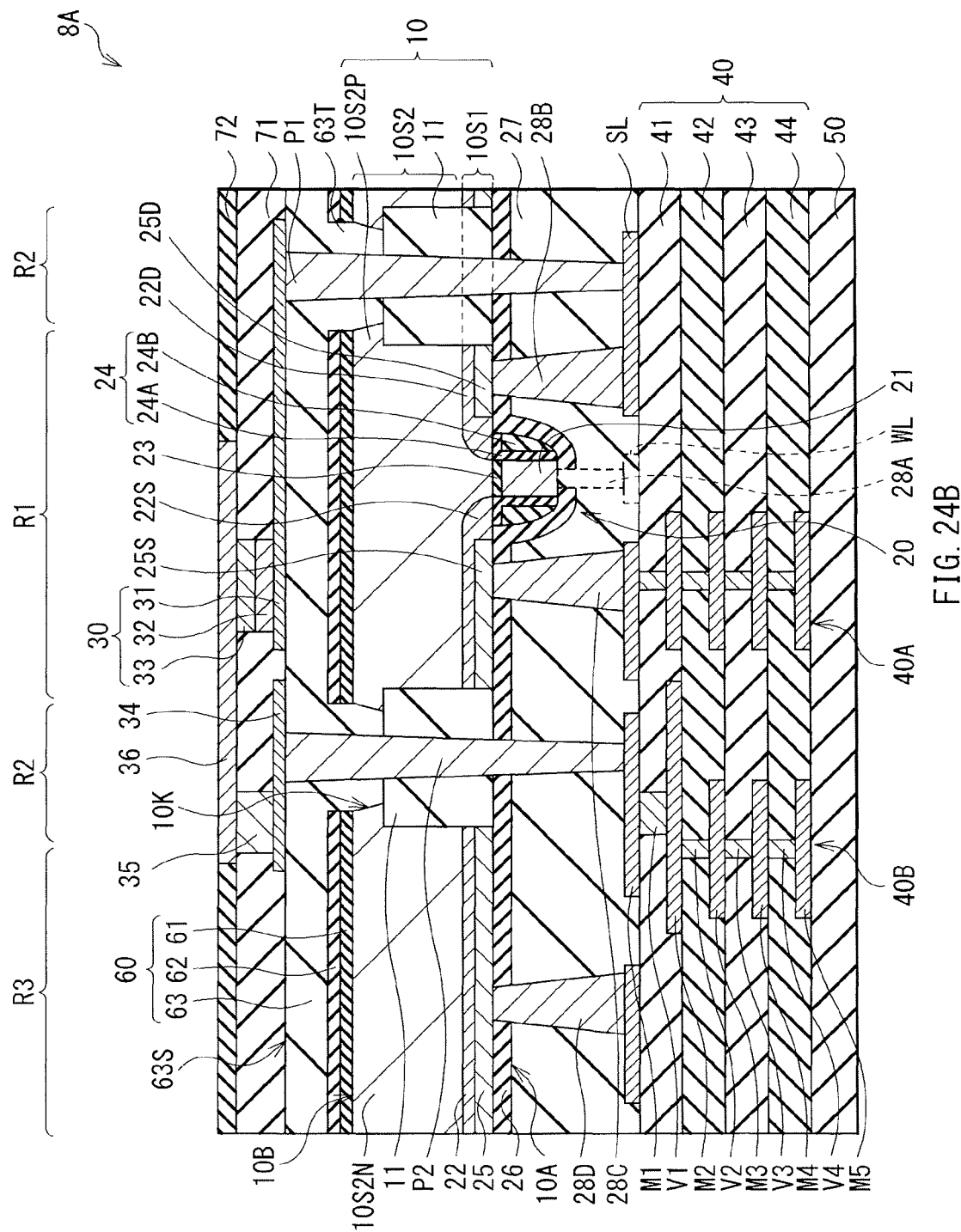
FIG. 24B is a sectional view illustrating a modification example of the semiconductor device illustrated in FIG. 24A.
Figure 24C:
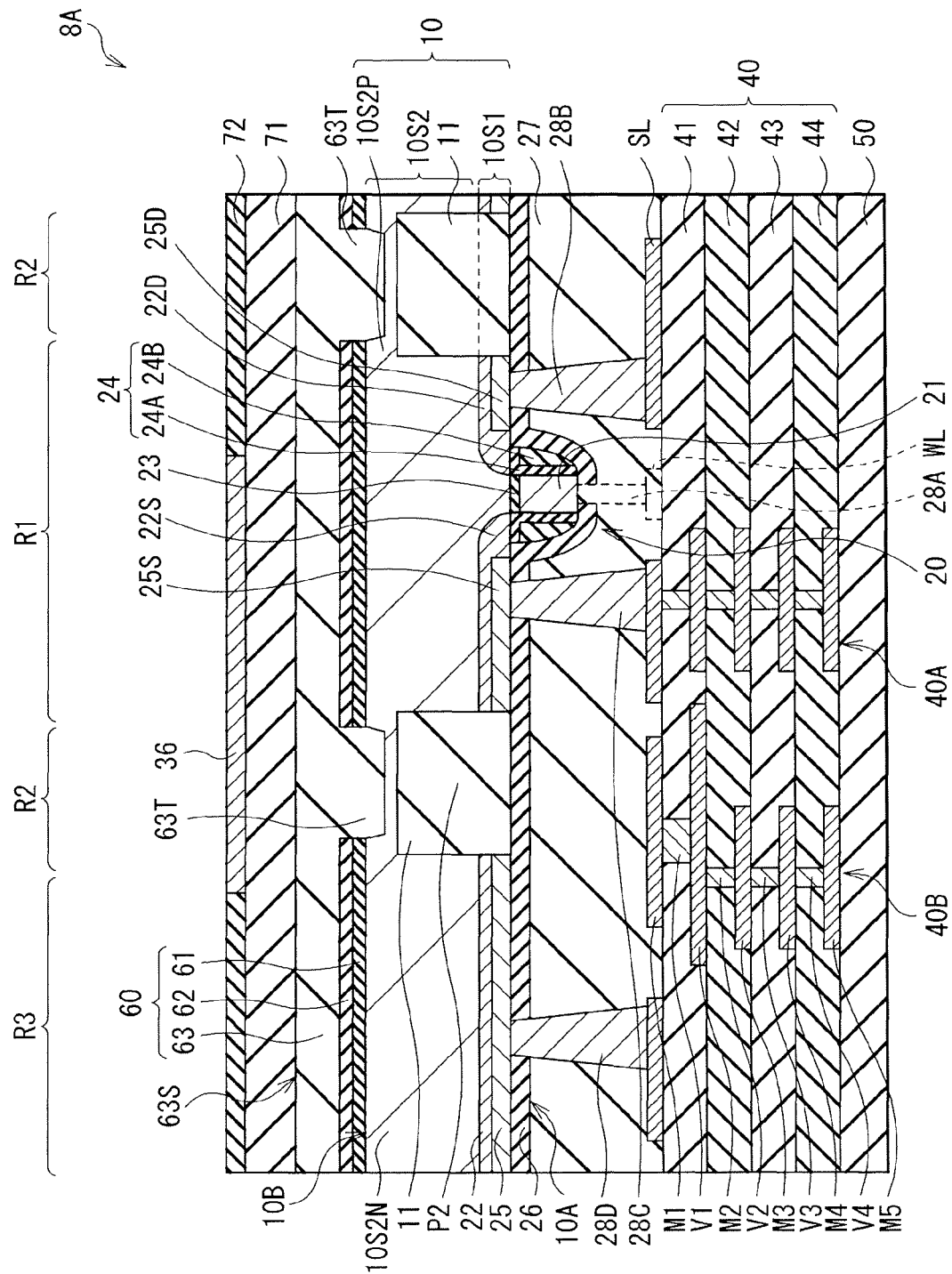
FIG. 24C is another sectional view illustrating the modification example of the semiconductor device illustrated in FIG. 24A.

In this case, a portion where the element isolation layer 11 and the protrusion section 63T of the insulating film 63 are in contact with each other and a portion where the element isolation layer 11 and the protrusion section 63T of the insulating film 63 are isolated from each other may be mixed in the isolation region R2. FIG. 24A illustrates a planar configuration of a semiconductor device 8A according to a first modification example of the above-described semiconductor device 8, and FIGS. 24B and 24C are sectional views taken along a line XXIVB-XXIVB and a line XXIVC-XXIVC in an arrow direction of the semiconductor device 8A, respectively. In the semiconductor device 8A, in a section taken along the line XXIVB-XXIVB, a contact portion between the protrusion section 63T and the element isolation layer 11 is present in the isolation region R2 (refer to FIG. 24B). On the other hand, in a section taken along the line XXIVC-XXIVC, a portion where the protrusion section 63T and the element isolation layer 11 are isolated from each other is present in the isolation region R2 (refer to FIG. 24C). While the contact plugs P1 and P2 are so provided as to pass through the contact portion between the protrusion section 63T and the element isolation layer 11, the contact plugs P1 and P2 are not provided in the portion where the protrusion section 63T and the element isolation layer 11 are isolated from each other.

It is to be noted that the element isolation layer 11 and the protrusion section 63T may be isolated from each other in the entire isolation regions R2. Even in this case, the protrusion section 63T isolates the P-well 10S2P and the N-well 10S2N from each other on the back surface 10B; therefore, generation of a leakage current in proximity to the back surface 10B is prevented.

Modification Example 9

Figure 25:
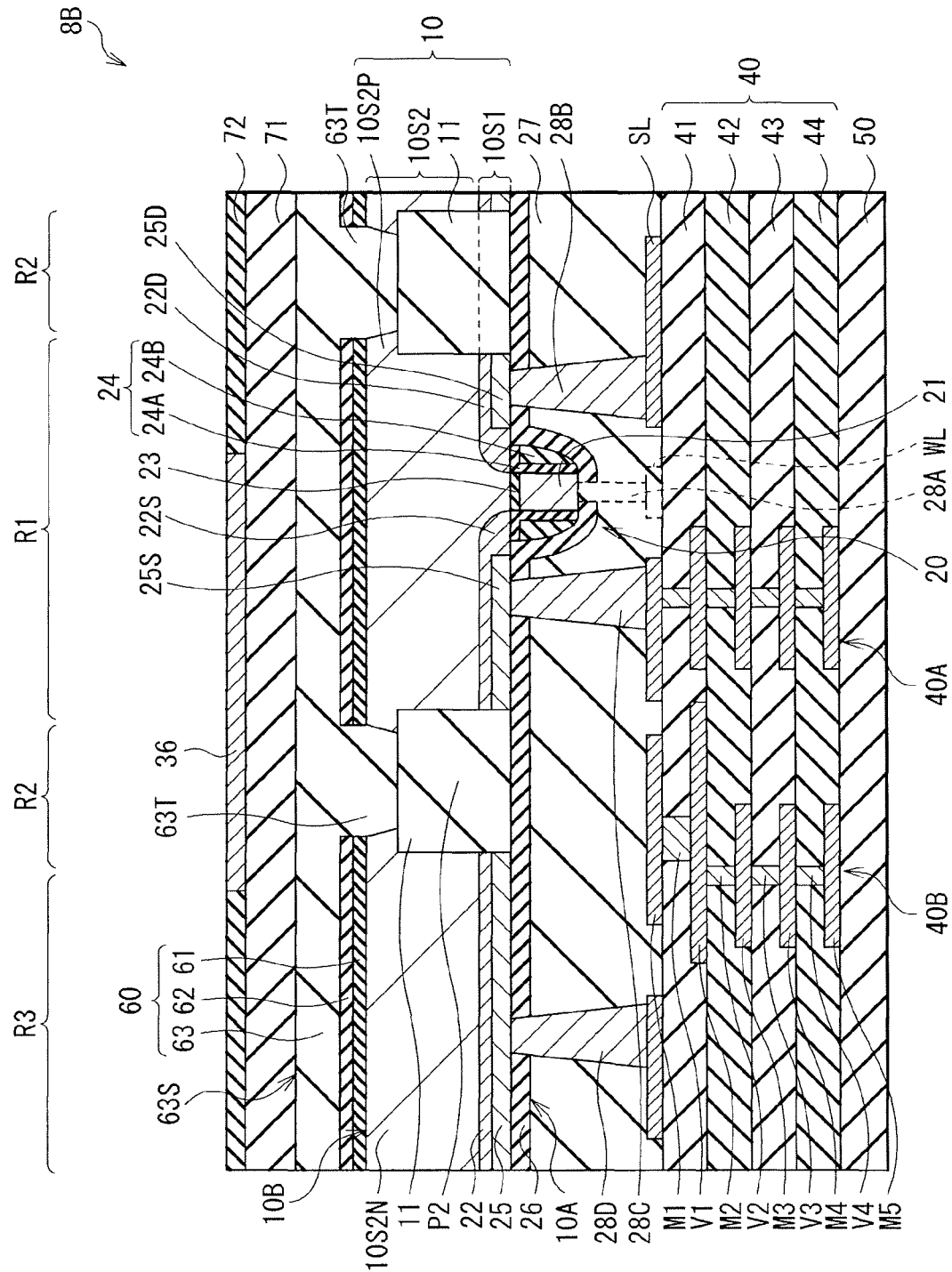
FIG. 25 is a sectional view illustrating a second modification example of the semiconductor device according to the eighth embodiment of the present disclosure.

Moreover, like a semiconductor device 8B, illustrated in FIG. 25, according to a second modification example of the semiconductor device 8, some of contact portions between the protrusion section 63T and the element isolation layer 11 may not include the contact plugs P1 and P2. FIG. 25 illustrates a sectional configuration of the semiconductor device 8B.

Modification Example 10

Figure 26:
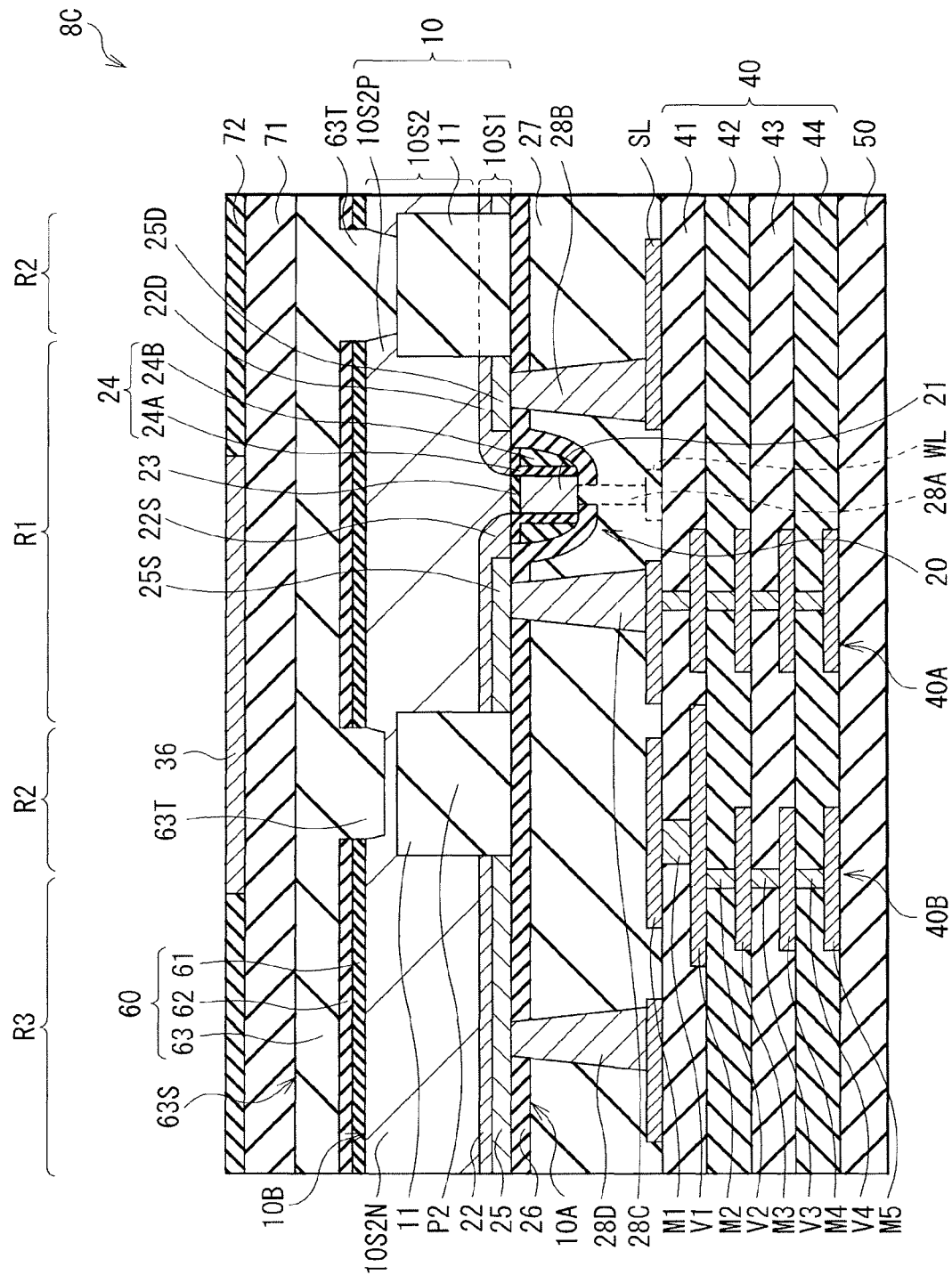
FIG. 26 is a sectional view illustrating a third modification example of the semiconductor device according to the eighth embodiment of the present disclosure.

Further, like a semiconductor device 8C, illustrated in FIG. 26, according to a third modification example of the semiconductor device 8, a height of the protrusion section 63T of the insulating film 63 may differ depending on location. For example, a portion where the protrusion section 63T and the element isolation layer 11 are isolated from each other and a contact portion between the protrusion section 63T and the element isolation layer 11 may be mixed.

Modification Example 11

Figure 27:
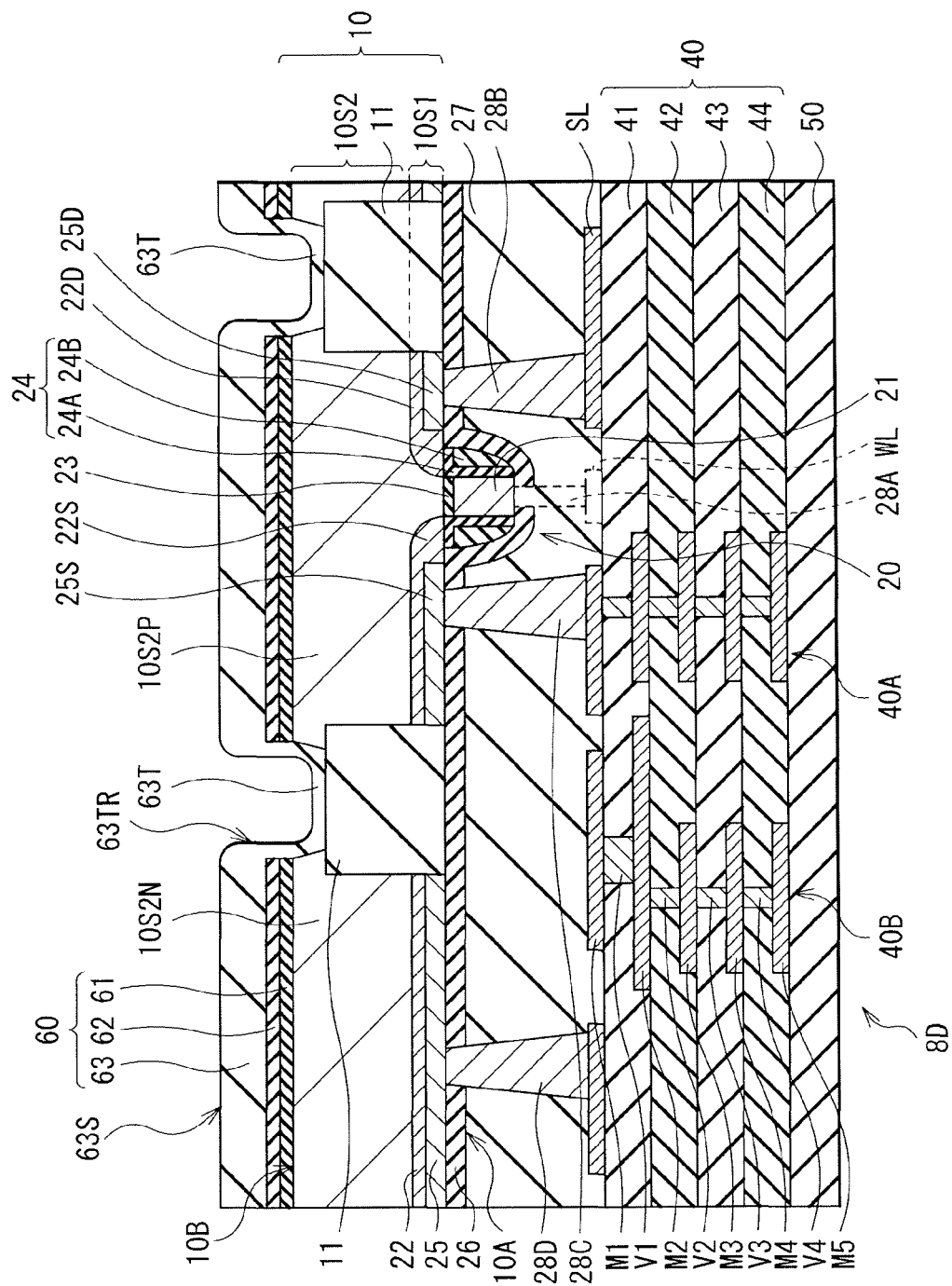
FIG. 27 is a sectional view illustrating a fourth modification example of the semiconductor device according to the eighth embodiment of the present disclosure.

Furthermore, like a semiconductor device 8D, illustrated in FIG. 27, according to a fourth modification example of the semiconductor device 8, a trench 63TR may be included inside the protrusion section 63T. In other words, it may be only necessary to electrically isolate the P-well 10S2P and the N-well 10S2N from each other, and the insulating film 63 may be so formed as to cover an internal surface of the opening 10K. It is to be noted that FIG. 27 illustrates a sectional configuration of a main part of the semiconductor device 8D. In this case, a material forming the insulating film 63 is allowed to be reduced.

Modification Example 12

Figure 28:
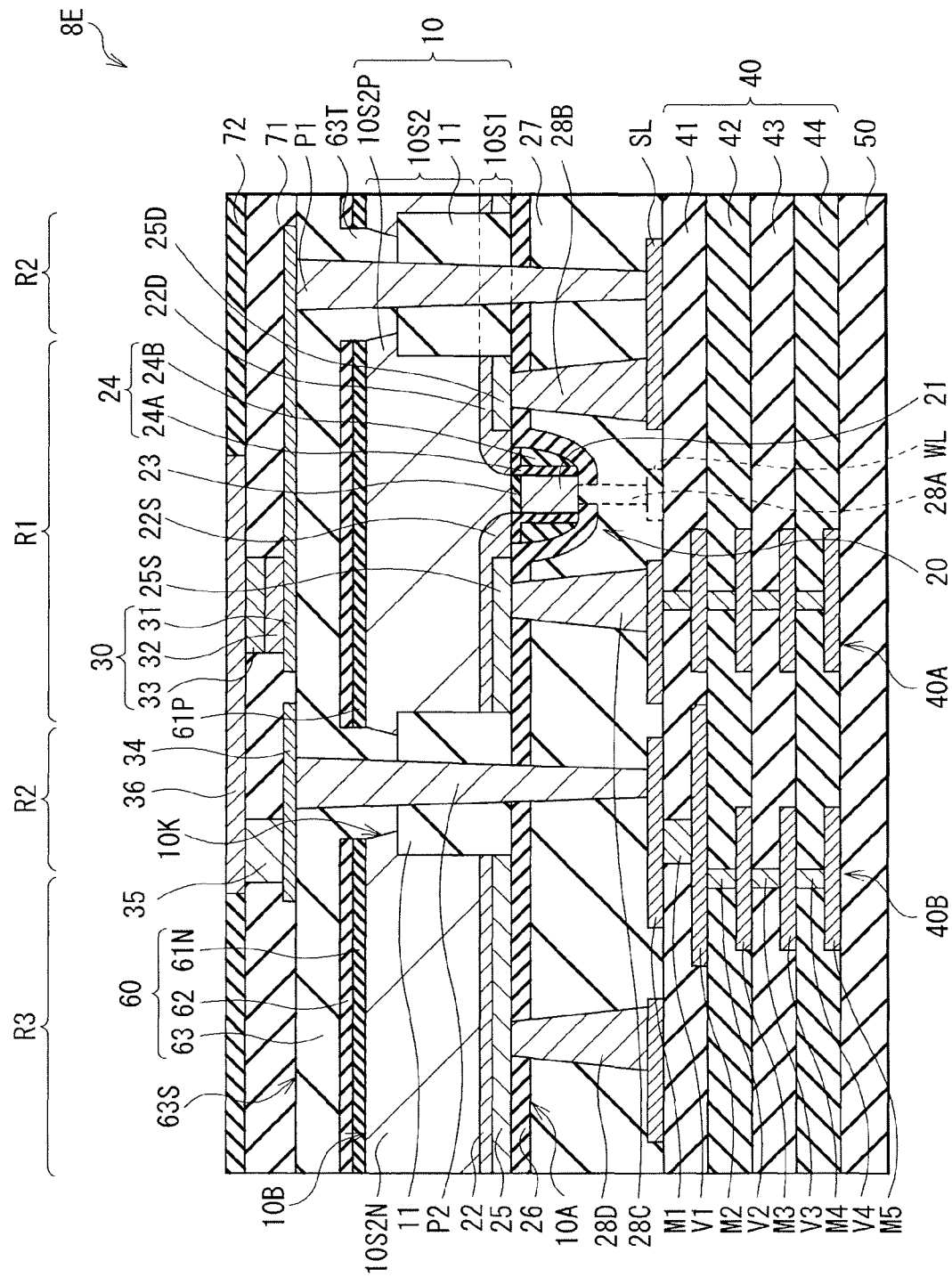
FIG. 28 is a sectional view illustrating a fifth modification example of the semiconductor device according to the eighth embodiment of the present disclosure.

Moreover, like a semiconductor device 8E, illustrated in FIG. 28, according to a fifth modification example of the semiconductor device 8, the N-well 10S2N may be covered with an insulating film 61N, and the P-well 10S2P may be covered with an insulating film 61P different from the insulating film 61N. In doing so, generation of a surface leakage current caused by a defect level of the semiconductor layer 10S2 in the back surface 10B is suppressed. It is to be noted that FIG. 28 illustrates a sectional configuration of a main part of the semiconductor device 8E.

The insulating film 61N may be made of a High-K (high-dielectric constant) material having a negative flat band, and specific examples of the material include oxides such as $Y_2O_3$, $La_2O_3$, $GeO_2$, $Lu_2O_3$, and SrO and oxynitrides. The insulating film 61N may be, for example, a band-structure modulation film functioning to limit trapping of free electrons in proximity to a conduction band by shifting downward an energy band of silicon forming the N-well 10S2N that is the semiconductor layer 10S2. On the other hand, the insulating film 61P may be made of a High-K (high-dielectric constant) material having a positive flat band, and specific examples of the material include oxides including Al, Hf, Ti, Zr, or Mg such as $Al_2O_3$, $HfO_2$, $TiO_2$, $ZrO_2$, and MgO and oxynitrides. The insulating film 61P may be a band-structure modulation film functioning to limit trapping of free electrons in proximity to a valence band by shifting upward an energy band of silicon forming the P-well 10S2P that is the semiconductor layer 10S2.

It is to be noted that, as an application, only one of the insulating film 61N and the insulating film 61P may be formed. Even in such a case, a leakage current is allowed to be reduced to some extent. Moreover, compared to a case where both the insulating film 61N and the insulating film 61P are provided, manufacturing processes are simplified, and manufacturing cost is allowed to be reduced. Further, as with the insulating film 63 including the trench 63TR in the above-described semiconductor device 8D illustrated in FIG. 27, the insulating film 61N and the insulating film 61P may be so formed as to also cover end surfaces of the P-well 10S2P and the N-well 10S2N. Since band modulation at the end surfaces of the P-well 10S2P and the N-well 10S2N is allowed to be performed, an effect of reducing a leakage current as a whole is improved. Moreover, the number of manufacturing processes is allowed to be reduced; therefore, manufacturing cost is allowed to be reduced.

Ninth Embodiment

[Configuration of Semiconductor Device 9]

Figure 29:
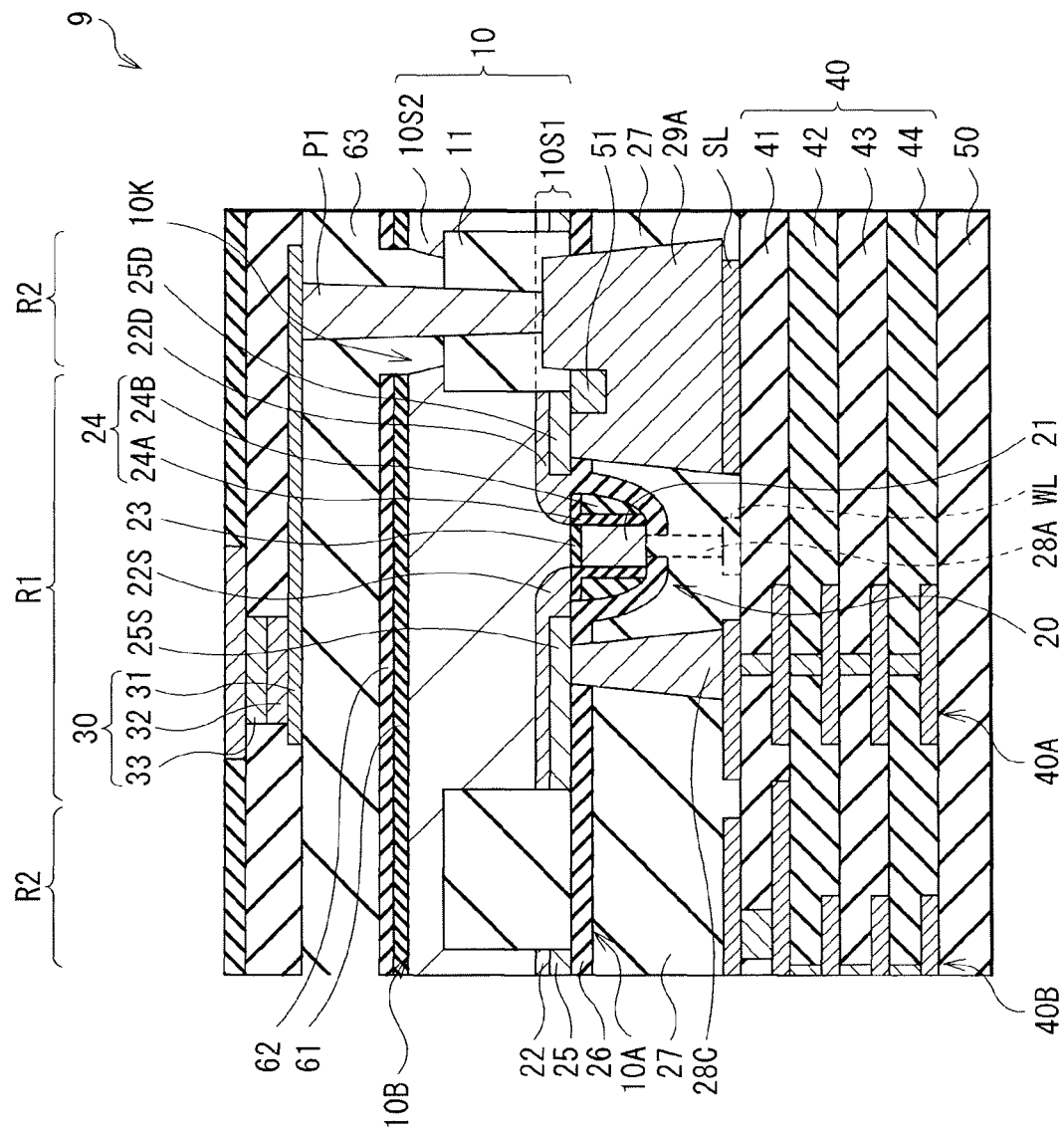
FIG. 29 is a sectional view illustrating a configuration example of a semiconductor device according to a ninth embodiment of the present disclosure.

FIG. 29 illustrates a sectional configuration of a semiconductor device 9 according to a ninth embodiment of the present disclosure. In the semiconductor device 9, a block layer 51 is so provided as to cover a boundary between the silicide region 25D of the transistor 20 and the element isolation layer 11 adjacent to the silicide region 25D. The semiconductor device 9 basically has a configuration similar to that of the semiconductor device 7 according to the above-described seventh embodiment, except for this point. Therefore, in the following description, like components are denoted by like numerals as of the semiconductor device 7. It is to be noted that the tap region R3 is not illustrated in FIG. 29.

[Method of Manufacturing Semiconductor Device 9]

Figure 30A:
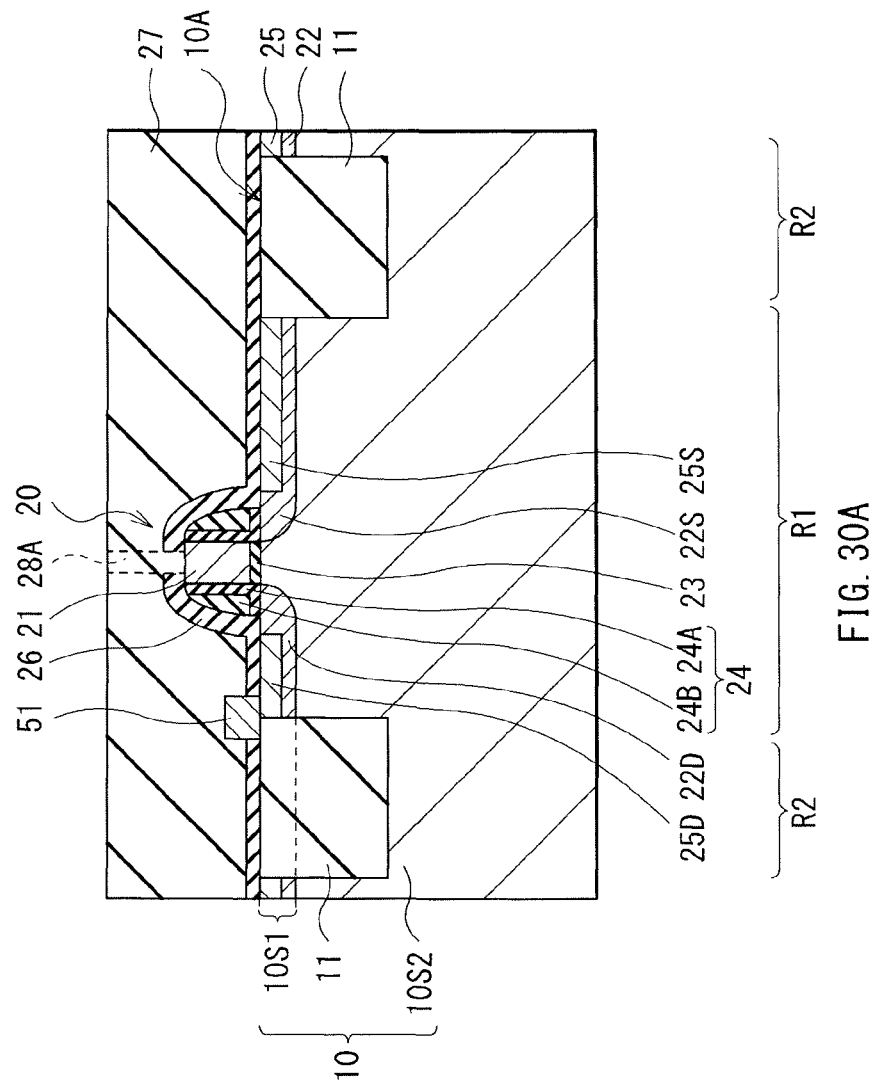
FIG. 30A is a sectional view illustrating a process in a method of manufacturing the semiconductor device illustrated in FIG. 29.
Figure 30B:
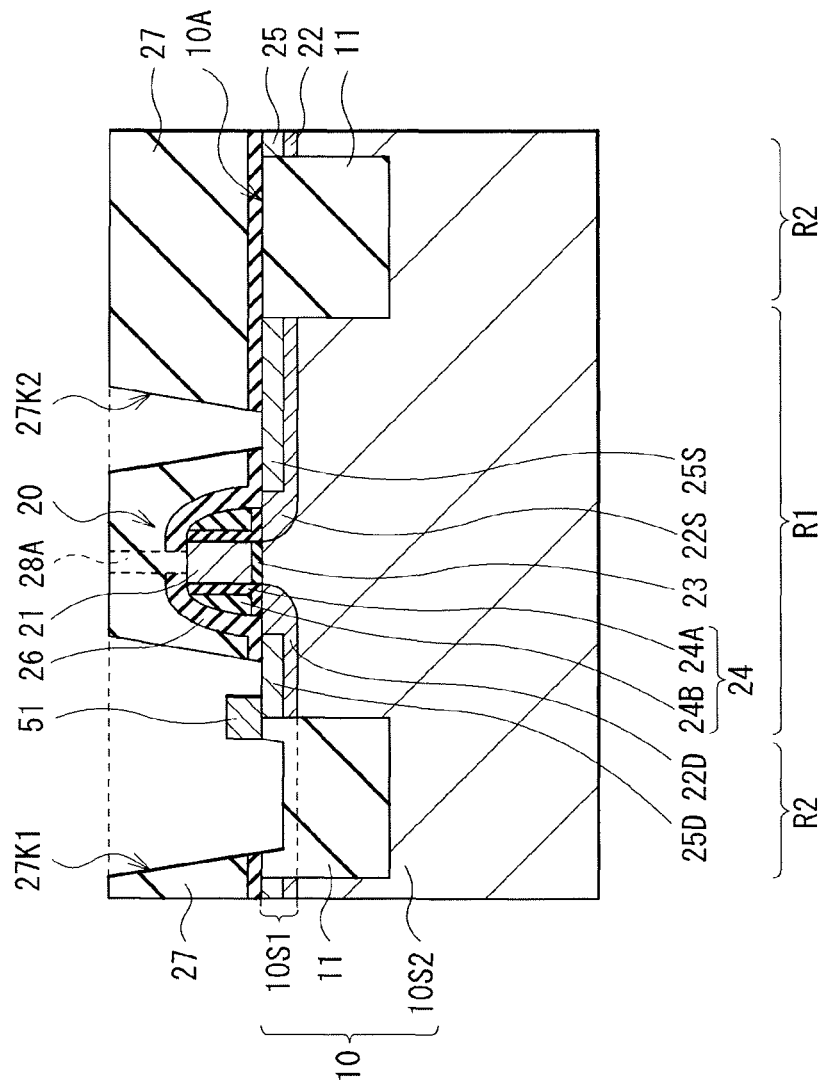
FIG. 30B is a sectional view illustrating a process following FIG. 30A.

To manufacture the semiconductor device 9, as illustrated in FIG. 30A, first, the semiconductor substrate 10 is prepared, and an LSI is formed on the principal surface 10A of the semiconductor substrate 10 by a typical manufacturing process. More specifically, after the element isolation layer 11 is formed on the principal surface 10A side of the semiconductor substrate 10, the transistor 20 including the gate electrode 21 and the pair of diffusion layers 22 is formed in the element region R1. Respective silicide regions 25D and 25S are formed in parts of the respective diffusion layers 22. Next, the block layer 51 is so formed on the principal surface 10A as to stride across a boundary between the silicide region 25D and the element isolation layer 11. The block layer 51 may be formed of a material having a lower etching rate than the element isolation layer 11, for example, SiN when the interlayer insulating film 27 is dug by etching in a later process. Next, after the interlayer insulating films 26 and 27 are so formed as to cover an entire surface, the connection layer 28A passing through the interlayer insulating films 26 and 27 is formed. Moreover, as illustrated in FIG. 30B, openings 27K1 and 27K2 are formed by selectively digging the interlayer insulating film 27 by etching. Further, these openings 27K1 and 27K2 are filled with a predetermined high-conductivity material to form the wiring line 29A and the connection layer 28C. After that, the semiconductor device 9 is completed by a method similar to the method of manufacturing the semiconductor device 1.

[Functions and Effects of Semiconductor Device 9]

Since the wiring line 29A configured by integrating a bottom portion of the contact plug P1 and the connection layer 28B is provided, connection resistance between the storage element 30 and the silicide region 25D of the transistor 20 is allowed to be further reduced. Moreover, the block layer 51 is provided. Therefore, even if the element isolation layer 11 is etched together with the interlayer insulating film 27 in a case where the openings 27K1 and 27K2 are formed by selectively digging the interlayer insulating film 27 by etching, generation of a leakage current on a unintended path is prevented. In other words, generation of a leakage current at a junction between the wiring line 29A with which the opening 27K1 is filled in a later process and an end surface of the silicide region 25D is prevented.

Modification Example 13

Figure 31:
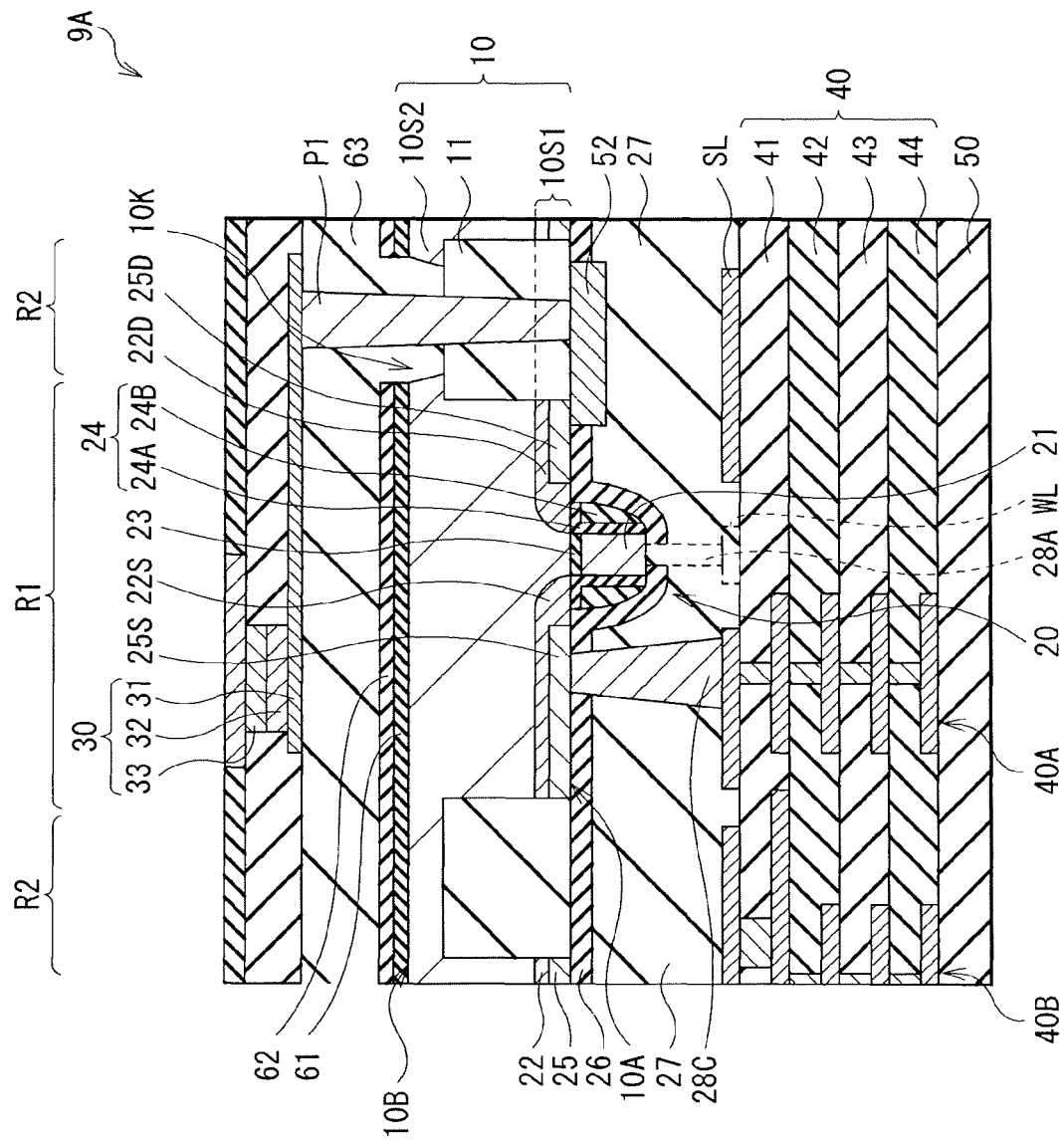
FIG. 31 is a sectional view illustrating a modification example of the semiconductor device according to the ninth embodiment of the present disclosure.

FIG. 31 illustrates a sectional configuration of a semiconductor device 9A according to a first modification example of the above-described semiconductor device 9. In the semiconductor device 9A, instead of the block layer 51, a metal layer 52 is so provided as to cover the boundary between the silicide region 25D of the transistor 20 and the element isolation layer 11 adjacent to the silicide region 25D. Moreover, the wiring line 29A is not provided, and the contact plug P1 and the silicide region 25D are connected to each other through the metal layer 52. The semiconductor device 9A basically has a configuration similar to that of the semiconductor device 9 according to the above-described ninth embodiment, except for these points. Examples of a material of the metal layer 52 include Al, Ti, TiN, Ta, and TaN.

Application Example 1

Figure 32A:
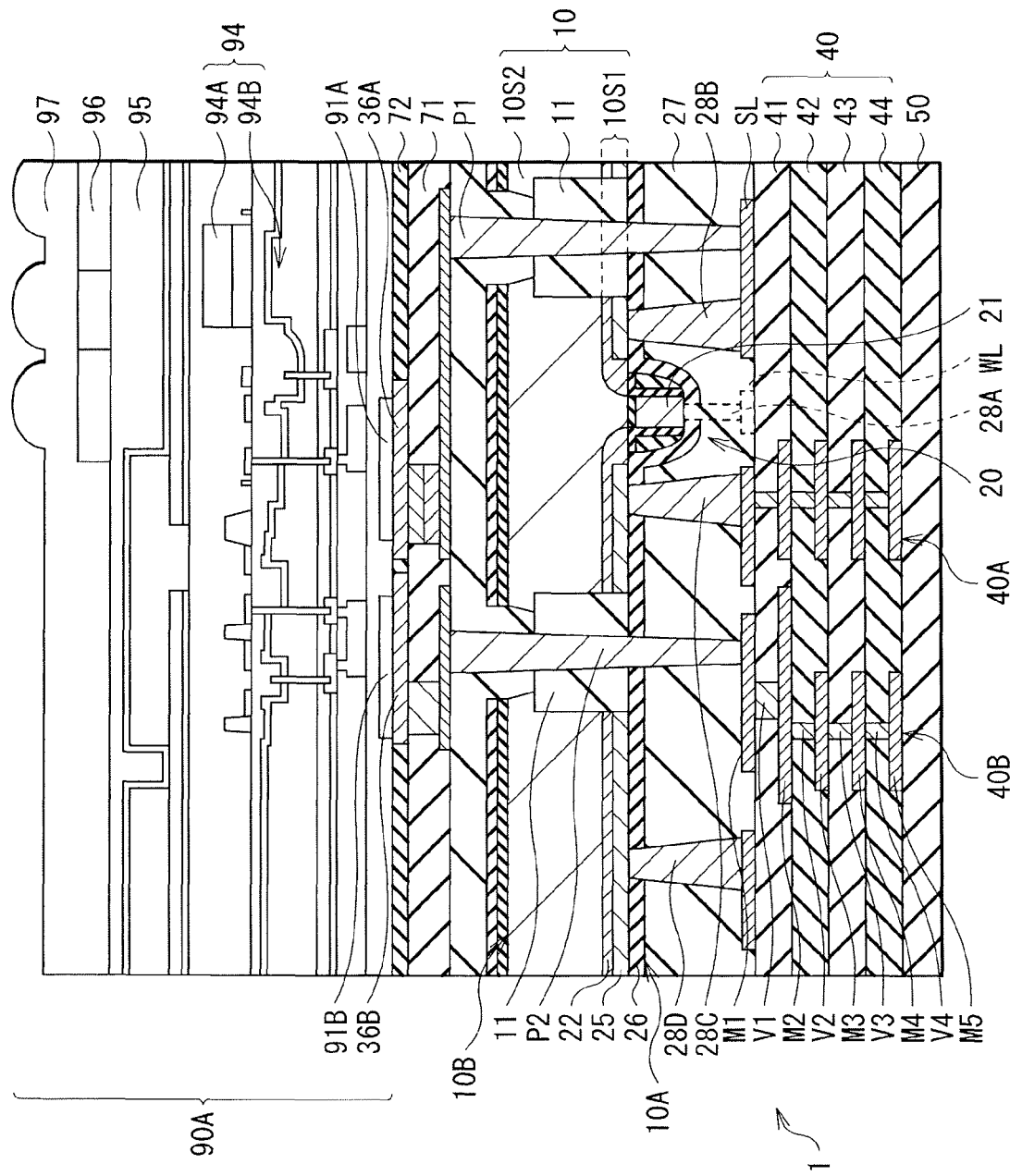
FIG. 32A is a sectional view illustrating a first application example of the semiconductor device according to an embodiment of the present disclosure.

FIG. 32A illustrates a semiconductor unit configured by laminating a back-side illumination type image sensor (image pickup device) 90A on the semiconductor device 1 illustrated in FIGS. 1A and 1B. In this semiconductor unit, the semiconductor device 1 includes conductive layers 36A and 36B made of copper as an uppermost layer thereof, and the image pickup device 90A includes conductive layers 91A and 91B made of copper as a lowermost layer thereof. In this case, the semiconductor device 1 and the image pickup device 90A are so laminated as to allow the conductive layers 36A and 36B and the conductive layers 91A and 91B to come into direct contact with each other, respectively. The image pickup device 90A may be configured, for example, by providing a planarization film 95, a color filter layer 96, and a microlens 97 in order on a semiconductor substrate 94 in which a photodiode 94A, a transistor 94B, and the like are embedded.

Application Example 2

Figure 32B:
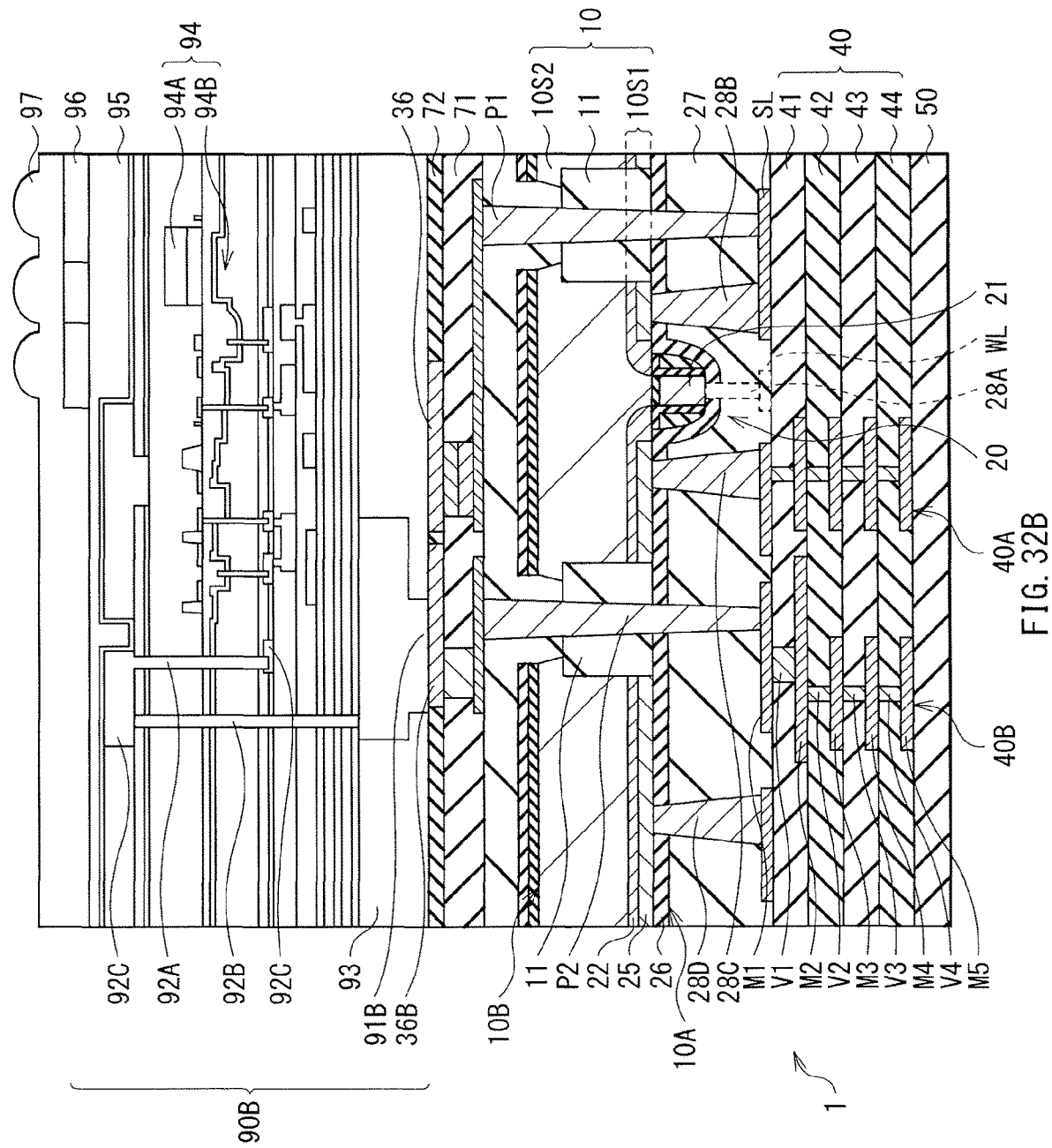
FIG. 32B is a sectional view illustrating a second application example of the semiconductor device according to the embodiment of the present disclosure.

FIG. 32B illustrates a semiconductor unit configured by laminating a back-side illumination type image sensor (image pickup device) 90B on the semiconductor device 1 illustrated in FIGS. 1A and 1B. In this semiconductor unit, the semiconductor device 1 includes the conductive layer 36 made of copper as an uppermost layer thereof, and the image pickup device 90B includes a conductive layer 91C as an intermediate layer or an uppermost layer other than a lowermost layer thereof. In this case, the conductive layer 36 of the semiconductor device 1 and the conductive layer 91C of the image pickup device 90B are connected to each other by connection sections 92A and 92B passing through a whole or a part of the image pickup device 90B in a thickness direction, a conductive layer 92C located in an uppermost portion of the image pickup device 90B, and a conductive layer 93 located in a lowermost layer of the image pickup device 90B.

Although the present disclosure is described referring to the embodiments and the like, the present disclosure is not limited thereto, and may be variously modified.

For example, in the above-described embodiments and the like, the configurations of the transistors 20, 80, and 80A and the storage element 30 are specifically described; however, it is not necessary for them to include all of the components, or they may further include any other component.

Figure 33:
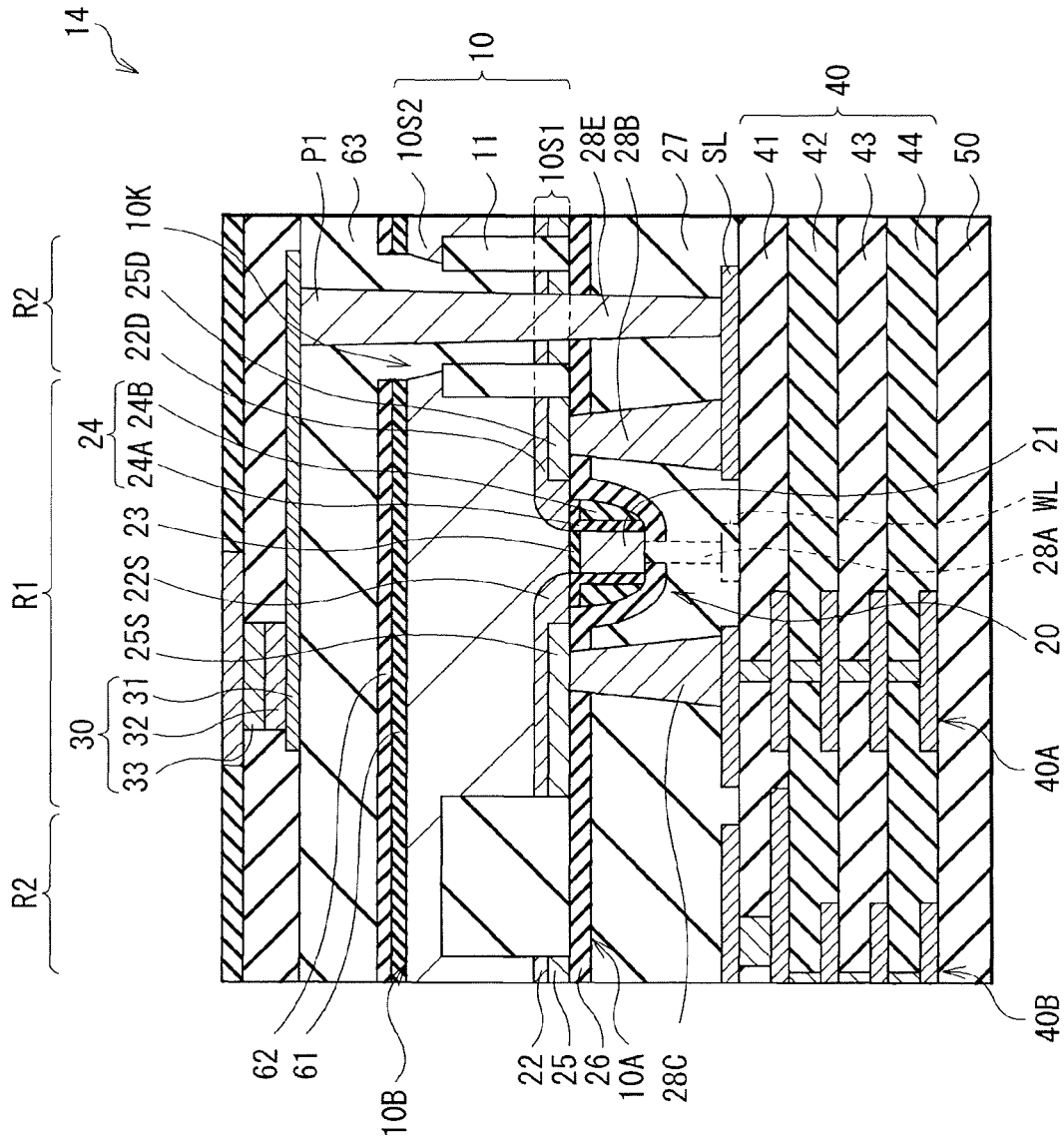
FIG. 33 is a sectional view illustrating a fourteenth modification example of any of the semiconductor devices according to the embodiments of the present disclosure.

Moreover, for example, the material, thickness, forming method, and the like of each component are not limited to those described in the above-described embodiments and the like, and each component may be made of any other material with any other thickness by any other method. For example, in a case where the insulating film 63 with which the periphery of the contact plug P1 is covered is made of a material having a lower dielectric constant than $SiO_2$, for example, like a semiconductor device 14 according to a fourteenth modification example illustrated in FIG. 33, the insulating film 63 may also occupy an interior of the element isolation layer 11. In this case, for example, in a process of forming the opening 10K illustrated in FIG. 4E, the opening 10K may be so formed as to pass through the element isolation layer 11.

Figure 34:
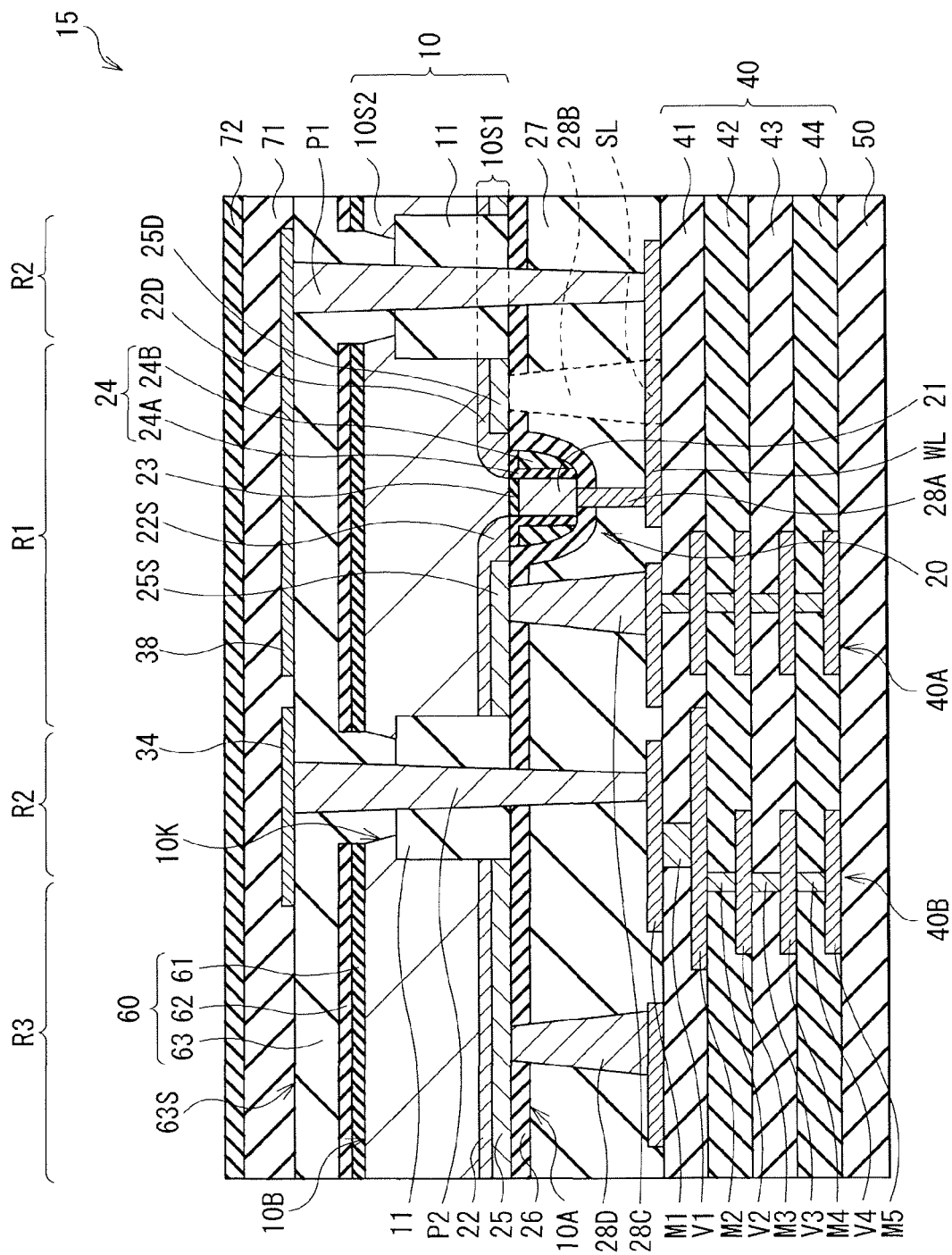
FIG. 34 is a sectional view illustrating a fifteenth modification example of any of the semiconductor devices according to the embodiments of the present disclosure.

Moreover, in the above-described embodiments and the like, a case where the contact plug P1 is connected to the connection layer 28B serving as a drain electrode through the select line SL is described as an example; however, the present technology is not limited thereto. For example, the contact plug P1 may be connected to the connection layer 28C serving as a source electrode. Alternatively, like a semiconductor device 15 according to a fifteenth modification example illustrated in FIG. 34, the contact plug P1 may be connected to the gate electrode 21 through the word line WL and the connection layer 28A. It is to be noted that, in this case, the top end of the contact plug P1 may be connected to, for example, a wiring layer 38 provided on the front surface 63S of the insulating film 63. The wiring layer 38 may be connected to, for example, an external device (not illustrated).

Figure 35:
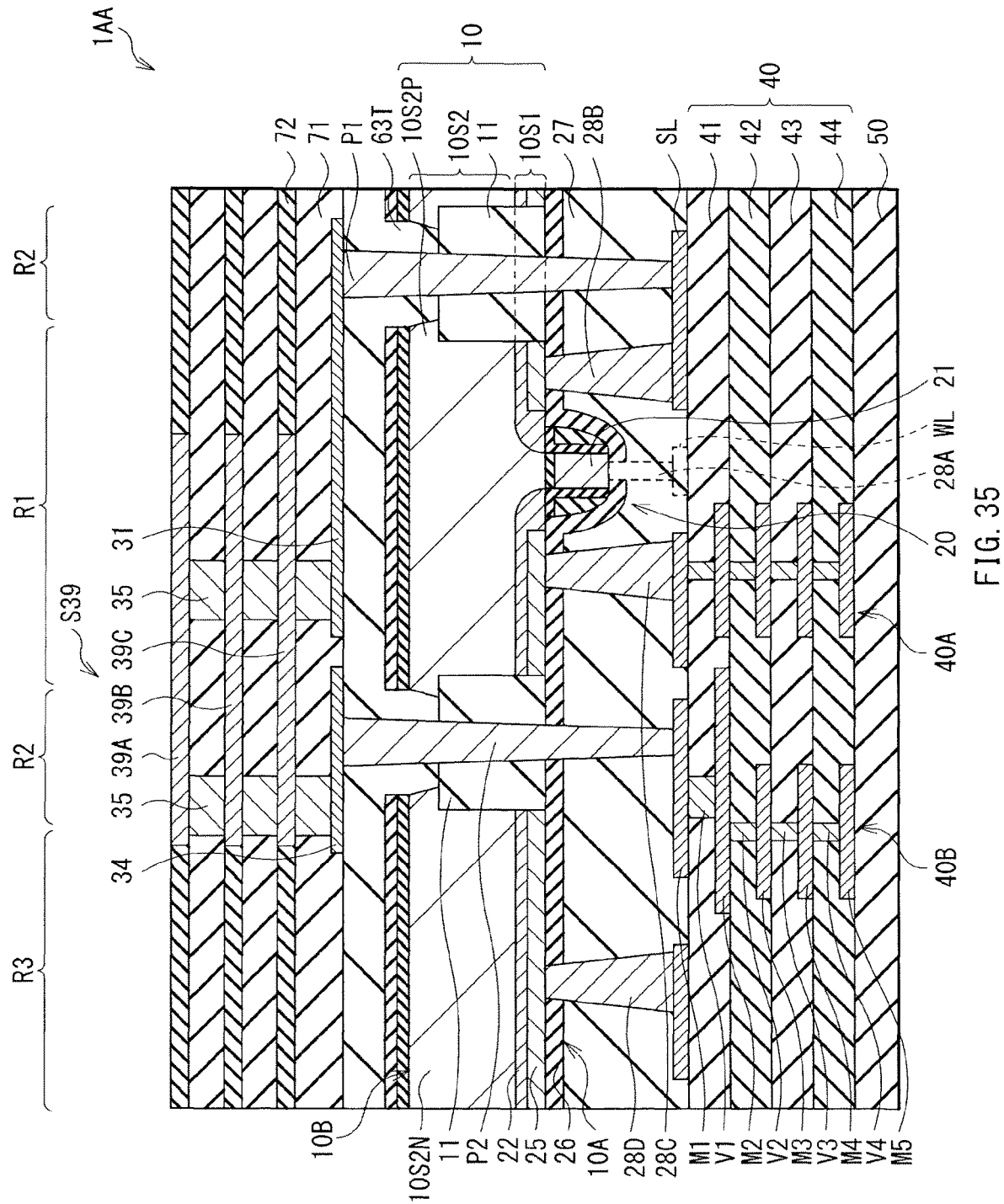
FIG. 35 is a sectional view illustrating a sixteenth modification example of any of the semiconductor devices according to the embodiments of the present disclosure.

Furthermore, in the above-described embodiments and the like, an example in which the storage element 30 is provided on the back surface 10B of the semiconductor substrate 10 with the insulating layer 60 in between, and an end of the contact plug P1 is connected to the storage element 40 is described. However, in the present technology, for example, like a semiconductor device 1AA according to a sixteenth modification example illustrated in FIG. 35, instead of the storage element 30, a wiring configuration S39 configured by laminating a plurality of wiring layers 39 (39A to 39C) and connecting the wiring layers 39 to one another by the conductive layer 35 may be further included. In this case, an end of the contact plug P1 may be connected to one of the wiring layers 39 in the wiring configuration S39. By such a configuration, the transistor 20 provided on the principal surface 10A of the semiconductor substrate 10 is allowed to be easily connected to an external device.

It is to be noted that the effects described in this description are merely examples; therefore, effects in the present technology is not limited thereto, and the present technology may have other effects. Moreover, the present technology may have the following configurations.

(1) A semiconductor device including:

a semiconductor substrate having a first surface and a second surface that face each other, and having an element region and an isolation region, the element region including a transistor in the first surface, and the isolation region including an element isolation layer surrounding the element region; and a contact plug extending from the first surface to the second surface in the isolation region of the semiconductor substrate.

(2) The semiconductor device according to (1), further including:

a storage element provided on the second surface of the semiconductor substrate with an insulating layer in between, in which a first end of the contact plug is connected to the storage element.

(3) The semiconductor device according to (2), in which the storage element is a spin transfer torque-magnetic tunnel junction storage element (STT-MTJ element).

(4) The semiconductor device according to (2), in which the transistor includes a pair of diffusion layers configuring a part of the semiconductor substrate, a source electrode and a drain electrode connected to the respective diffusion layers, and a gate electrode, and the gate electrode, the source electrode, or the drain electrode is connected to a second end of the contact plug.

(5) The semiconductor device according to any one of (2) to (4), in which a periphery of the contact plug is covered with a part of the insulating layer, and the contact plug and the semiconductor substrate are isolated from each other.

(6) The semiconductor device according to (5), in which the semiconductor substrate includes an opening in a part of the isolation region, the insulating layer is connected to the element isolation layer through the opening of the semiconductor substrate, and the contact plug passes through a connection portion between the insulating layer and the element isolation layer.

(7) The semiconductor device according to any one of (1) to (6), in which an occupancy area of the contact plug increases from the first surface toward the second surface.

(8) The semiconductor device according to (2), in which the semiconductor substrate includes a laminate configuration including a first semiconductor layer, a buried oxide film, and a second semiconductor layer, the first semiconductor layer being provided in the element region, the buried oxide film with which the first semiconductor layer is covered, and the second semiconductor layer with which both the buried oxide film and the element isolation layer are covered, and a periphery of the contact plug is covered with a part of the insulating layer, and the contact plug and the second semiconductor layer are isolated from each other.

(9) The semiconductor device according to (2), in which the semiconductor substrate includes, in the element region, a buried oxide film with which the transistor is covered, and both the buried oxide film and the element isolation layer are covered with the insulating layer.

(10) The semiconductor device according to (6), in which the transistor includes a fin extending in a first direction, a gate wiring line extending in a second direction, a source wiring line, and a drain wiring line, the gate wiring line with which surfaces other than a back surface of the fin are covered, and the source wiring line or the drain wiring line is connected to a second end of the contact plug.

(11) The semiconductor device according to (2), in which the transistor includes a fin extending in a first direction, a gate wiring line extending in a second direction, a source wiring line, and a drain wiring line, the gate wiring line with which surfaces other than a back surface of the fin are covered, and the semiconductor substrate includes a laminate configuration including a buried oxide film and a semiconductor layer, the buried oxide film with which back surfaces of the fin, the gate wiring line, the source wiring line, and the drain wiring line are covered, and the semiconductor layer with which both the buried oxide film and the element isolation layer are covered, and a periphery of the contact plug is covered with a part of the insulating layer, and the contact plug and the semiconductor layer are isolated from each other.

(12) A semiconductor device including:

an element formation layer in which a transistor is formed, the transistor including a fin extending in a first direction, a gate wiring line extending in a second direction, a source wiring line, and a drain wiring line, the gate wiring line with which surfaces other than a back surface of the fin are covered;

a buried oxide film with which the transistor is covered;

an insulating layer with which the buried oxide film is covered; and a contact plug passing through a region other than a region where the transistor is formed of the element formation layer.

(13) The semiconductor device according to any one of (5) to (7), in which the part with which the periphery of the contact plug is covered of the insulating layer is made of a material having a lower dielectric constant than $SiO_2$.

(14) The semiconductor device according to any one of (1) to (12), in which an occupancy area of the contact plug decreases from the first surface toward the second surface.

(15) The semiconductor device according to (1), in which the contact plug is configured by connecting a portion with an occupancy area decreasing from the first surface toward the second surface and a portion with an occupancy area decreasing from the second surface toward the first surface.

(16) The semiconductor device according to (4), in which a wiring line is included, the wiring line extending from the element region to the isolation region to come into contact with the first surface of the semiconductor substrate, and the source electrode or the drain electrode and the second end of the contact plug are connected to each other through the wiring line.

(17) The semiconductor device according to (1), further including a wiring configuration in which a plurality of wiring layers are laminated on the second surface of the semiconductor substrate, in which a first end of the contact plug is connected to one of the wiring layers in the wiring configuration.

(18) A method of manufacturing a semiconductor device including:

preparing a semiconductor substrate having a first surface and a second surface that face each other, and having an element region and an isolation region, the element region including a transistor in the first surface, and the isolation region including an element isolation layer surrounding the element region; and forming a contact plug by forming a through hole from the second surface to the first surface in the isolation region and then filling the through hole with a metal material.

(19) The method of manufacturing the semiconductor device according to (18), in which an insulating layer is formed after an opening is formed in the semiconductor substrate, the insulating layer with which the semiconductor substrate is covered, and a part of the insulating layer being in contact with the element insulation layer through the opening, and the through hole is formed in a portion where the element isolation layer and the insulating layer are connected to each other.

(20) The method of manufacturing the semiconductor device according to (18) or (19), in which the through hole is obtained by digging the element isolation layer from the first surface to pass through the element isolation layer.

(21) The method of manufacturing the semiconductor device according to (18) or (19), in which the through hole is obtained by excavating the element isolation layer from the first surface to leave a part of the element isolation layer, and then excavating and removing the remaining part of the element isolation layer from the second surface.

(22) A semiconductor device including:

a semiconductor substrate having a first surface and a second surface that face each other, and having a first region, a second region, and a third region, the first region including a transistor in the first surface, the second region including an element isolation layer surrounding the first region in the first surface, and the third region isolated from the first region by the second region, in which a first conductive semiconductor portion is provided in the first region, a second conductive semiconductor portion is provided in the third region, and an insulating layer is provided in the second region, the insulating layer being sandwiched between the first conductive semiconductor portion and the second conductive semiconductor portion in the second surface.

(23) The semiconductor device according to (22), in which the element isolation layer and the insulating layer are in contact with each other in the second region.

(24) The semiconductor device according to (23), further including a contact plug extending from the first surface to the second surface in the second region to pass through the element isolation layer and the insulating layer.

(25) The semiconductor device according to (22), in which the element isolation layer and the insulating layer are isolated from each other in the second region.

(26) The semiconductor device according to (22), in which the second region includes a portion where the element isolation layer and the insulating layer are in contact with each other and a portion where the element isolation layer and the insulating layer are isolated from each other.

(27) The semiconductor device according to any one of (22) to (26), in which the insulating layer includes a trench in the second region.

(28) The semiconductor device according to (22), in which a first insulating film and a second insulating film are included, the first insulating film with which the first conductive semiconductor portion is covered, and the second insulating film with which the second conductive semiconductor portion is covered, the first insulating film is a first band-structure modulation film functioning to limit trapping of free electrons in proximity to a valence band by shifting upward an energy band of the first conductive semiconductor portion, and the second insulating film is a second band-structure modulation film functioning to limit trapping of free electrons in proximity to a conduction band by shifting downward an energy band of the second conductive semiconductor portion.

(29) The semiconductor device according to (28), in which the first insulating film is made of a high-dielectric constant material having a positive flat band, and the second insulating film is made of a high-dielectric constant material having a negative flat band.

(30) The semiconductor device according to (29), in which the high-dielectric constant material having the positive flat band is $Al_2O_3$, $HfO_2$, $TiO_2$, $ZrO_2$, MgO, or an oxide or an oxynitride including Al, Hf, Ti, Zr or Mg.

(31) The semiconductor device according to (29) or (30), in which the high-dielectric constant material having the negative flat band is $Y_2O_3$, $La_2O_3$, $GeO_2$, $Lu_2O_3$, or SrO.

(32) A semiconductor device including:

a semiconductor substrate having a first surface and a second surface that face each other, and having an element region and an isolation, the element region including a transistor region in the first surface, and the isolation region including, in the first surface, an element isolation layer surrounding the element region;

a contact plug extending from the first surface to the second surface in the isolation region of the semiconductor substrate;

a block layer provided to stride across a boundary between the element region and the isolation region in the first surface; and a wiring line with which the block layer is covered in the first surface and that connects the contact plug and the transistor to each other.

(33) The semiconductor device according to (32), in which the block layer is provided to stride across a boundary between a diffusion region of the transistor and the element isolation layer.

(34) A semiconductor device including:

a semiconductor substrate having a first surface and a second surface that face each other, and having an element region and an isolation region, the element region including a transistor in the first surface, and the isolation region including, in the first surface, an element isolation layer surrounding the element region;

a contact plug extending from the first surface to the second surface in the isolation region of the semiconductor substrate; and a metal layer provided to stride across a boundary between the element region and the isolation region in the first surface and to connect the contact plug and the transistor to each other.

(35) A semiconductor unit provided with a semiconductor device and an image pickup device laminated on the semiconductor device, the semiconductor device including:

a semiconductor substrate having a first surface and a second surface that face each other, and having an element region and an isolation region, the element region including a transistor in the first surface, and the isolation region including an element isolation layer surrounding the element region; and a contact plug extending from the first surface to the second surface in the isolation region of the semiconductor substrate.

(36) The semiconductor unit according to (35), in which the semiconductor device includes a first wiring line as an uppermost layer thereof, the image pickup device includes a second wiring line as a lowermost layer thereof, and the semiconductor device and the image pickup device are laminated to allow the first wiring line and the second wiring line to come into direct contact with each other.

(37) The semiconductor unit according to (35), in which the semiconductor device includes a first wiring line as an uppermost layer thereof, the image pickup device includes a second wiring line as an uppermost layer or an intermediate layer thereof, and the first wiring line and the second wiring line are connected to each other through a connection section passing through the image pickup device in a thickness direction.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, wherein a first end of the contact plug is in electrical communication with the storage element,
wherein:
the transistor includes (a) a source diffusion and a drain diffusion layer, (b) a source electrode and a drain electrode connected to the source diffusion layer and the drain diffusion layer, respectively, and (c) a gate electrode; and
the gate electrode, the source electrode, or the drain electrode is in electrical communication with a second end of the contact plug.

2. The semiconductor device according to claim 1, wherein:
a wiring line is included, the wiring line extending from the element region to the isolation region and contacting the first surface of the semiconductor substrate; and
the second end of the contact plug and either the source electrode or the drain electrode are in electrical communication through the wiring line.

3. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, wherein a first end of the contact plug is in electrical communication with the storage element,
wherein a periphery of the contact plug extends through a part of the insulating layer, and the contact plug and the semiconductor substrate are isolated from each other.

4. The semiconductor device according to claim 3, wherein the part of the insulating layer is made of a material having a dielectric constant that is lower than a dielectric constant of $SiO_2$.

5. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, a first end of the contact plug being in electrical communication with the storage element,
wherein,
a periphery of the contact plug extends through a part of the insulating layer, and the contact plug and the semiconductor substrate are isolated from each other,
the semiconductor substrate includes an opening in a part of the isolation region,
the insulating layer extends to the element isolation layer through the opening of the semiconductor substrate, and
the contact plug extends through the opening, the insulating layer and the element isolation layer.

6. The semiconductor device according to claim 5, wherein:
the transistor is a Fin-FET with (a) a fin structure extending in a first direction, (b) a gate wiring line extending in a second direction that is different than the first direction, (c) a source wiring line, and (d) a drain wiring line, the gate wiring line covering plural surfaces of the fin structure; and
the source wiring line or the drain wiring line is in electrical communication with a second end of the contact plug.

7. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region; and
a contact plug extending from the first surface to the second surface through the element isolation layer,
wherein a cross-sectional area of the contact plug increases proceeding from the first surface toward the second surface.

8. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, wherein a first end of the contact plug is in electrical communication with the storage element,
wherein:
the semiconductor substrate includes a laminate configuration including a first semiconductor layer, a buried oxide film, and a second semiconductor layer, the first semiconductor layer being in the element region, the buried oxide film overlaying the first semiconductor layer, the second semiconductor layer overlaying both the buried oxide film and the element isolation layer;
the contact plug extends through a part of the insulating layer; and
the contact plug and the second semiconductor layer are isolated from each other.

9. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, wherein a first end of the contact plug is in electrical communication with the storage element,
wherein:
the semiconductor substrate includes, in the element region, a buried oxide film overlaying the transistor; and
both the buried oxide film and the element isolation layer are overlain by the insulating layer.

10. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a storage element on the second surface of the semiconductor substrate with an insulating layer between the storage element and the second surface, wherein a first end of the contact plug is in electrical communication with the storage element,
wherein:
the transistor is a Fin-FET with (a) a fin structure extending in a first direction, (b) a gate wiring line extending in a second direction that is different than the first direction, (c) a source wiring line, and (d) a drain wiring line, the gate wiring line covering plural surfaces of the fin structure;
the semiconductor substrate includes a laminate configuration including a buried oxide film and a semiconductor layer, the buried oxide film covering back surfaces of the fin structure, the gate wiring line, the source wiring line, and the drain wiring line, the semiconductor layer overlaying the buried oxide film and the element isolation layer;
the contact plug extends through a part of the insulating layer; and
the contact plug and the semiconductor layer are isolated from each other.

11. A semiconductor device comprising:
a semiconductor substrate with a first surface and a second surface opposite the first surface and having an element formation layer in which a transistor is formed, the transistor including (a) a fin structure extending in a first direction, (b) a gate wiring line extending in a second direction that is different from the first direction, (c) a source wiring line, and (d) a drain wiring line, the gate wiring line covering surfaces of the fin structure other than a back surface of the fin structure;
an element isolation layer between the first surface and the second surface and surrounding the element formation layer;
a buried oxide film overlaying the transistor;
an insulating layer overlaying the buried oxide film; and
a contact plug extending through the element isolation layer and the insulating layer.

12. A semiconductor device comprising:
a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region;
a contact plug extending from the first surface to the second surface through the element isolation layer; and
a wiring configuration in which a plurality of wiring layers are laminated on the second surface of the semiconductor substrate, wherein a first end of the contact plug is in electrical communication with one of the wiring layers of the wiring configuration.

13. A semiconductor device comprising:
a semiconductor substrate having (a) a first surface and a second surface that face each other, (b) a first region, (c) a second region, and (d) a third region, the first region including a transistor in the first surface, the second region including an element isolation layer surrounding the first region, the third region isolated from the first region by the second region, the element isolation layer being between the first surface and the second surface;
a first conductive semiconductor portion in the first region;
a second conductive semiconductor portion in the third region;
an insulating layer in the second region, the insulating layer extending into the semiconductor substrate to between the first conductive semiconductor portion and the second conductive semiconductor portion;
a contact plug extending from the first surface to the second surface through the element isolation layer and the insulating layer.

14. The semiconductor device according to claim 13, wherein the element isolation layer and a part of the insulating layer are in contact with each other in the second region.

15. The semiconductor device according to claim 13, wherein the element isolation layer and a part of the insulating layer are isolated from each other in the second region.

16. The semiconductor device according to claim 13, wherein the second region includes a first portion where the element isolation layer and a first part of the insulating layer are in contact with each other and a second portion where the element isolation layer and a second part of the insulating layer are isolated from each other.

17. The semiconductor device according to claim 13, wherein the insulating layer includes a trench in the second region.

18. The semiconductor device according to claim 13, comprising a first insulating film and a second insulating film, wherein:
the first insulating film overlays the first conductive semiconductor portion and the second insulating film overlays the second conductive semiconductor portion;
the first insulating film is a first band-structure modulation film functioning to limit trapping of free electrons in proximity to a valence band by shifting upward an energy band of the first conductive semiconductor portion; and
the second insulating film is a second band-structure modulation film functioning to limit trapping of free electrons in proximity to a conduction band by shifting downward an energy band of the second conductive semiconductor portion.

19. The semiconductor device according to claim 18, wherein:
the first insulating film is made of a high-dielectric constant material having a positive flat band, and
the second insulating film is made of a high-dielectric constant material having a negative flat band.

20. The semiconductor device according to claim 19, wherein the high-dielectric constant material having the positive flat band is $Al_2O_3$, $HfO_2$, $TiO_2$, $ZrO_2$, MgO, an oxide including Al, Hf, Ti, Zr, or Mg, or an oxynitride.

21. The semiconductor device according to claim 19, wherein the high-dielectric constant material having the negative flat band is $Y_2O_3$, $La_2O_3$, $GeO_2$, $Lu_2O_3$, or SrO.

22. A semiconductor device comprising:
a semiconductor substrate having (a) a first surface and a second surface that face each other, (b) an element region, and an element isolation region, the element region including a transistor region in the first surface, the element isolation region including an element isolation layer between the first surface and the second surface and surrounding the element region;
a contact plug extending through the element isolation layer from the first surface to the second surface;
a block layer at the first surface and extending across a boundary between the element region and the element isolation region; and
a wiring line at the first surface and covering the block layer, the wiring line electrically connecting the contact plug and the transistor to each other.

23. The semiconductor device according to claim 22, wherein the block layer extends across a boundary between a diffusion region of the transistor and the element isolation layer.

24. A semiconductor unit comprising:
a semiconductor device comprising (1) a semiconductor substrate having (a) a first surface and a second surface opposite the first surface, (b) an element region, and (c) an isolation region, the element region including a transistor in the first surface, and the isolation region including an element isolation layer between the first surface and the second surface and surrounding the element region; and (2) a contact plug extending from the first surface to the second surface through the element isolation layer; and
an image pickup device laminated on the semiconductor device.

25. The semiconductor unit according to claim 24, wherein:
the semiconductor device includes a first wiring line facing the image pickup device;
the image pickup device includes a second wiring line facing the first wiring line; and
the first wiring line and the second wiring line are in direct contact with each other.

26. The semiconductor unit according to claim 24, wherein:
the semiconductor device includes a first wiring line facing the image pickup device;
the image pickup device includes a second wiring line; and
the first wiring line and the second wiring line are electrically connected to each other via a connection section that extends in a thickness direction into or through the image pickup device.

27. The semiconductor unit of claim 24, wherein the semiconductor device further comprises a storage element on the second surface of the semiconductor substrate with an insulating layer between the storage element and the second surface, wherein a first end of the contact plug is in electrical communication with the storage element.

28. The semiconductor unit of claim 27, wherein the storage element is a spin transfer torque-magnetic tunnel junction storage element (STT-MTJ element).

29. The semiconductor device according to claim 7, 11, 12, 13, or 22, further comprising a storage element on the second surface of the semiconductor substrate with an insulating layer between the storage element and the second surface, wherein a first end of the contact plug is in electrical communication with the storage element.

30. The semiconductor device of claim 29, wherein the storage element is a spin transfer torque-magnetic tunnel junction storage element (STT-MTJ element).

31. The semiconductor device according to claim 1 3, 5, 8, 9, or 10, wherein the storage element is a spin transfer torque-magnetic tunnel junction storage element (STT-MTJ element).

* * * * *